(12) United States Patent
Masuoka et al.

(10) Patent No.: US 9,111,794 B2
(45) Date of Patent: Aug. 18, 2015

(54) METHOD FOR PRODUCING A SEMICONDUCTOR DEVICE HAVING SGTS

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

(21) Appl. No.: 14/499,935

(22) Filed: Sep. 29, 2014

(65) Prior Publication Data

US 2015/0017767 A1    Jan. 15, 2015

Related U.S. Application Data

(63) Continuation-in-part of application No. PCT/JP2013/057558, filed on Mar. 15, 2013.

(51) Int. Cl.
| | | |
|---|---|---|
| H01L 21/336 | (2006.01) | |
| H01L 27/11 | (2006.01) | |
| H01L 21/8238 | (2006.01) | |
| H01L 29/423 | (2006.01) | |
| H01L 29/16 | (2006.01) | |
| H01L 29/66 | (2006.01) | |

(52) U.S. Cl.
CPC .... *H01L 27/1116* (2013.01); *H01L 21/823828* (2013.01); *H01L 21/823885* (2013.01); *H01L 27/1104* (2013.01); *H01L 29/16* (2013.01); *H01L 29/42324* (2013.01); *H01L 29/66666* (2013.01); *H01L 29/66825* (2013.01)

(58) Field of Classification Search
CPC ..................... H01L 29/7827; H01L 29/66734; H01L 29/66666; H01L 27/10876; H01L 27/10879
USPC ................. 438/129, 268, 275, 276, 301, 587; 257/E21.41
See application file for complete search history.

(56) References Cited

U.S. PATENT DOCUMENTS

8,617,952 B2 * 12/2013 Kim et al. ..................... 438/268
8,818,537 B2    8/2014 Kloiber et al.

FOREIGN PATENT DOCUMENTS

JP            H02-188966 A        7/1990
(Continued)

OTHER PUBLICATIONS

Takato et al., "Impact of Surrounding Gate Transistor (SGT) for Ultra-High-Density LSI's" IEEE Transaction on Electron Devices, vol. 38, No. 3, pp. 573-578 (1991).

(Continued)

*Primary Examiner* — Thanhha Pham
(74) *Attorney, Agent, or Firm* — Brinks Gilson & Lione

(57) ABSTRACT

In a method for producing a semiconductor device, Si pillars that include i-layers, $N^+$ regions that serve as lower impurity regions, $N^+$ regions and a $P^+$ region that serve as upper impurity regions, and i-layers are formed by using $SiO_2$ layers as an etching mask. Thus, surrounding gate MOS transistors (SGTs) are produced in which the upper impurity regions and the lower impurity regions respectively function as impurity layers constituting a source or a drain of the SGTs formed in upper portions and lower portions of the Si pillars.

15 Claims, 52 Drawing Sheets

(56) References Cited

FOREIGN PATENT DOCUMENTS

| | | |
|---|---|---|
| JP | H02-254752 A | 10/1990 |
| JP | H04-207069 A | 7/1992 |
| JP | 2003-179160 A | 6/2003 |
| JP | 2008-172164 A | 7/2008 |
| JP | 2011-204745 A | 10/2011 |
| JP | 2013-038336 A | 2/2013 |
| WO | WO 2008/114317 A1 | 9/2008 |

OTHER PUBLICATIONS

Hyoungjun Na and Tetsuo Endoh :"A New Compact SRAM cell by Vertical MOSFET for Low-power and Stable Operation", Memory Workshop (IMW)-2011 3rd IEEE International Digest, P1-P4 (2011).

Tadashi Shibata, Susumu Kohyama and Hisakazu Iizuka : "A New Field Isolation Technology for High Density MOS LSI", Japanese Journal of Applied Physics, vol. 18, pp. 263-267 (1979).

\* cited by examiner

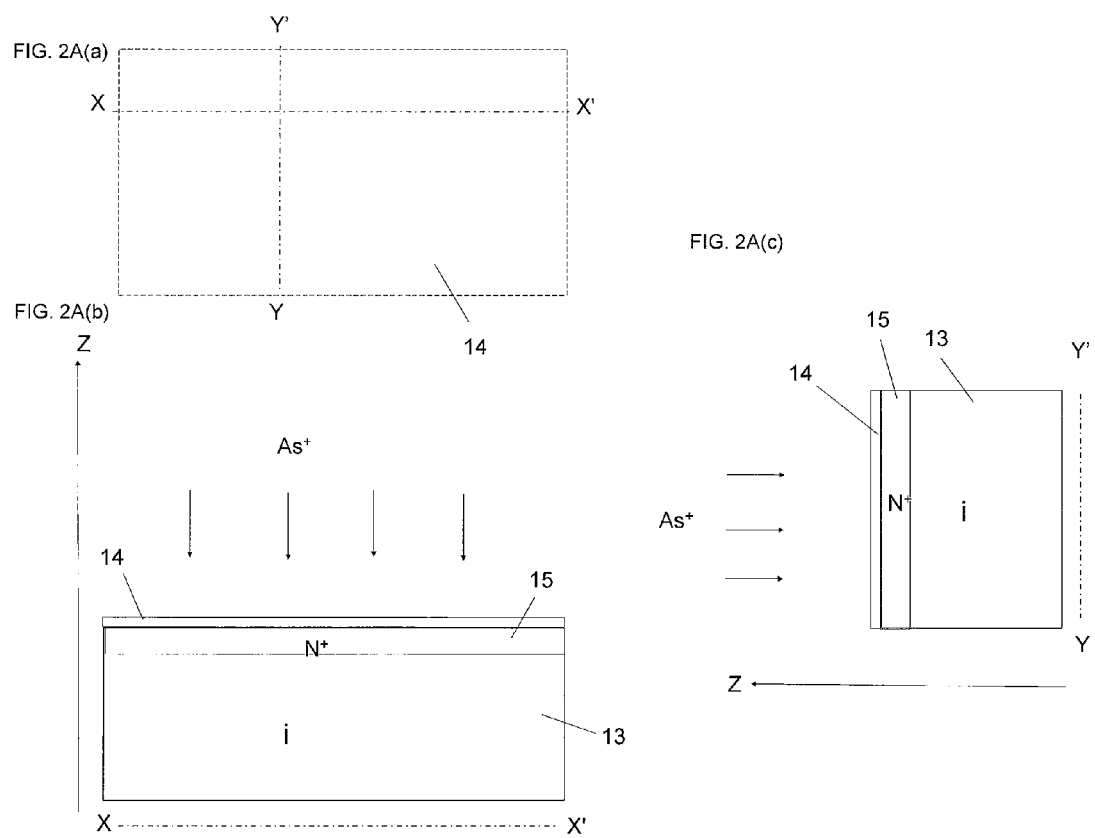

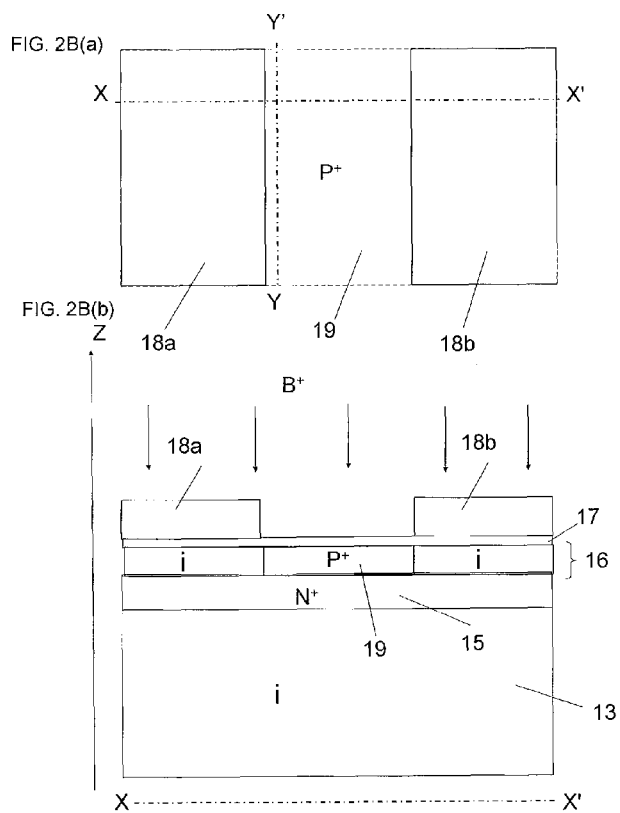

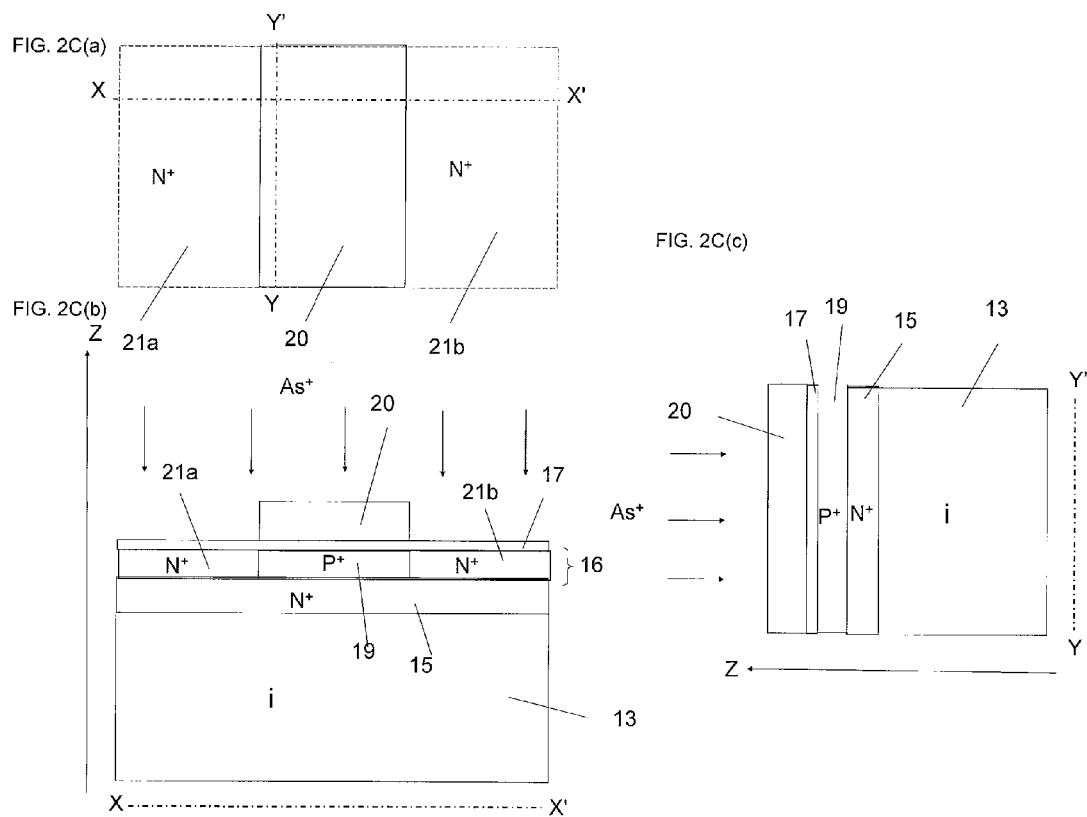

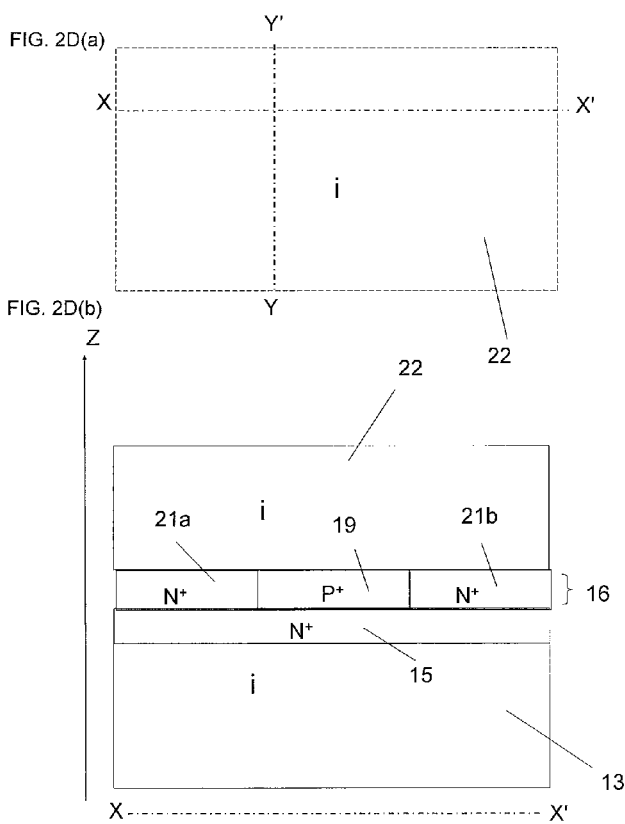

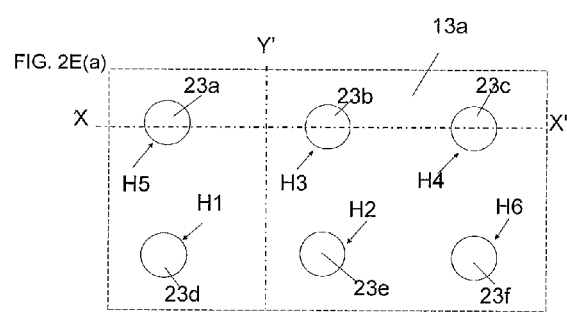
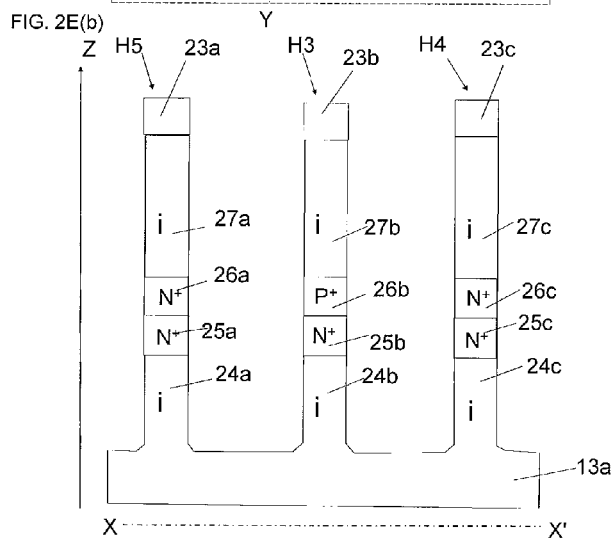
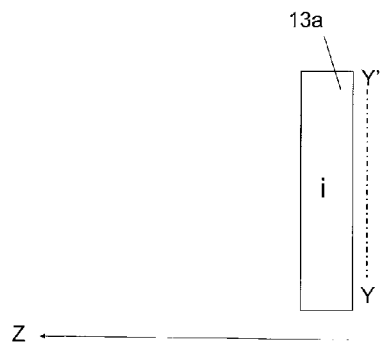

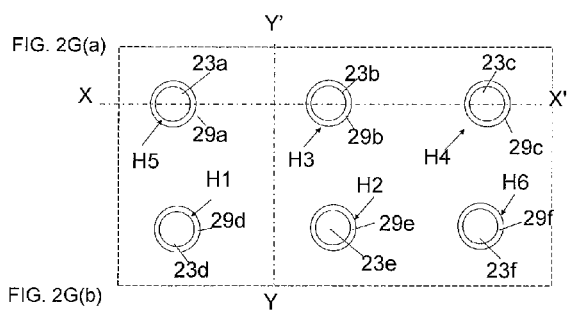
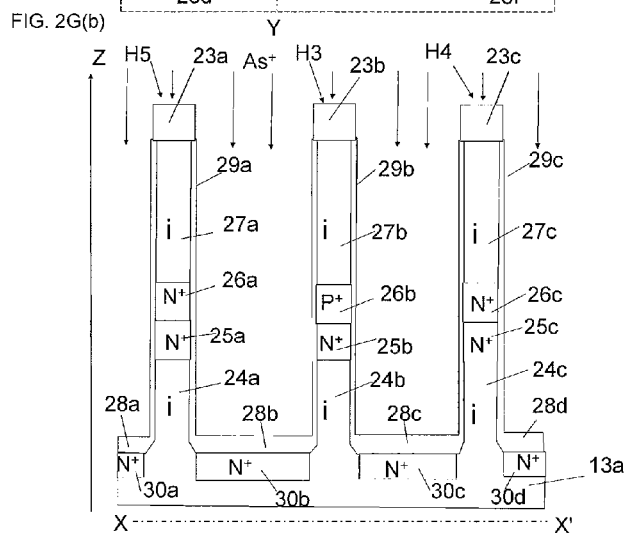
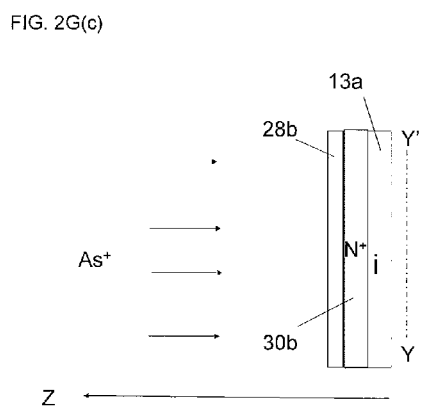

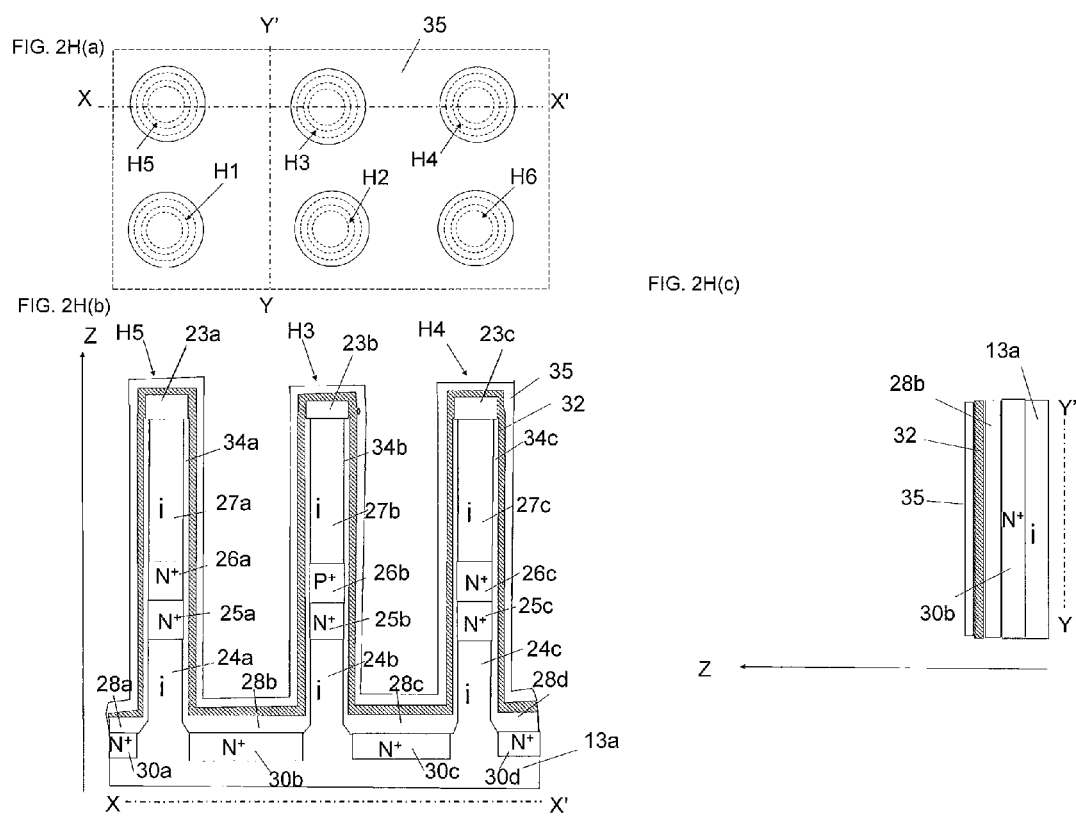

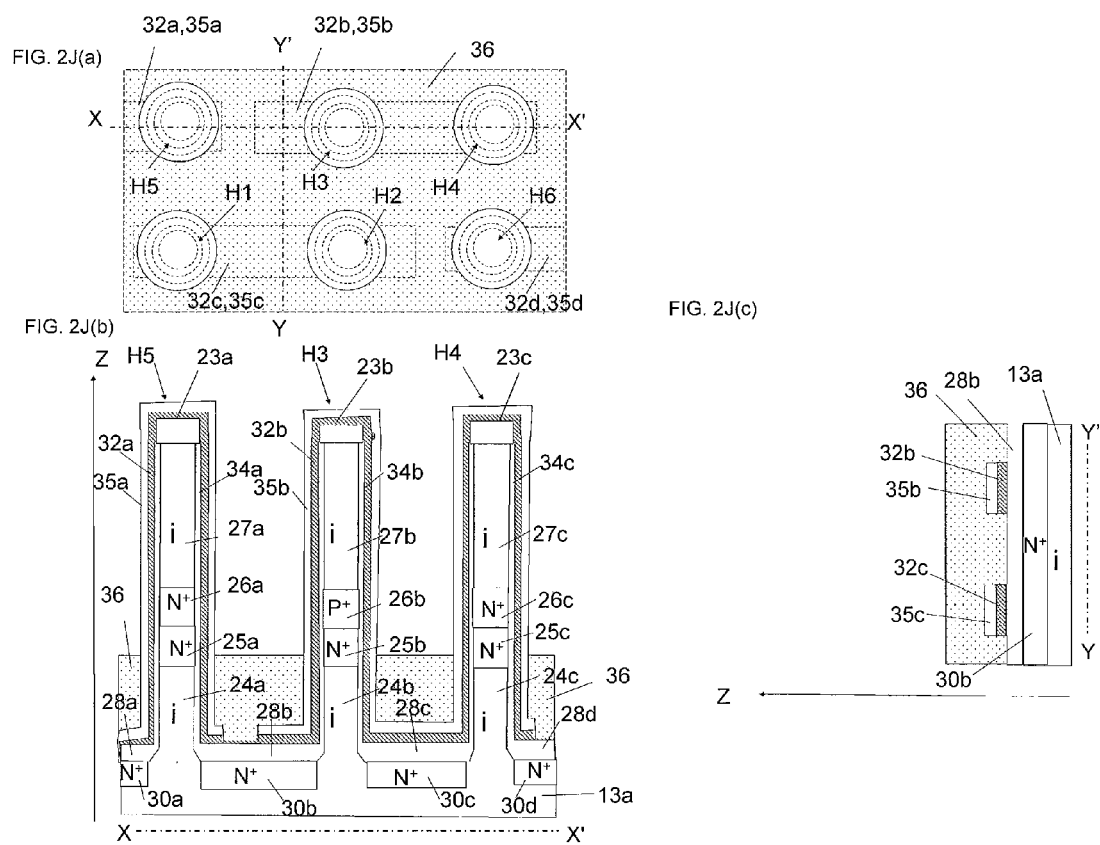

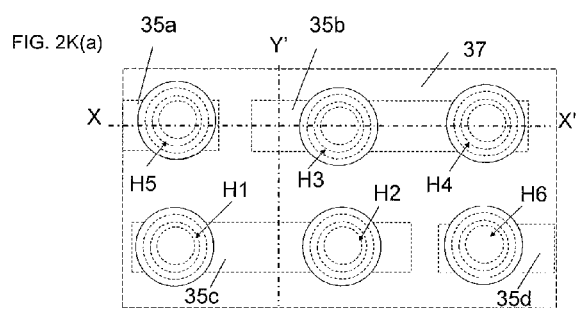
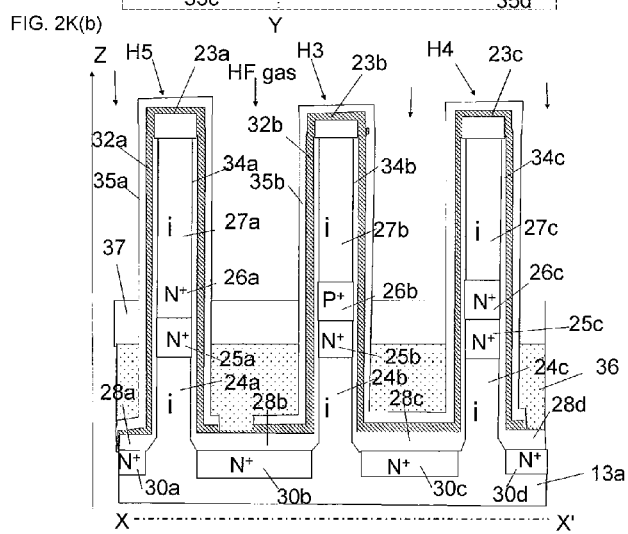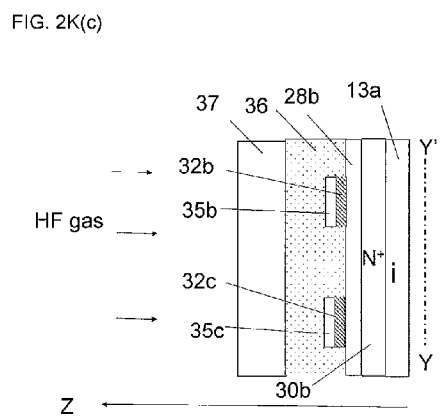
FIG. 2K(a)
FIG. 2K(b)
FIG. 2K(c)

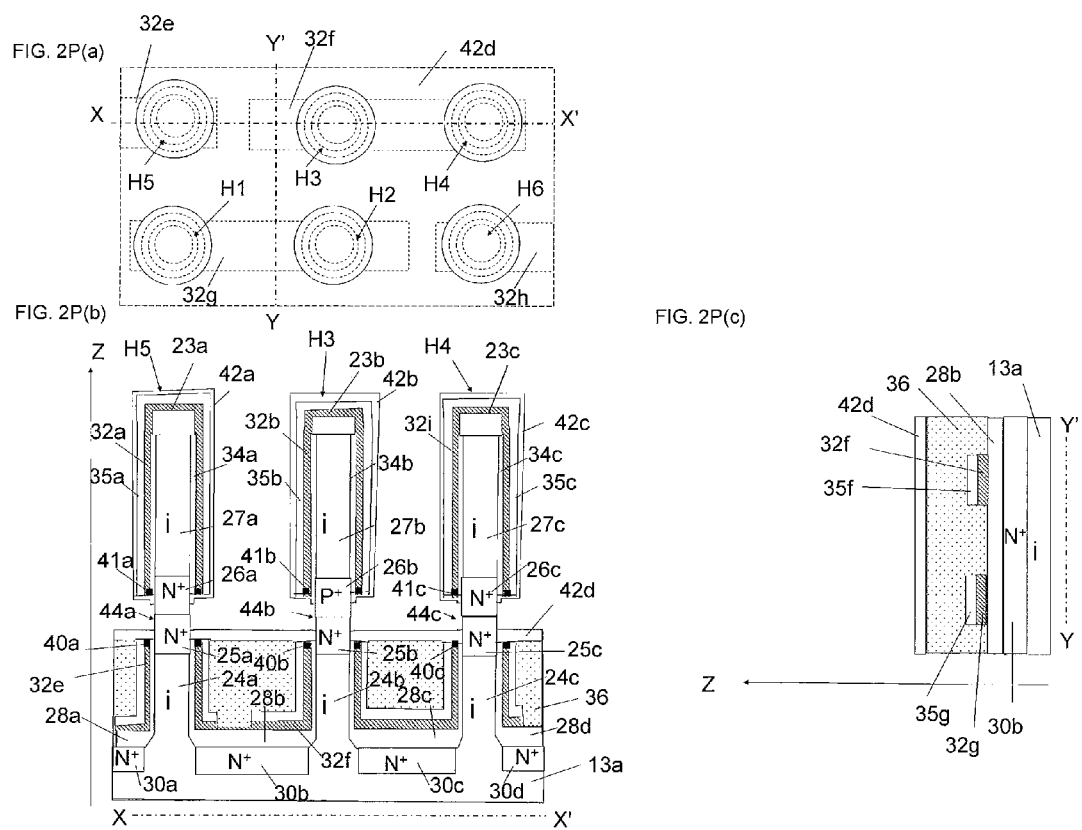

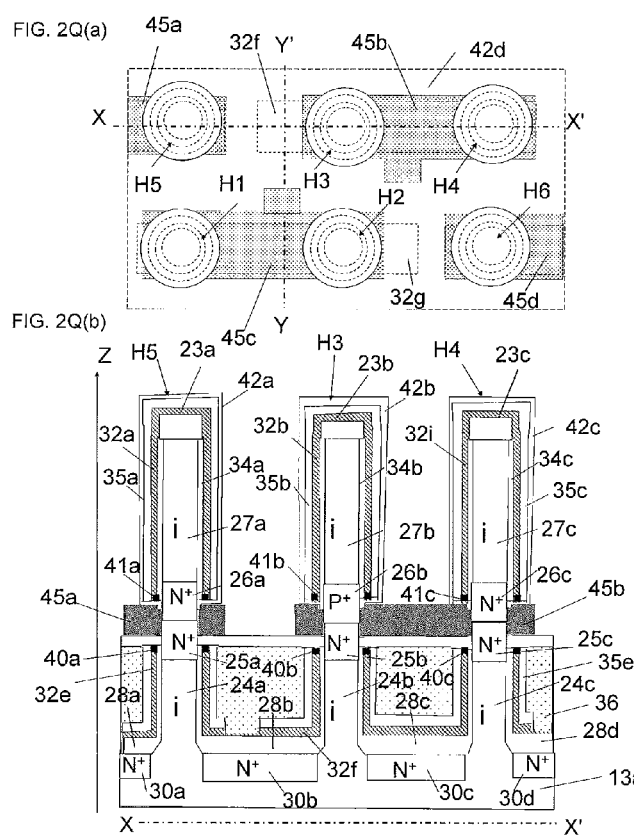

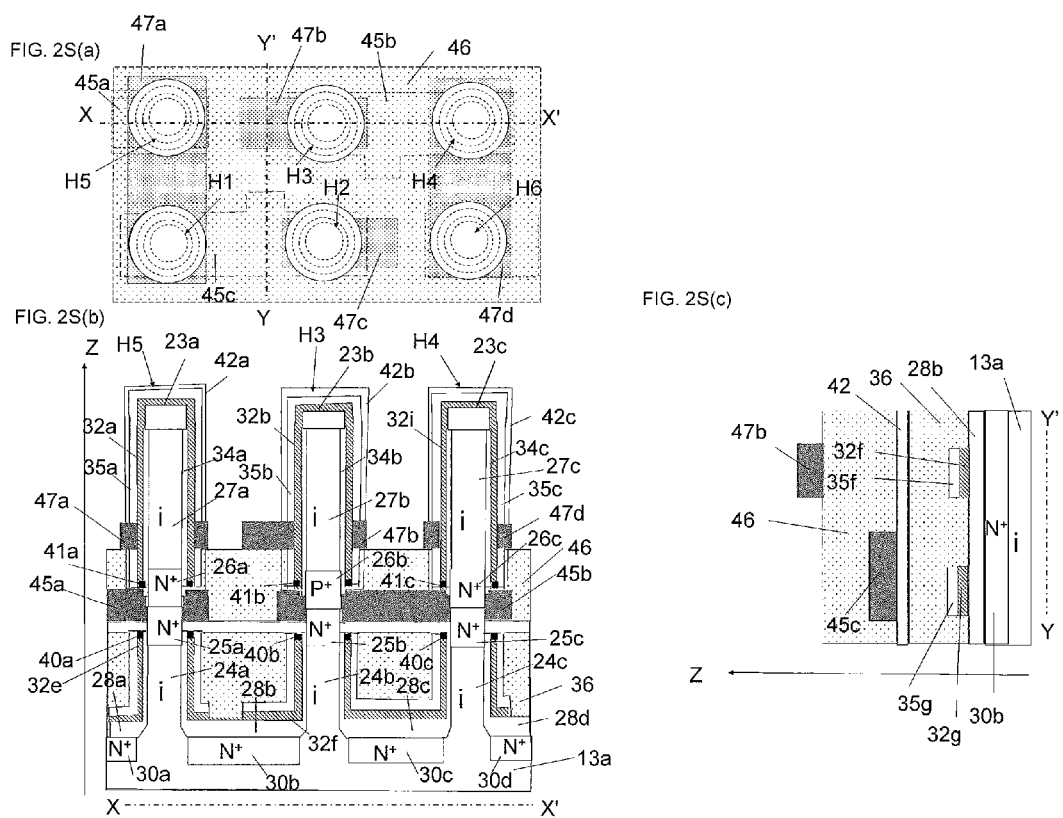

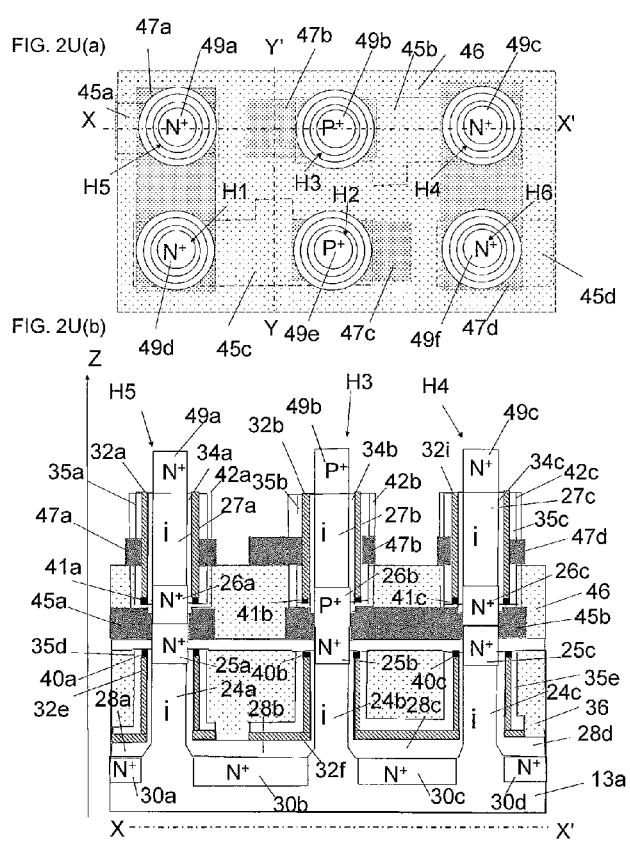

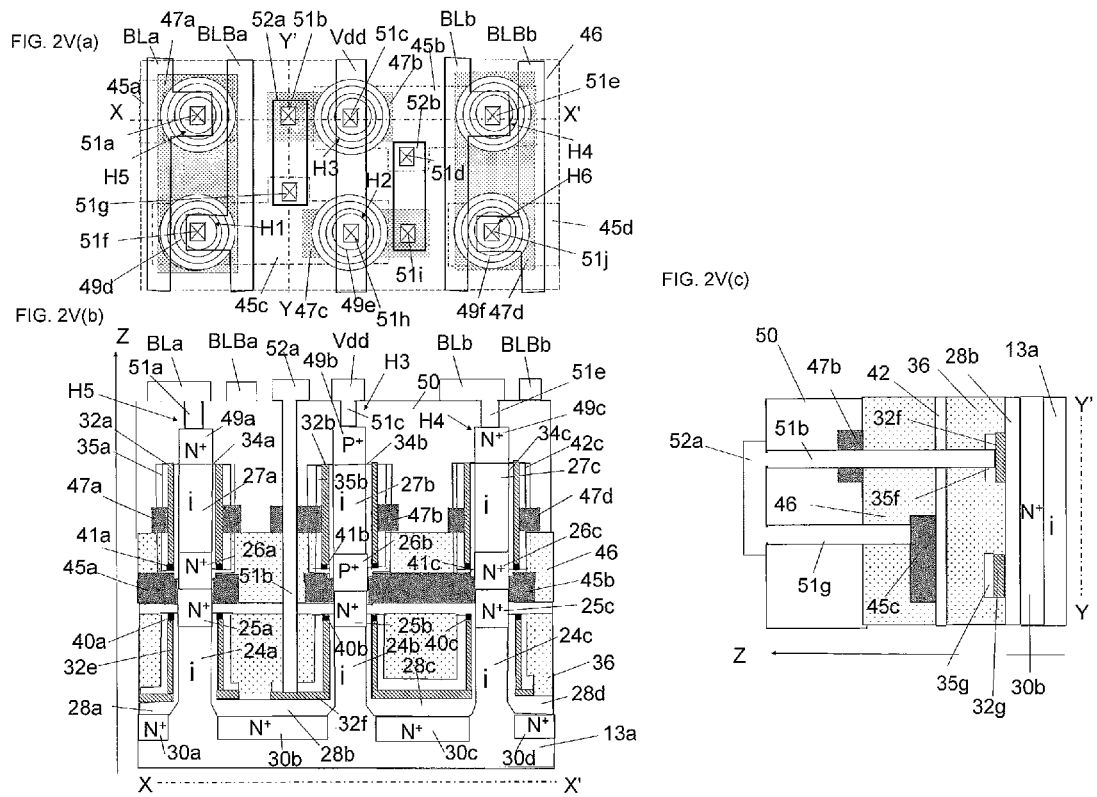

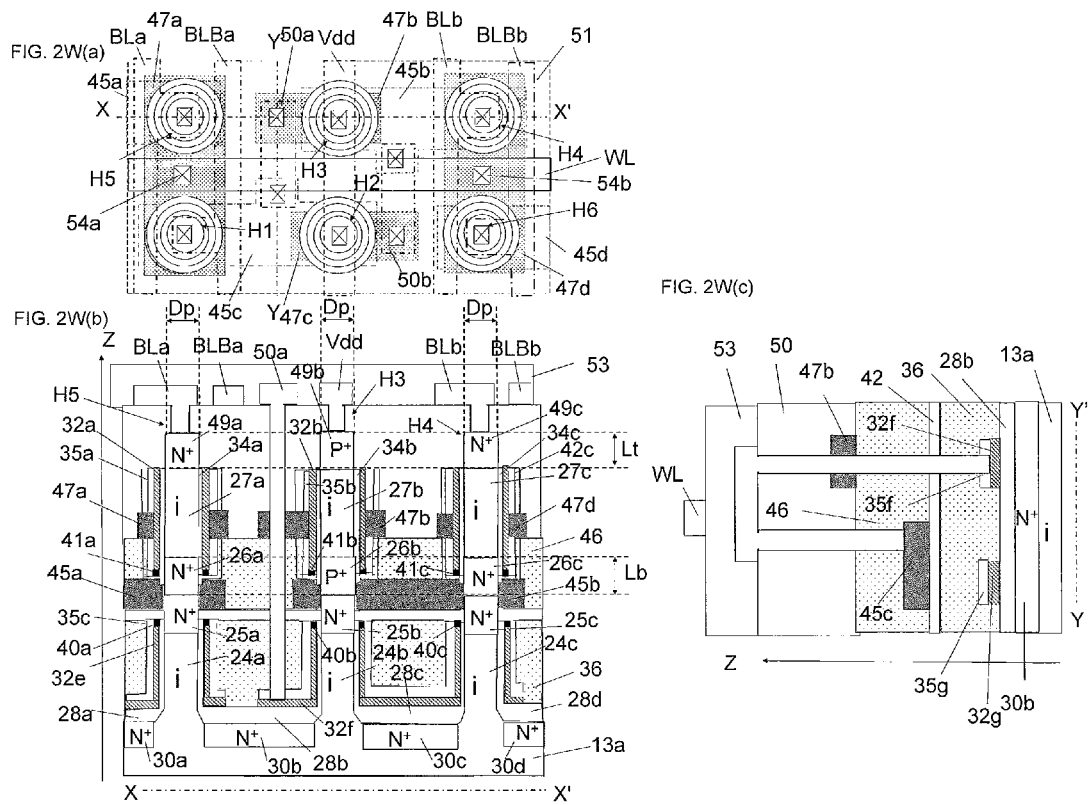

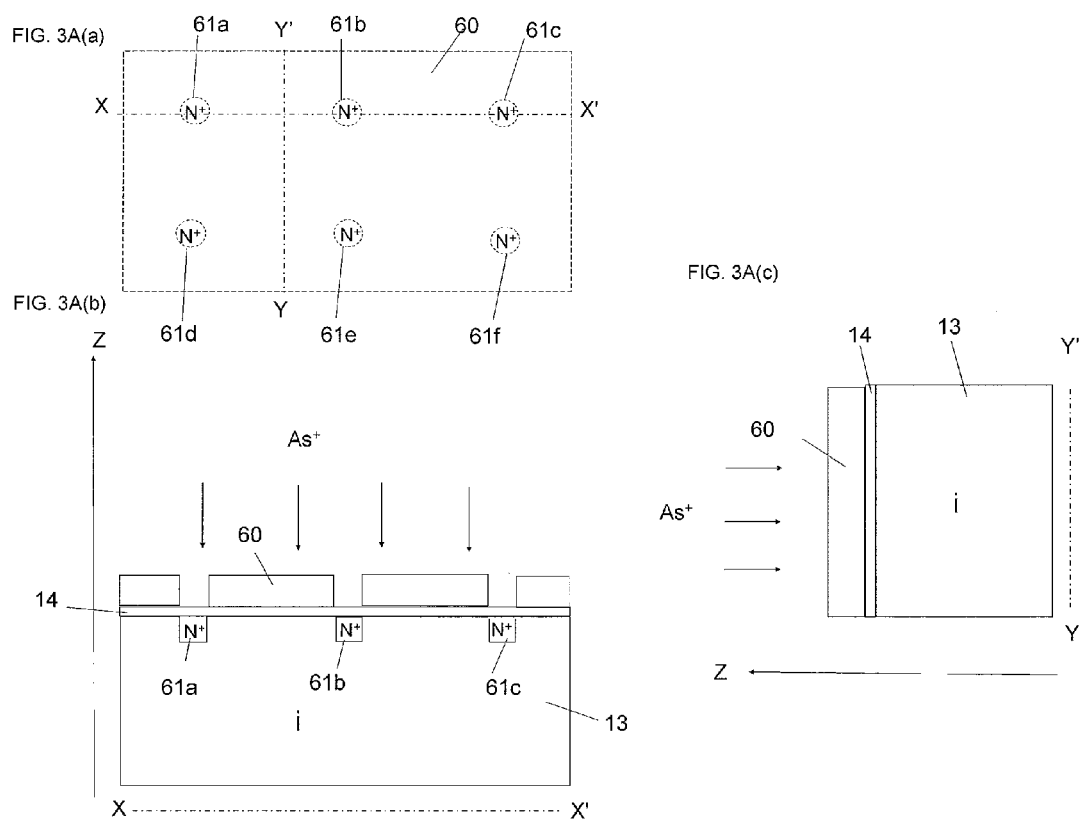

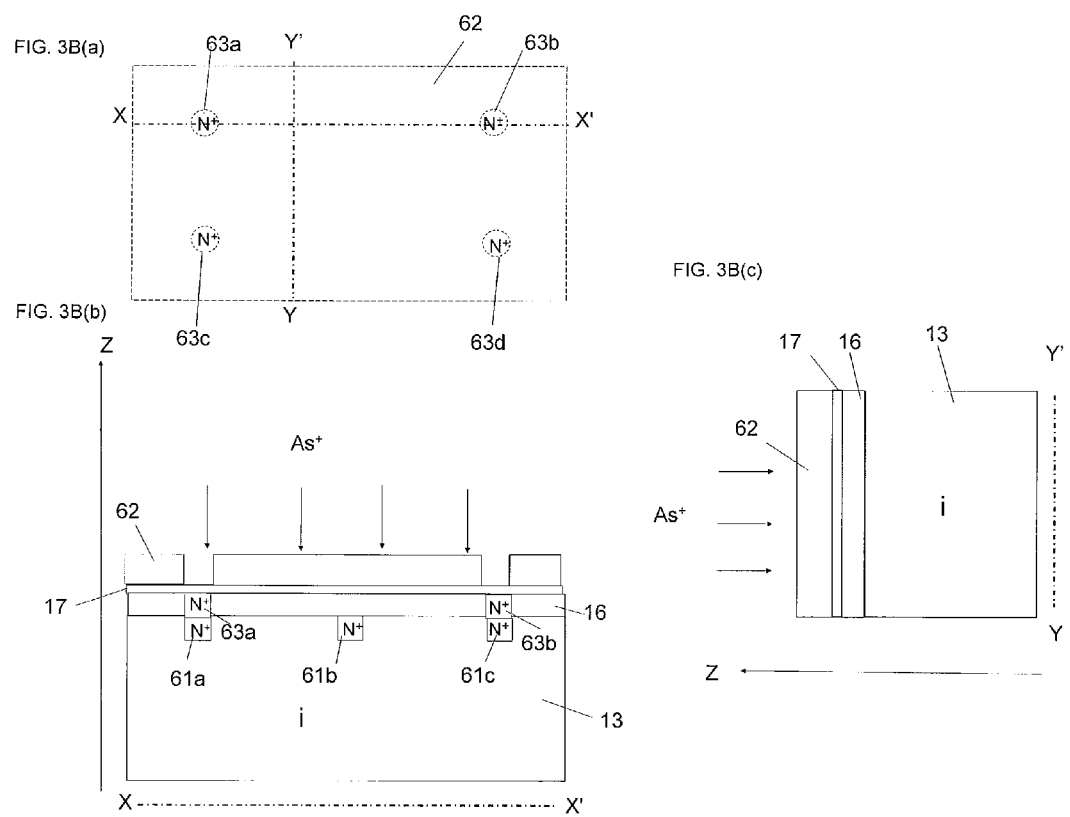

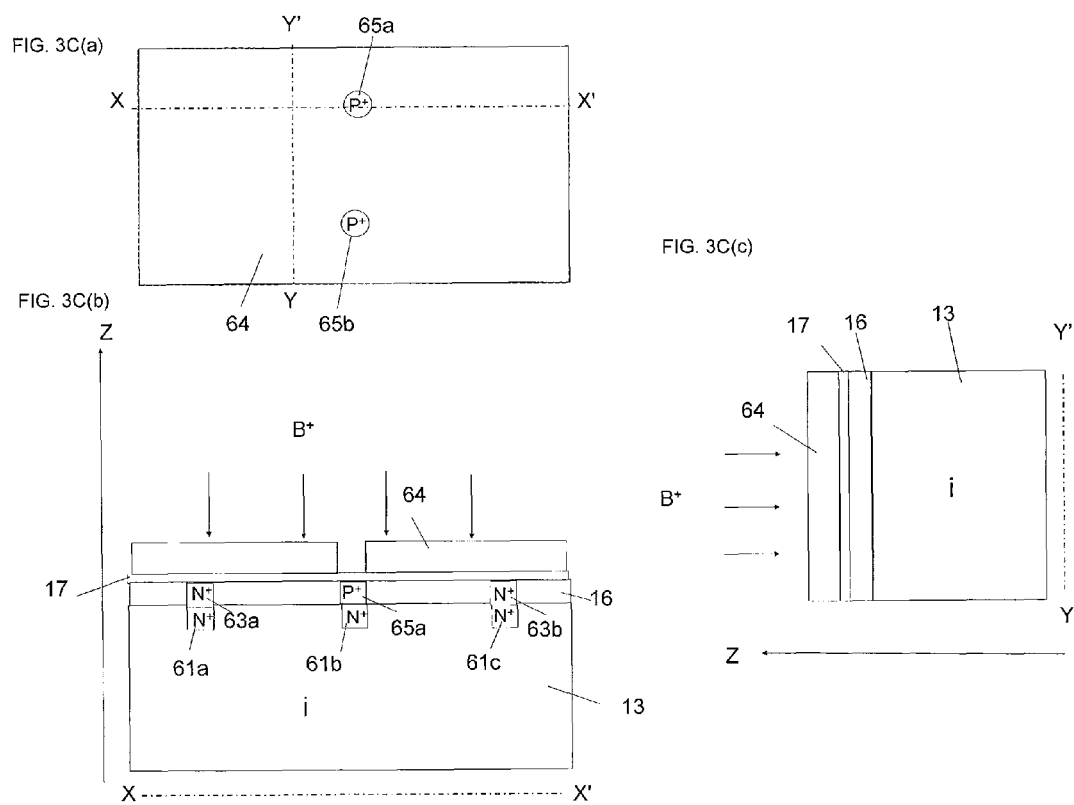

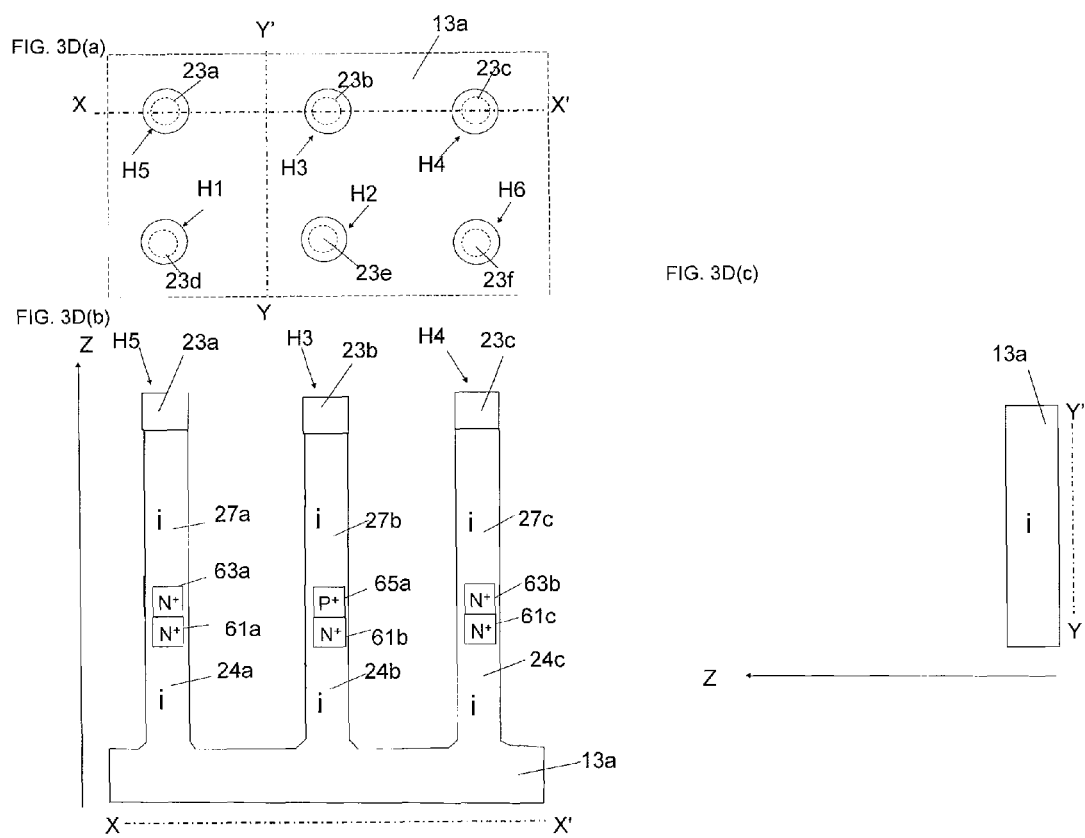

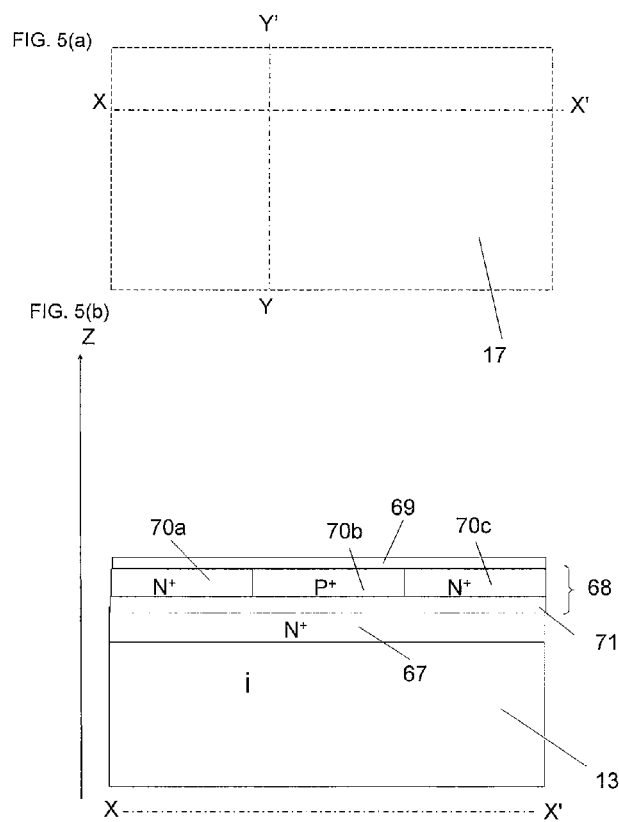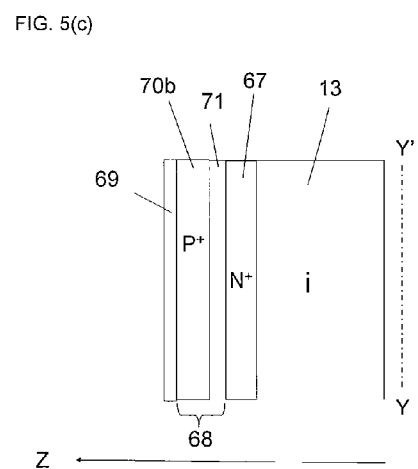

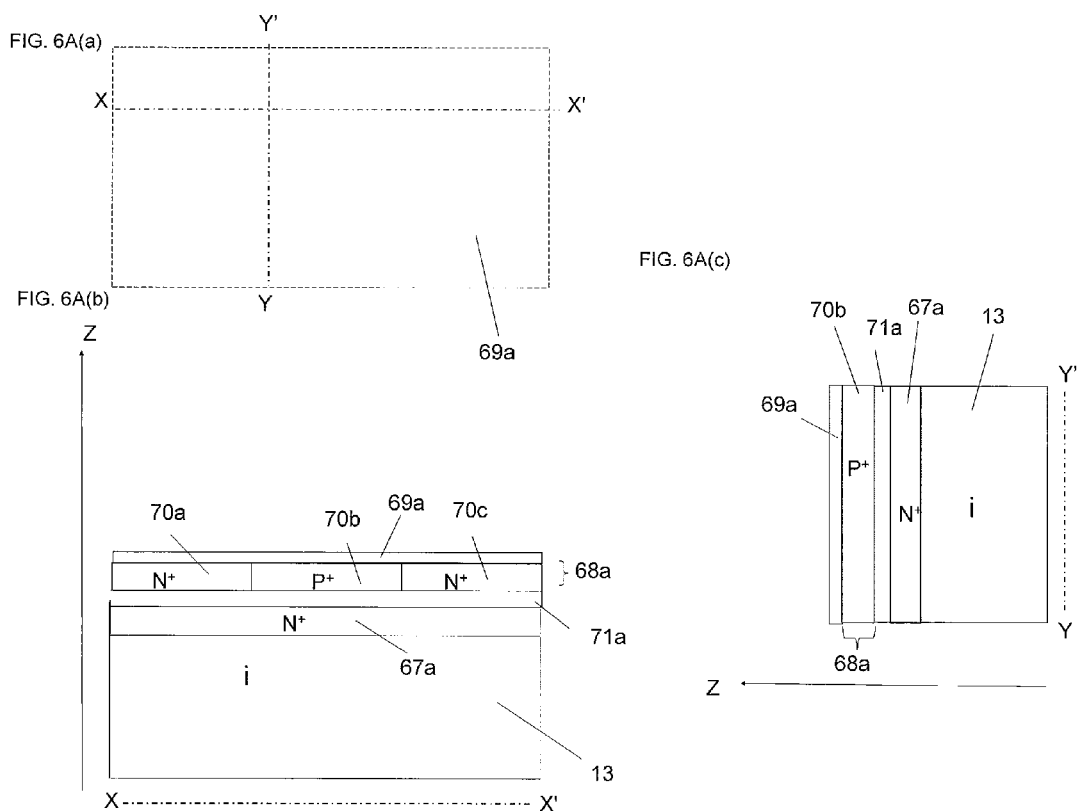

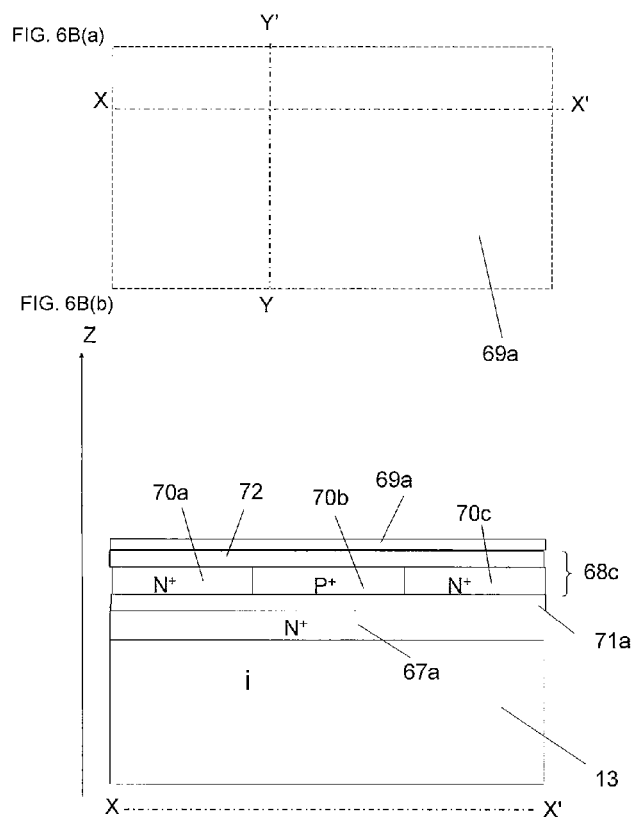

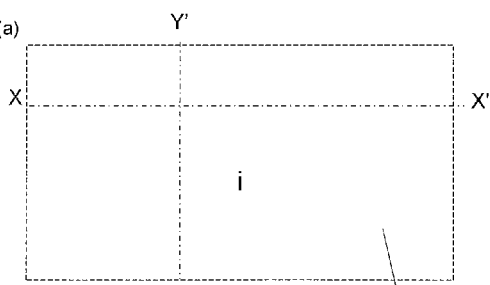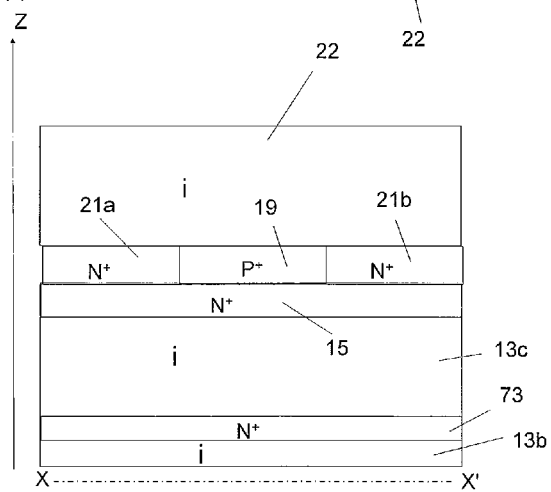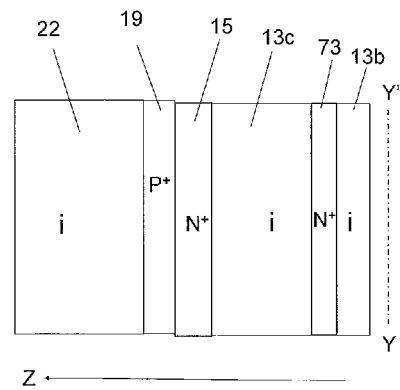

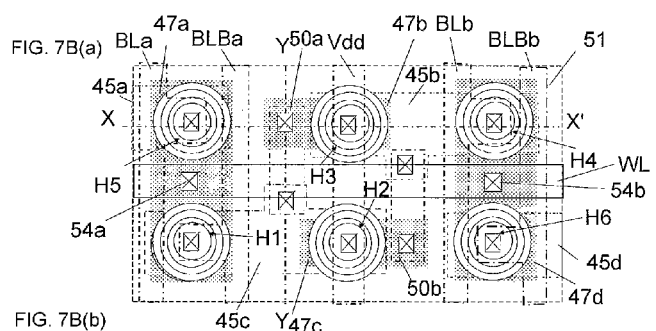
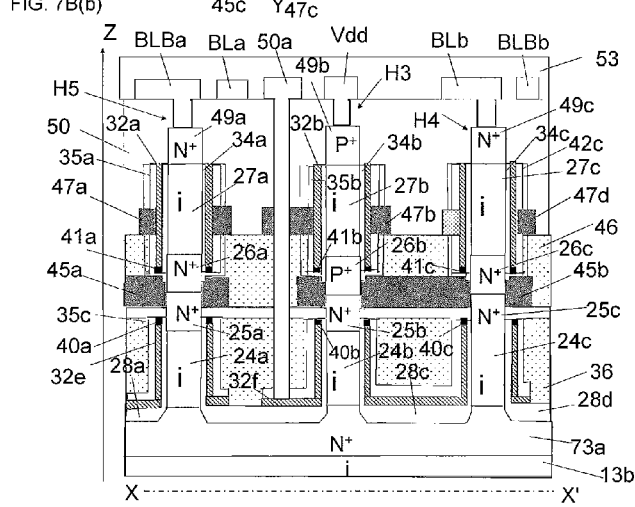
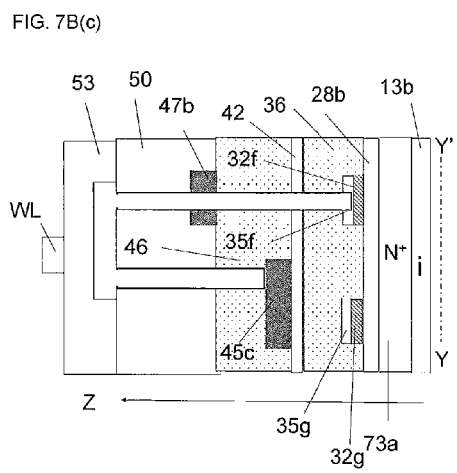
FIG. 7B(a)
FIG. 7B(b)
FIG. 7B(c)

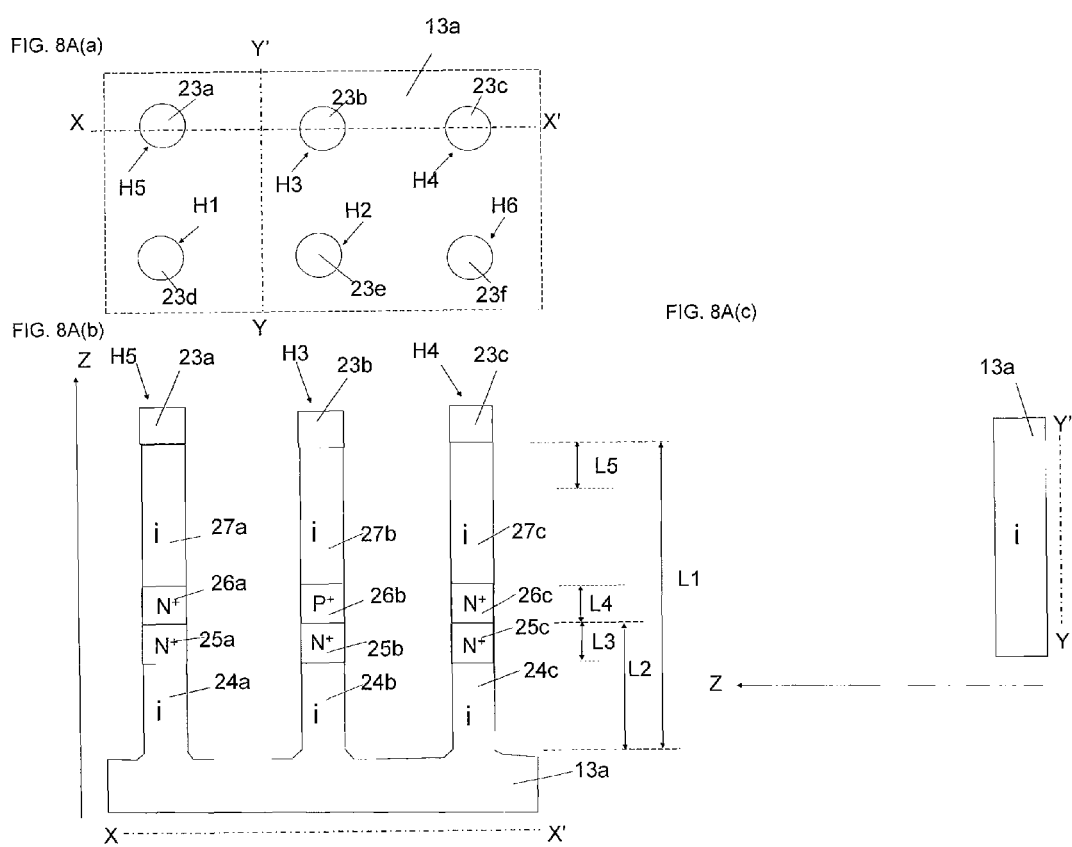

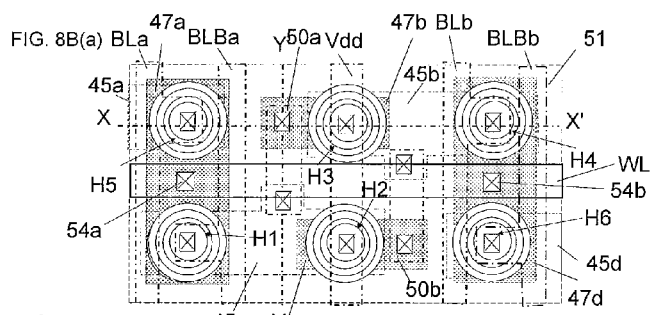
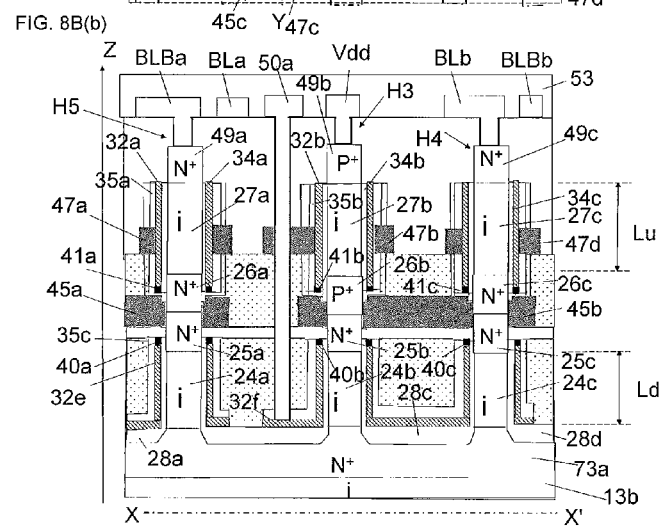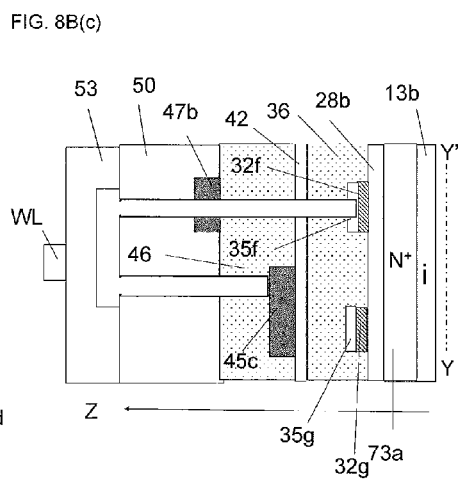

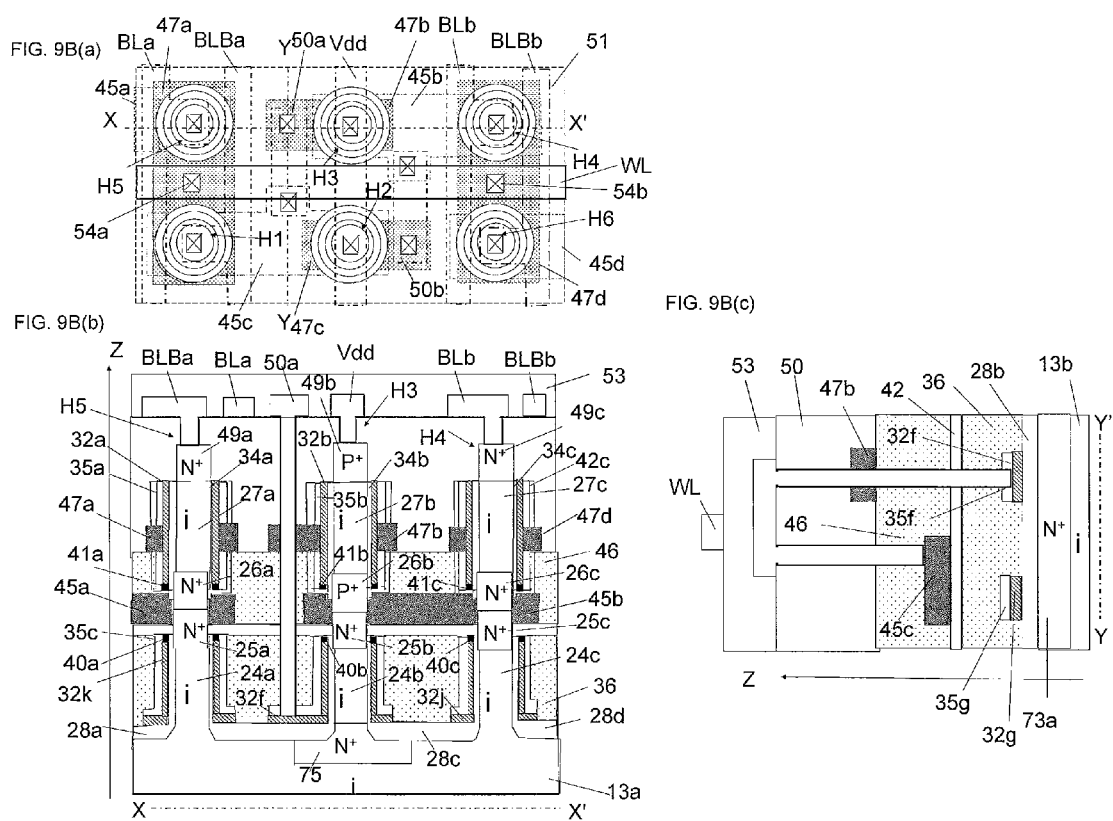

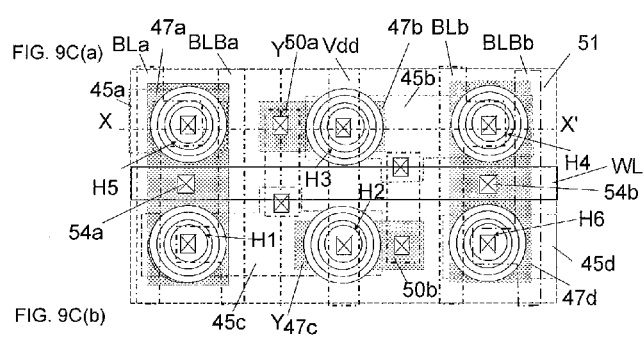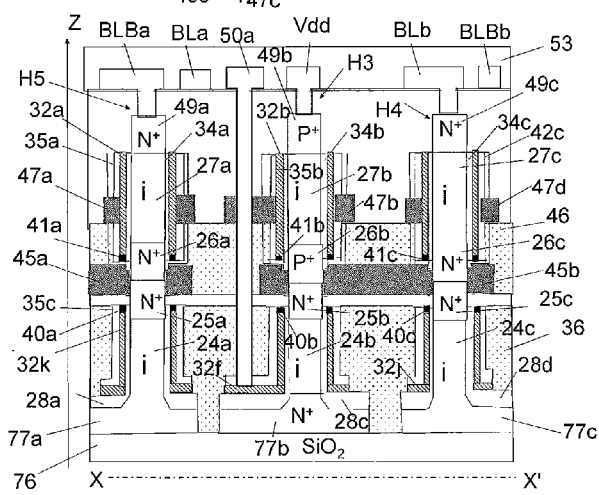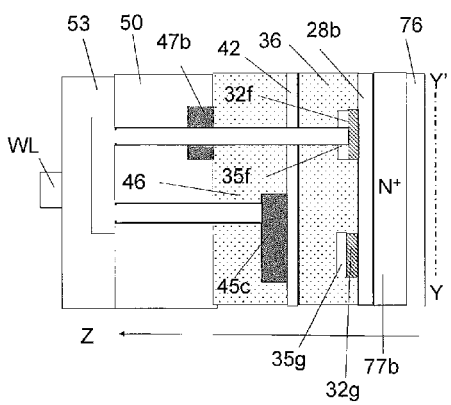

METHOD FOR PRODUCING A SEMICONDUCTOR DEVICE HAVING SGTS

RELATED APPLICATIONS

This application is a continuation-in-part application of International Application No. PCT/JP2013/057558 filed on Mar. 15, 2013, the entire content of which is incorporated herein by reference.

BACKGROUND OF THE INVENTION

1. Field of the Invention

The present invention relates to a method for producing a semiconductor device having surrounding gate MOS transistors (SGTs).

2. Description of the Related Art

In recent years, the use of SGTs as semiconductor elements that provide highly integrated semiconductor device has become widespread. With this background, higher integration of semiconductor devices having SGTs has been desired.

FIG. 13 shows a complementary metal-oxide-semiconductor (CMOS) inverter circuit having typical metal-oxide-semiconductor (MOS) transistors. As shown in FIG. 13, this circuit is constituted by an N-channel type MOS transistor 100a and a P-channel type MOS transistor 100b. A gate 101a of the N-channel type MOS transistor 100a and a gate 101b of the P-channel type MOS transistor 100b are connected to an input terminal Vi. A source 102a of the N-channel type MOS transistor 100a and a source 102b of the P-channel type MOS transistor 100b are connected to an output terminal Vo. A drain 103b of the P-channel type MOS transistor 100b is connected to a power supply terminal Vdd. A drain 103a of the N-channel type MOS transistor 100a is connected to a ground terminal Vss. In this circuit, in response to the application of an input voltage corresponding to "1" or "0" to the input terminal Vi, an output voltage corresponding to inverted "0" or "1" is taken out from the output terminal Vo. Such a CMOS inverter circuit is used in various circuit chips such as microprocessors. The realization of highly integrated CMOS inverter circuits directly results in the reduction in the size of circuit chips such as microprocessors. This reduction in the size of circuit chips realizes the reduction in the cost of the circuit chips.

FIG. 14 is a view showing a cross-sectional structure of a planar CMOS inverter circuit in the related art. As shown in FIG. 14, an N-well region 105 (hereinafter, a semiconductor region that forms a P-channel MOS transistor and contains a donor impurity is referred to as "N-well region") is formed in a P-type semiconductor substrate 104 (hereinafter, a semiconductor substrate containing an acceptor impurity is referred to as "P-type semiconductor substrate"). Element isolation insulating layers 106a and 106b are formed between a surface layer portion of the N-well region 105 and a surface layer portion of the P-type semiconductor substrate 104. Furthermore, a gate oxide film 107a for a P-channel MOS transistor is formed on a surface of the N-well region 105, and a gate oxide film 107b for an N-channel MOS transistor is formed on a surface of the P-type semiconductor substrate 104. A gate conductor layer 108a for the P-channel MOS transistor and a gate conductor layer 108b for the N-channel MOS transistor are respectively formed on the gate oxide films 107a and 107b. On the left side and the right side of the gate conductor layer 108a for the P-channel MOS transistor, a drain P$^+$ region 109a (hereinafter, a semiconductor region containing an acceptor impurity in a large amount is referred to as "P$^+$ region") and a source P$^+$ region 109b are respectively formed on a surface of the N-well region 105. Similarly, on both sides of the gate conductor layer 108b for the N-channel MOS transistor, a drain N$^+$ region 110b (hereinafter, a semiconductor region containing a donor impurity in a large amount is referred to as "N$^+$ region") and a source N$^+$ region 110a are formed on a surface of the P-type semiconductor substrate 104. Furthermore, a first interlayer insulating layer 111 is formed, and contact holes 112a, 112b, 112c, and 112d are formed in the first interlayer insulating layer 111 on the P$^+$ regions 109a and 109b and the N$^+$ regions 110a and 110b, respectively. A power supply wiring metal layer Vdd formed on the first interlayer insulating layer 111 is connected to the drain P$^+$ region 109a of the P-channel MOS transistor through the contact hole 112a. An output wiring metal layer Vo formed on the first interlayer insulating layer 111 is connected to the source P$^+$ regions 109b of the P-channel MOS transistor and the source N$^+$ region 110a of the N-channel MOS transistor through the contact holes 112b and 112c, respectively. A ground wiring metal layer Vss is connected to the drain N$^+$ region 110b of the N-channel MOS transistor through the contact hole 112d. Furthermore, a second interlayer insulating layer 113 is formed. Contact holes 114a and 114b are formed in the second interlayer insulating layer 113 on the gate conductor layer 108a for the P-channel MOS transistor and the gate conductor layer 108b for the N-channel MOS transistor, respectively. Furthermore, an input wiring metal layer Vi formed on the second interlayer insulating layer 113 is connected to the gate conductor layer 108a for the P-channel MOS transistor and the gate conductor layer 108b for the N-channel MOS transistor through the contact holes 114a and 114b, respectively.

In this known example, in order to reduce a surface occupation area of the planar CMOS inverter circuit, it is necessary to reduce two-dimensional sizes of the gate conductor layer 108a for the P-channel MOS transistor, the gate conductor layer 108b for the N-channel MOS transistor, the source N$^+$ region 110a and the drain N$^+$ region 110b for the N-channel MOS transistor, the drain P$^+$ region 109a and the source P$^+$ region 109b for the P-channel MOS transistor, the contact holes 112a, 112b, 112c, 112d, 114a, and 114b when the surface of the P-type semiconductor substrate 104 is viewed from above. To achieve this, high-resolution processing techniques such as a lithography technique and an etching technique for further reducing a processing size are necessary.

In the planar MOS transistor, channels of the P-channel MOS transistor and the N-channel MOS transistor are disposed between the source and the drain so as to extend in the horizontal direction along surfaces of the P-type semiconductor substrate 104 and the N-well region 105. In contrast, channels of SGTs are disposed so as to extend in a direction perpendicular to a surface of a semiconductor substrate (refer to, for example, Japanese Unexamined Patent Application Publication Nos. 2-188966, and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)).

FIG. 15A is a structural schematic view of an N-channel SGT. As shown in FIG. 15A, N$^+$ regions 116a and 116b are formed on upper and lower positions of a P-type or i-type (intrinsic) Si pillar 115 (hereinafter, a silicon semiconductor pillar is referred to as "Si pillar"). When one of the N$^+$ regions 116a and 116b functions as a source, the other functions as a drain. When one of the N$^+$ regions 116a and 116b functions as a drain, the other functions as a source. The Si pillar 115 located between the source/drain N$^+$ regions 116a and 116b functions as a channel region 117. A gate insulating layer 118 is formed so as to surround the channel region 117. A gate conductor layer 119 is formed so as to surround the gate insulating layer 118. In the SGT, the source/drain $N^+$ regions 116a and 116b, the channel region 117, the gate insulating layer 118, and the gate conductor layer 119 are formed in or on the single Si pillar 115. Therefore, the surface occupation area of the SGT apparently corresponds to a single source or drain $N^+$ region of a planar MOS transistor. Accordingly, regarding circuit chips including SGTs, a further reduction in the chip size can be realized compared with circuit chips including planar MOS transistors.

FIG. 15B is a cross-sectional view of an inverter circuit having SGTs (refer to, for example, U.S. Pat. No. 8,188,537). As shown in FIG. 15B, an i-layer 121 (The term "i-layer" refers to an intrinsic Si layer, and an intrinsic Si layer is hereinafter referred to as "i-layer".) is formed on an insulating layer substrate 120. A Si pillar SP1 for a P-channel SGT and a Si pillar SP2 for an N-channel SGT are formed on the i-layer 121. A source $P^+$ region 122 of the P-channel SGT is formed in the i-layer 121 connected to a lower portion of the Si pillar SP1 for the P-channel SGT so as to be integrated with the i-layer 121 and to surround a lower portion of the Si pillar SP1. Similarly, a source $N^+$ region 123 of the N-channel SGT is formed so as to be integrated with the i-layer 121 and to surround a lower portion of the Si pillar SP2. Furthermore, a drain $P^+$ region 124 of the P-channel SGT is formed in an upper portion of the Si pillar SP1 for the P-channel SGT, and a drain $N^+$ region 125 of the N-channel SGT is formed in an upper portion of the Si pillar SP2 for an N-channel SGT. Gate insulating layers 126a and 126b are formed so as to surround the Si pillars SP1 and SP2, respectively. A gate conductor layer 127a of the P-channel SGT and a gate conductor layer 127b of the N-channel SGT are formed so as to surround the gate insulating layers 126a and 126b, respectively. Insulating layers 128a and 128b are formed so as to surround the gate conductor layers 127a and 127b, respectively. The source $P^+$ region 122 of the P-channel SGT is connected to the source $N^+$ region 123 of the N-channel SGT through a silicide layer 129b. A silicide layer 129a is formed on the drain $P^+$ region 124 of the P-channel SGT. A silicide layer 129c is formed on the drain $N^+$ region 125 of the N-channel SGT. An i-layer 130a between the $P^+$ regions 122 and 124 located in a lower portion and an upper portion of the Si pillar SP1 functions as a channel of the P-channel SGT. An i-layer 130b between the $N^+$ regions 123 and 125 located in a lower portion and an upper portion of the Si pillar SP2 functions as a channel of the N-channel SGT.

Subsequently, a $SiO_2$ layer 131 is formed by a chemical vapor deposition (CVD) method so as to cover the insulating layer substrate 120, the i-layer 121, and the Si pillars SP1 and SP2. Contact holes 132a, 132b, and 132c are formed in the $SiO_2$ layer 131 on the Si pillar SP1, the Si pillar SP2, and the source $P^+$ region 122 of the P-channel SGT and the source $N^+$ region 123 of the N-channel SGT, respectively. A power supply wiring metal layer Vdd formed on the $SiO_2$ layer 131 is connected to the drain $P^+$ region 124 of the P-channel SGT and the silicide layer 129a through the contact hole 132a. An output wiring metal layer Vo formed on the $SiO_2$ layer 131 is connected to the source $P^+$ region 122 of the P-channel SGT, the source $N^+$ region 123 of the N-channel SGT, and the silicide layer 129b through the contact hole 132b. Furthermore, a ground wiring metal layer Vss formed on the $SiO_2$ layer 131 is connected to the drain $N^+$ region 125 of the N-channel SGT and the silicide layer 129c through the contact hole 132c. Furthermore, the gate conductor layer 127a of the P-channel SGT and the gate conductor layer 127b of the N-channel SGT are connected to each other and connected to an input wiring metal layer (not shown). In this inverter circuit having SGTs, since the P-channel SGT and the N-channel SGT are respectively formed in the Si pillar SP1 and the Si pillar SP2, the circuit area when viewed from the vertical direction is reduced. As a result, the size of the inverter circuit can be further reduced as compared with an inverter circuit having planar MOS transistors in the related art.

Further reduction in the size of a circuit chip having SGTs is desired. To meet this need, it has been assumed that the circuit area when viewed from the vertical direction can be reduced by forming two SGTs in a single Si pillar SPa, as shown in a structural schematic view of FIG. 16 (refer to, for example, Hyoungjun Na and Tetsuo Endoh: "A New Compact SRAM cell by Vertical MOSFET for Low-power and Stable Operation", Memory Workshop (IMW)-2011 3rd IEEE International Digest P1-P4 2011). As shown in FIG. 16, a CMOS inverter circuit is formed in which an N-channel SGT 133a is formed in a lower portion of the Si pillar SPa and a P-channel SGT 133b is formed on the N-channel SGT 133a. A drain $N^+$ region 134a of the N-channel SGT 133a is formed in a lower portion of the Si pillar SPa and is connected to a ground terminal Vss. A channel i-layer 136a is formed on the drain $N^+$ region 134a. A gate insulating layer 137a is formed on an outer peripheral portion of the channel i-layer 136a. A gate conductor layer 138a for the N channel SGT is formed on an outer peripheral portion of the gate insulating layer 137a. Furthermore, a source $N^+$ region 134b is formed on the channel i-layer 136a. A source $P^+$ region 135a of the P-channel SGT 133b is formed on the source $N^+$ region 134b so as to be in contact with the source $N^+$ region 134b. A channel i-layer 136b is formed on the source $P^+$ region 135a. A gate insulating layer 137b is formed on an outer peripheral portion of the channel i-layer 136b. A gate conductor layer 138b used for the P-channel SGT 133b is formed on an outer peripheral portion of the gate insulating layer 137b—. Furthermore, a drain $P^+$ region 135b is formed in a top portion of the Si pillar SPa, the top portion being located on the channel i-layer 136b. The drain $P^+$ region 135b is connected to a power supply terminal Vdd. The gate conductor layer 138a of the N-channel SGT 133a and the gate conductor layer 138b of the P-channel SGT 133b are connected to an input terminal Vi. The source $N^+$ region 134b of the N-channel SGT 133a and the source $P^+$ region 135a of the P-channel SGT 133b are connected to an output terminal Vo.

Referring to FIG. 16, in the case where an SGT inverter circuit is formed in the single Si pillar SPa, a problem of difficulty of manufacture occurs. It is necessary to form the source $P^+$ region 135a of the P-channel SGT 133b and the source $N^+$ region 134b of the N-channel SGT 133a so that the source $P^+$ region 135a and the source $N^+$ region 134b are disposed in the middle of the Si pillar SPa and are in contact with each other. In the case where the planar MOS transistor circuit in the related art shown in FIG. 14 is produced, the $N^+$ regions 110a and 110b and the $P^+$ regions 109a and 109b can be formed by an ion implantation method in which accelerated donor and acceptor impurity ions are implanted from an upper surface of the P-substrate 104 using, as a mask, a photoresist layer formed by using an existing photolithographic technique. Similarly, in the case where the inverter circuit having SGTs and shown in FIG. 15B is formed, the $N^+$ region 123 and the $P^+$ region 122 can be formed by an ion implantation method in which accelerated donor and acceptor impurity ions are implanted from an upper surface of the insulating layer substrate 120 using, as a mask, a photoresist layer formed by using a photolithographic technique. In contrast, referring to FIG. 16, in the case where an inverter circuit is formed in the single Si pillar SPa, the $N^+$ region 134b and the P⁺ region 135a cannot be formed by the ion implantation method used in the related art. This is because ions cannot be implanted from a horizontal direction into a side face of the Si pillar by the ion implanting method used in the related art. Instead of this method, the following method is conceivable: A donor or acceptor impurity is diffused into a Si pillar SPa by diffusing from, for example, a poly-Si or SiO₂ film that contains the donor or acceptor impurity into a side face near the middle of the Si pillar SPa. For this purpose, the whole Si pillar SPa is covered with a diffusion stopper film, and part of the diffusion stopper film located in a portion to be diffused is then removed. Subsequently, an impurity diffusion film is deposited, and heat treatment is performed to form the N⁺ region 134b and the P⁺ region 135a. In this case, the N⁺ region 134b and the P⁺ region 135a cannot be formed at the same time, and thus it is necessary to form the N⁺ region 134b and the P⁺ region 135a separately. Therefore, it is difficult to form the N⁺ region 134b and the P⁺ region 135a in the vertical direction with a high accuracy.

Furthermore, producing an SGT circuit having a structure in which both an N-channel SGT and a P-channel SGT are provided in a lower portion and both an N-channel SGT and a P-channel SGT are further provided in an upper portion further increases the difficulty of manufacture, for example, as in the case where the structure shown in FIG. 17A, in which a P-channel SGT 139a is formed in a lower portion of a single Si pillar SPb and an N-channel SGT 139b is formed on the P-channel SGT 139a, and the structure shown in FIG. 17B, in which an N-channel SGT 140a is formed in a lower portion of a single Si pillar SPc and an N-channel SGT 140b having the same structure as the N-channel SGT 140a is further formed on the N-channel SGT 140a, are formed.

SUMMARY OF THE INVENTION

A method for producing a semiconductor device having surrounding gate MOS transistors (SGTs) according to the present invention includes a first impurity-region-forming step of forming one or both of a first impurity region containing a donor impurity and a second impurity region containing an acceptor impurity in a single layer in a surface layer portion of a semiconductor substrate; a first semiconductor-layer-forming step of forming a first semiconductor layer above the semiconductor substrate; a second impurity-region-forming step of forming one or both of a third impurity region containing a donor impurity and a fourth impurity region containing an acceptor impurity in a single layer in a surface layer portion of the first semiconductor layer; a second semiconductor-layer-forming step of forming a second semiconductor layer above the first semiconductor layer; an island-shaped semiconductor-forming step of etching the second semiconductor layer, the first semiconductor layer, and the semiconductor substrate from an upper surface of the second semiconductor layer to form a plurality of first island-shaped semiconductors each of which includes the semiconductor substrate, the first semiconductor layer, and the second semiconductor layer and in which the first impurity region and the second impurity region are overlapped with one or other of the third impurity region and the fourth impurity region in a perpendicular direction with respect to a surface of the semiconductor substrate; a third impurity-region-forming step of forming a fifth impurity region containing a donor impurity in a bottom portion of a first island-shaped semiconductor having the first impurity region and forming a sixth impurity region containing an acceptor impurity in a bottom portion of a first island-shaped semiconductor having the second impurity region; a gate insulating layer-forming step of forming a gate insulating layer so as to surround the first island-shaped semiconductors; a gate conductor layer-forming step of forming a gate conductor layer so as to surround the gate insulating layer; and a fourth impurity-region-forming step of forming a seventh impurity region containing a donor impurity in a top portion of the first island-shaped semiconductor having the third impurity region and forming an eighth impurity region containing an acceptor impurity in a top portion of the first island-shaped semiconductor having the fourth impurity region, the top portions being located above the gate insulating layer and the gate conductor layer. In the method, one or both of a first SGT and a second SGT are formed on the lower portion side of the first island-shaped semiconductors, the first SGT including the first impurity region and the fifth impurity region, one of which functions as a source and the other of which functions as a drain, the semiconductor substrate of the first island-shaped semiconductor which functions as a channel, and the gate conductor layer which functions as a gate, the second SGT including the second impurity region and the sixth impurity region, one of which functions as a source and the other of which functions as a drain, the semiconductor substrate of the first island-shaped semiconductor which functions as a channel, and the gate conductor layer which functions as a gate. In addition, one or both of a third SGT and a fourth SGT are formed on the upper portion side of the first island-shaped semiconductors, the third SGT including the third impurity region and the seventh impurity region, one of which functions as a source and the other of which functions as a drain, the second semiconductor layer of the first island-shaped semiconductor which functions as a channel, and the gate conductor layer which functions as a gate, the fourth SGT including the fourth impurity region and the eighth impurity region, one of which functions as a source and the other of which functions as a drain, the second semiconductor layer of the first island-shaped semiconductor which functions as a channel, and the gate conductor layer which functions as a gate.

The semiconductor device is preferably formed so that a length of each of the third impurity region, the fourth impurity region, the seventh impurity region, and the eighth impurity region in the vertical direction is larger than a diameter of a horizontal cross section of each of the first island-shaped semiconductors.

The semiconductor device is preferably formed so that a length of the third impurity region in the vertical direction is larger than a length of the seventh impurity region in the vertical direction, and a length of the fourth impurity region in the vertical direction is larger than a length of the eighth impurity region in the vertical direction.

In a step of forming the third SGT and the fourth SGT where a diameter of a horizontal cross section of each of the first island-shaped semiconductors, the diameter being determined from a circuit design value, is decreased, the semiconductor device is preferably formed so that a rate of increase in a length of each of the third impurity region and the fourth impurity region in the vertical direction is equal to or larger than a value of the negative second power of a rate of decrease in the diameter of the horizontal cross section of each of the first island-shaped semiconductors.

The semiconductor device is preferably formed so that at least one of a diameter of a horizontal cross section of the seventh impurity region and a diameter of a horizontal cross section of the eighth impurity region is larger than the diameter of the horizontal cross section of each of the first island-shaped semiconductors.

Immediately after the island-shaped semiconductor-forming step, preferably, the first impurity region, the second impurity region, the third impurity region, the fourth impurity region, the fifth impurity region, the sixth impurity region, the seventh impurity region, and the eighth impurity region are not exposed from side faces of the first island-shaped semiconductors.

Immediately before the gate insulating layer-forming step, preferably, the first impurity region, the second impurity region, the third impurity region, the fourth impurity region, the fifth impurity region, the sixth impurity region, the seventh impurity region, and the eighth impurity region are not exposed from side faces of the first island-shaped semiconductors.

In the second impurity-region-forming step, preferably, the third impurity region and the fourth impurity region are not in contact with the first impurity region and the second impurity region.

The first impurity region and the second impurity region are preferably formed in the semiconductor substrate so as to be located more inside than a surface of the semiconductor substrate, and the first semiconductor layer is preferably subsequently formed.

The third impurity region and the fourth impurity region are preferably formed in the first semiconductor layer so as to be located more inside than a surface of the first semiconductor layer, and the second semiconductor layer is preferably subsequently formed.

The method preferably includes the steps of forming a ninth impurity region containing a donor or acceptor impurity inside the semiconductor substrate with respect to a depth direction of the semiconductor substrate; forming a tenth impurity region of the same conductivity type as the ninth impurity region in a surface layer portion of the semiconductor substrate; subsequently forming the first semiconductor layer; and allowing the ninth impurity region to be located in a bottom portion of the first island-shaped semiconductors.

The semiconductor device is preferably formed so that a first channel length of the first SGT and the second SGT and a second channel length of the third SGT and the fourth SGT are different from each other, the first SGT including, as the channel, the semiconductor substrate between the source and the drain constituted by the first impurity region and the fifth impurity region, the second SGT including, as the channel, the semiconductor substrate between the source and the drain constituted by the second impurity region and the sixth impurity region, the third SGT including, as the channel, the second semiconductor layer between the source and the drain constituted by the third impurity region and the seventh impurity region, the fourth SGT including, as the channel, the second semiconductor layer between the source and the drain constituted by the fourth impurity region and the eighth impurity region.

The first SGT or the second SGT is preferably formed in the first island-shaped semiconductor or a second island-shaped semiconductor that is formed separately from the first island-shaped semiconductor, and the gate conductor layer of any of the first SGT and the second SGT is preferably allowed to electrically float or formed so as to have a ground potential so that any of the first SGT and the second SGT is formed so as not to be present on a circuit.

Preferably, the second island-shaped semiconductor includes the first SGT or the second SGT including the electrically floating gate conductor layer, and an impurity region functioning as a source or a drain is not formed in a bottom portion or a top portion of the second island-shaped semiconductor.

One or both of the first island-shaped semiconductor including the first SGT and the third SGT that include the first impurity region, the third impurity region, the fifth impurity region, and the seventh impurity region, and the first island-shaped semiconductor including the second SGT and the fourth SGT that include the second impurity region, the fourth impurity region, the sixth impurity region, and the eighth impurity region are preferably formed, and the gate conductor layer of the first SGT and the gate conductor layer of the third SGT are preferably formed so as to be connected to each other.

According to the present invention, in producing a circuit in which a plurality of SGTs are formed in a single semiconductor pillar in the vertical direction, $N^+$ regions or $P^+$ regions that contain a donor or acceptor impurity and that constitute sources or drains of the SGTs can be formed at predetermined positions between the SGTs with a high accuracy.

BRIEF DESCRIPTION OF THE DRAWINGS

FIGS. 2A(a), 2A(b), and 2A(c) include a plan view and cross-sectional structural views of an SRAM cell illustrating a method for producing a semiconductor device having SGTs according to the first embodiment.

FIGS. 2B(a), 2B(b) and 2B(c) are a plan view and cross-sectional structural views of the SRAM cell illustrating the method for producing a semiconductor device having SGTs according to the first embodiment.

FIGS. 2C(a), 2C(b) and 2C(c) are a plan view and cross-sectional structural views of the SRAM cell illustrating the method for producing a semiconductor device having SGTs according to the first embodiment.

FIGS. 2D(a), 2D(b) and 2D(c) are a plan view and cross-sectional structural views of the SRAM cell illustrating the method for producing a semiconductor device having SGTs according to the first embodiment.

FIGS. 2E(a), 2E(b) and 2E(c) are a plan view and cross-sectional structural views of the SRAM cell illustrating the method for producing a semiconductor device having SGTs according to the first embodiment.

FIGS. 2G(a), 2G(b) and 2G(c) are a plan view and cross-sectional structural views of the SRAM cell illustrating the method for producing a semiconductor device having SGTs according to the first embodiment.

FIGS. 2H(a), 2H(b) and 2H(c) are a plan view and cross-sectional structural views of the SRAM cell illustrating the method for producing a semiconductor device having SGTs according to the first embodiment.

FIGS. 2J(a), 2J(b) and 2J(c) are a plan view and cross-sectional structural views of the SRAM cell illustrating the method for producing a semiconductor device having SGTs according to the first embodiment.

FIGS. 2K(a), 2K(b) and 2K(c) are a plan view and cross-sectional structural views of the SRAM cell illustrating the method for producing a semiconductor device having SGTs according to the first embodiment.

FIGS. 2N(a), 2N(b) and 2N(c) are a plan view and cross-sectional structural views of the SRAM cell illustrating the method for producing a semiconductor device having SGTs according to the first embodiment.

FIGS. 2O(a), 2O(b) and 2O(c) are a plan view and cross-sectional structural views of the SRAM cell illustrating the method for producing a semiconductor device having SGTs according to the first embodiment.

FIGS. 2P(a), 2P(b) and 2P(c) are a plan view and cross-sectional structural views of the SRAM cell illustrating the method for producing a semiconductor device having SGTs according to the first embodiment.

FIGS. 2Q(a), 2Q(b) and 2Q(c) are a plan view and cross-sectional structural views of the SRAM cell illustrating the method for producing a semiconductor device having SGTs according to the first embodiment.

FIGS. 2S(a), 2S(b) and 2S(c) are a plan view and cross-sectional structural views of the SRAM cell illustrating the method for producing a semiconductor device having SGTs according to the first embodiment.

FIGS. 2U(a), 2U(b) and 2U(c) are a plan view and cross-sectional structural views of the SRAM cell illustrating the method for producing a semiconductor device having SGTs according to the first embodiment.

FIGS. 2V(a), 2V(b) and 2V(c) are a plan view and cross-sectional structural views of the SRAM cell illustrating the method for producing a semiconductor device having SGTs according to the first embodiment.

FIGS. 2W(a), 2W(b) and 2W(c) are a plan view and cross-sectional structural views of the SRAM cell illustrating the method for producing a semiconductor device having SGTs according to the first embodiment.

FIGS. 3A(a), 3A(b) and 3A(c) are a plan view and cross-sectional structural views of an SRAM cell according to a second embodiment of the present invention.

FIGS. 3B(a), 3B(b) and 3B(c) are a plan view and cross-sectional structural views of the SRAM cell according to the second embodiment.

FIGS. 3C(a), 3C(b) and 3C(c) are a plan view and cross-sectional structural views of the SRAM cell according to the second embodiment.

FIGS. 3D(a), 3D(b) and 3D(c) are a plan view and cross-sectional structural views of the SRAM cell according to the second embodiment.

FIGS. 5(a), 5(b) and 5(c) are a plan view and cross-sectional structural views of an SRAM cell according to a third embodiment of the present invention.

FIGS. 6A(a), 6A(b) and 6A(c) are a plan view and cross-sectional structural views of an SRAM cell according to a fourth embodiment of the present invention.

FIGS. 6B(a), 6B(b) and 6B(c) are a plan view and cross-sectional structural views of the SRAM cell according to the fourth embodiment.

FIGS. 7A(a), 7A(b) and 7A(c) are a plan view and cross-sectional structural views of an SRAM cell according to a fifth embodiment of the present invention.

FIGS. 7B(a), 7B(b) and 7B(c) are a plan view and cross-sectional structural views of the SRAM cell according to the fifth embodiment.

FIGS. 8A(a), 8A(b) and 8A(c) are a plan view and cross-sectional structural views of an SRAM cell according to a sixth embodiment of the present invention.

FIGS. 8B(a), 8B(b) and 8B(c) are a plan view and cross-sectional structural views of the SRAM cell according to the sixth embodiment.

FIGS. 9B(a), 9B(b) and 9B(c) are a plan view and cross-sectional structural views of the SRAM cell according to the seventh embodiment.

FIGS. 9C(a), 9C(b) and 9C(c) are a plan view and cross-sectional structural views of the SRAM cell according to the seventh embodiment.

DETAILED DESCRIPTION OF THE PREFERRED EMBODIMENTS

Figure 16:
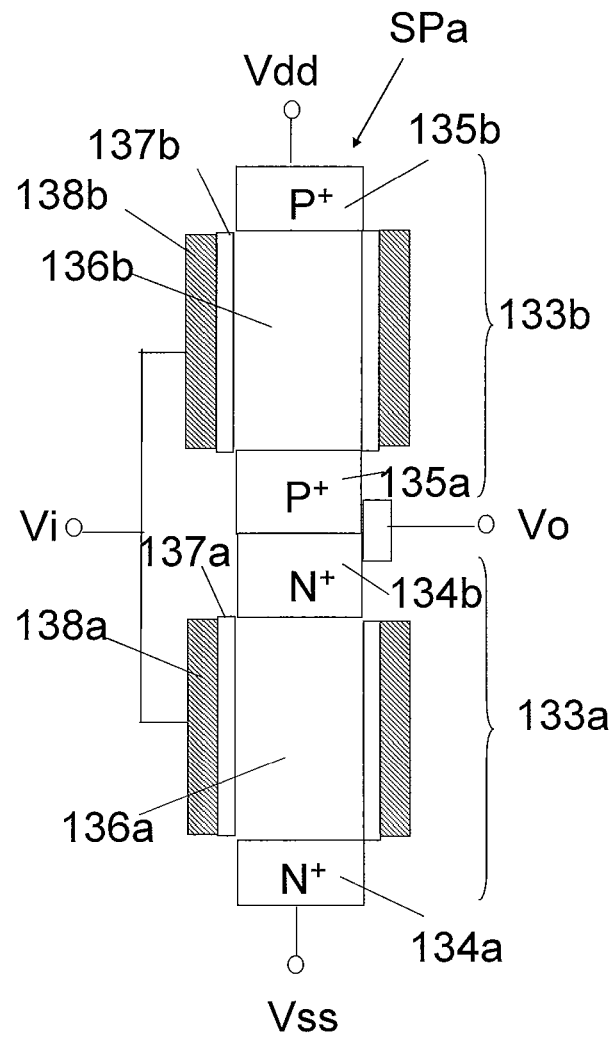
FIG. 16 is a schematic structural view showing a structure in the related art in which an N-channel SGT is formed in a lower portion of a single Si pillar and a P-channel SGT is formed in an upper portion of the Si pillar.
Figure 17A:
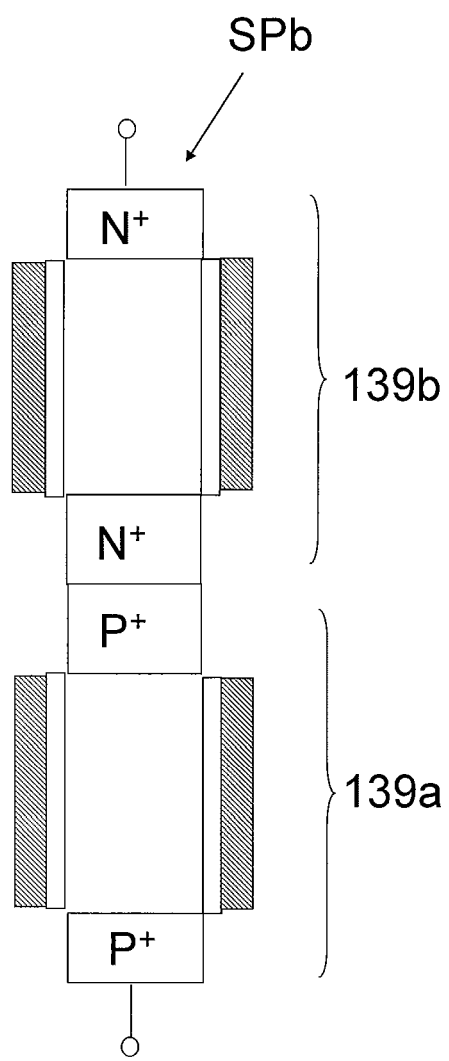
FIG. 17A is a schematic structural view showing a structure in the related art in which a P-channel SGT is formed in a lower portion of a single Si pillar and an N-channel SGT is formed in an upper portion of the Si pillar.
Figure 17B:
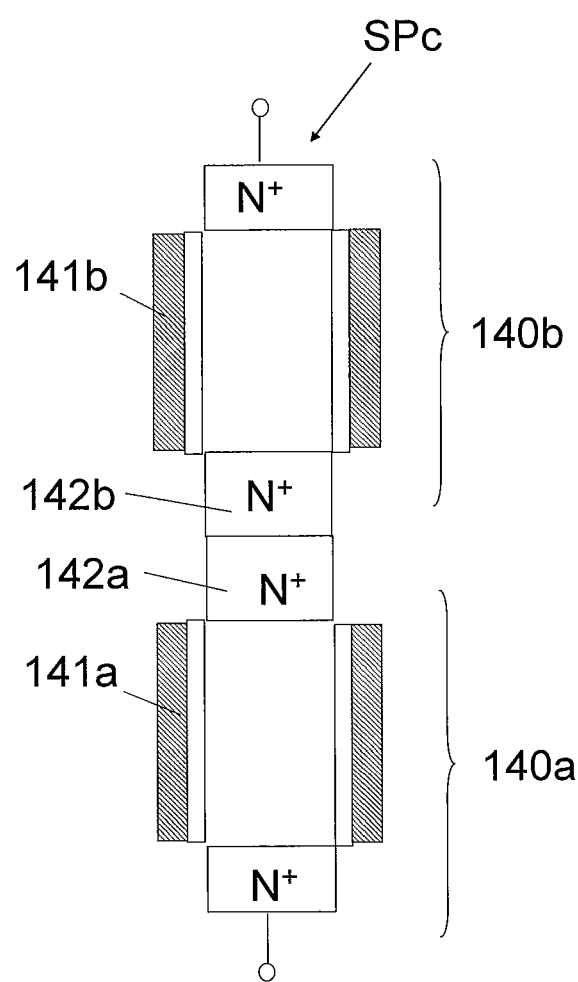
FIG. 17B is a schematic structural view showing a structure in the related art in which an N-channel SGT is formed in each of an upper portion and a lower portion of a single Si pillar.

As described with reference to FIGS. 16, 17A, and 17B, in a method for producing a semiconductor device having SGTs, a plurality of SGTs are formed in a single Si pillar so as to be stacked in the vertical direction, and a plurality of such Si pillars are formed so that a combination of an N-channel SGT and a P-channel SGT located in an upper portion and a lower portion in the vertical direction is different from adjacent combinations of an N-channel SGT and a P-channel SGT located in an upper portion and a lower portion in the vertical direction. In this method, it is difficult to form $N^+$ regions and $P^+$ regions that contain a donor or acceptor impurity at particular positions in the middle of the Si pillars with a high accuracy.

Methods for producing a semiconductor device having SGTs according to embodiments of the present invention will now be described with reference to the drawings.

First Embodiment

FIGS. 1A to 1C and FIGS. 2A(a) to 2W(c) show a method for producing a semiconductor device having SGTs according to a first embodiment of the present invention.

Figure 1A:
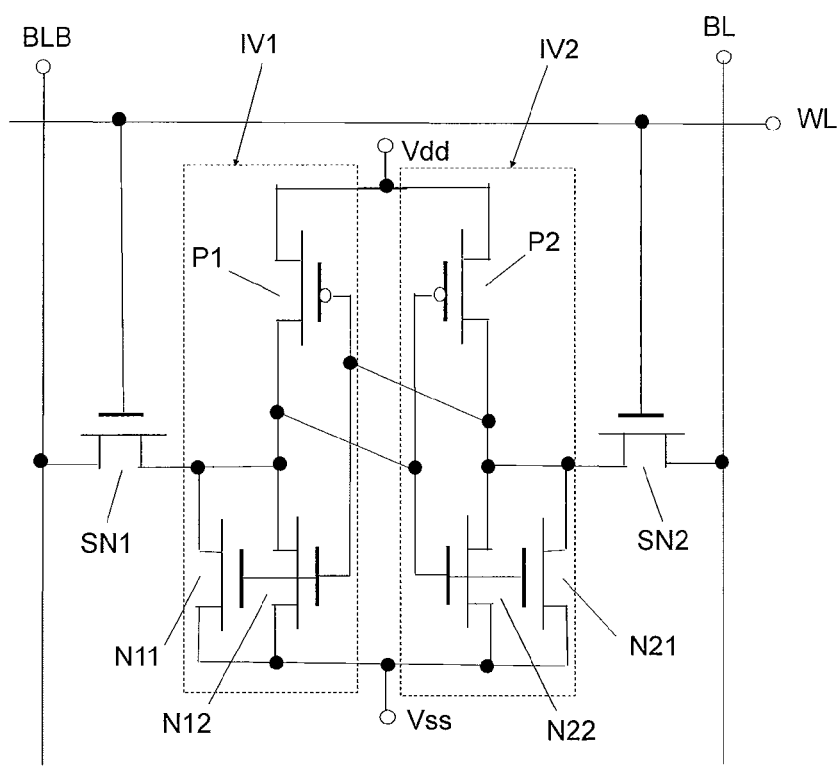
FIG. 1A is a diagram of an SRAM cell circuit according to a first embodiment of the present invention.

FIG. 1A is a circuit diagram of a static random access memory (SRAM) cell according to the present embodiment. As shown in FIG. 1A, the SRAM cell includes two inverter circuits IV1 and IV2. The inverter circuit IV1 includes a P-channel SGT_P1 serving as a load transistor and two N-channel SGTs_N11 and N12 that serve as drive transistors and that are connected to each other in parallel. The inverter circuit IV2 includes a P-channel SGT_P2 serving as a load transistor and two N-channel SGTs_N21 and N22 that serve as drive transistors and that are connected to each other in parallel. The P-channel SGT_P1 of the inverter circuit IV1 is connected to gates of the N-channel SGTs_N11 and N12. A source of the P-channel SGT_P2 of the inverter circuit IV2 is connected to sources of the N-channel SGTs_N21 and N22. Similarly, the P-channel SGT_P2 is connected to gates of the N-channel SGTs_N21 and N22. A source of the P-channel SGT_P1 of the inverter circuit IV1 is connected to sources of the N-channel SGTs_N11 and N12.

Drains of the P-channel SGTs_P1 and P2 are connected to a power supply voltage wiring Vdd. Drains of the N-channel SGTs_N11, N12, N21, and N22 are connected to a ground wiring Vss. Selection N-channel SGTs_SN1 and SN2 are provided on both sides of the inverter circuits IV1 and IV2. Gates of the selection N-channel SGTs_SN1 and SN2 are connected to a word line wiring metal layer WL. A source and a drain of the selection N-channel SGT_SN1 are respectively connected to the sources of the N-channel SGTs_N11 and N12 and the P-channel SGT_P1 and an inversion bit line wiring metal layer BLB. A source and a drain of the selection N-channel SGT_SN2 are respectively connected to the sources of the N-channel SGTs_N21 and N22 and the P-channel SGT_P2 and a bit line wiring metal layer BL. Thus, the SRAM circuit of the present embodiment is constituted by total 8 SGTs including the two P-channel SGTs_P1 and P2 and the six N-channel SGTs_N11, N12, N21, N22, SN1, and SN2.

Figure 1B:
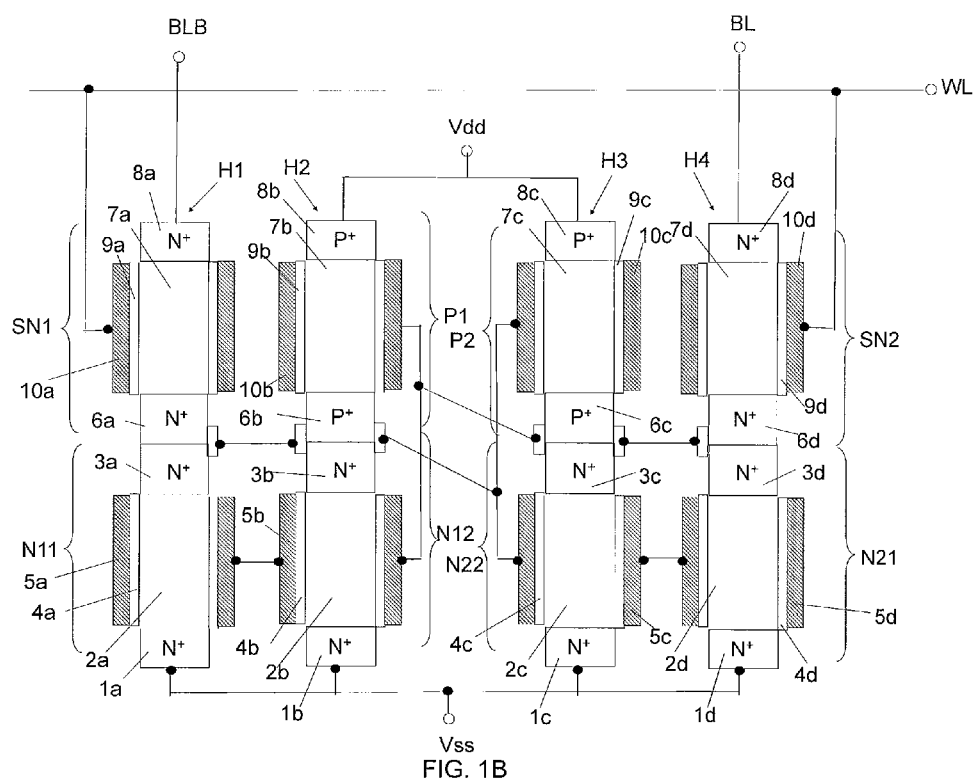
FIG. 1B is a structural schematic view of a case where the SRAM cell circuit according to the first embodiment is formed in four Si pillars.

FIG. 1B is a structural schematic view of a case where the SRAM cell circuit shown in FIG. 1A is formed in four Si pillars H1, H2, H3, and H4. As shown in FIG. 1B, a driving N-channel SGT_N11 of an inverter circuit IV1 is formed in a lower portion of the Si pillar H1, and a selection N-channel SGT_SN1 is formed in an upper portion of the Si pillar H1. A driving N-channel SGT_N12 of the inverter circuit IV1 is formed in a lower portion of the Si pillar H2, and a load P-channel SGT_P1 is formed in an upper portion of the Si pillar H2. A driving N-channel SGT_N22 of an inverter circuit IV2 is formed in a lower portion of the Si pillar H3, and a load P-channel SGT_P2 is formed in an upper portion of the Si pillar H3. A driving N-channel SGT_N21 is formed in a lower portion of the Si pillar H4, and a selection N-channel SGT_SN2 is formed in an upper portion of the Si pillar H4.

In the driving N-channel SGT_N11 formed in the lower portion of the Si pillar H1, a drain $N^+$ region 1a, a channel i-layer 2a, and a source $N^+$ region 3a are formed so as to be connected from the lower portion to the upper portion of the Si pillar H1 in that order. A gate insulating layer 4a is formed so as to surround the channel i-layer 2a. Furthermore, a gate conductor layer 5a is formed so as to surround the gate insulating layer 4a. In the selection N-channel SGT_SN1 formed in the upper portion of the Si pillar H1, a drain $N^+$ region 6a, a channel i-layer 7a, and a source $N^+$ region 8a are formed so as to be connected from the lower portion to the upper portion in that order. A gate insulating layer 9a is formed so as to surround the channel i-layer 7a. Furthermore, a gate conductor layer 10a is formed so as to surround the gate insulating layer 9a. In the driving N-channel SGT_N12 formed in the lower portion of the Si pillar H2, a drain $N^+$ region 1b, a channel i-layer 2b, and a source $N^+$ region 3b are formed so as to be connected from the lower portion to the upper portion of the Si pillar H2 in that order. A gate insulating layer 4b is formed so as to surround the channel i-layer 2b. Furthermore, a gate conductor layer 5b is formed so as to surround the gate insulating layer 4b. In the load P-channel SGT_P1 formed in the upper portion of the Si pillar H2, a source $P^+$ region 6b, a channel i-layer 7b, and a drain $P^+$ region 8b are formed so as to be connected from the lower portion to the upper portion. A gate insulating layer 9b is formed so as to surround the channel i-layer 7b. Furthermore, a gate conductor layer 10b is formed so as to surround the gate insulating layer 9b.

As shown in FIG. 1B, in the driving N-channel SGT_N22 formed in the lower portion of the Si pillar H3, a drain $N^+$ region 1c, a channel i-layer 2c, and a source $N^+$ region 3c are formed so as to be connected from the lower portion to the upper portion of the Si pillar H3 in that order. Furthermore, a gate insulating layer 4c is formed so as to surround the channel i-layer 2c. A gate conductor layer 5c is formed so as to surround the gate insulating layer 4c. In the load P-channel SGT_P2 formed in the upper portion of the Si pillar H3, a source $P^+$ region 6c, a channel i-layer 7c, and a drain $P^+$ region 8c are formed so as to be connected from the lower portion to the upper portion in that order. A gate insulating layer 9c is formed so as to surround the channel i-layer 7c. Furthermore, a gate conductor layer 10c is formed so as to surround the gate insulating layer 9c. In the driving N-channel SGT_N21 formed in the lower portion of the Si pillar H4, a drain $N^+$ region 1d, a channel i-layer 2d, and a source $N^+$ region 3d are formed so as to be connected from the lower portion to the upper portion of the Si pillar H4. A gate insulating layer 4d is formed so as to surround the channel i-layer 2d. Furthermore, a gate conductor layer 5d is formed so as to surround the gate insulating layer 4d. In the selection N-channel SGT_SN2 formed in the upper portion of the Si pillar H4, a source $N^+$ region 6d, a channel i-layer 7d, and a drain $N^+$ region 8d are formed so as to be connected from the lower portion to the upper portion in that order. Furthermore, a gate insulating layer 9d is formed so as to surround the channel i-layer 7d. A gate conductor layer 10d is formed so as to surround the gate insulating layer 9d.

The gate conductor layer 10b of the load P-channel SGT_P1 of the inverter circuit IV1 is connected to the gate conductor layer 5a of the N-channel SGT_N11, and the gate conductor layer 5b of the N-channel SGT_N12. The gate conductor layers 10b, 5a, and 5b are connected to the source $P^+$ region 6c of the load P-channel SGT_P2 and the source $N^+$ regions 3d and 3c of the driving N-channel SGTs_N21 and N22. Similarly, the gate conductor layer 10c of the load P-channel SGT_P2 is connected to the gate conductor layer 5d of the driving N-channel SGT_N21 and the gate conductor layer 5c of the driving N-channel SGT N22. The gate conductor layers 10c, 5d, and 5c are connected to the source $P^+$ region 6b of the load P-channel SGT_P1 and the source $N^+$ regions 3a and 3b of the driving N-channel SGTs_N11 and N12.

The drain $P^+$ regions 8b and 8c of the load P-channel SGTs_P1 and P2 are connected to a power supply voltage wiring Vdd. Furthermore, the drain $N^+$ regions 1a, 1b, 1d, and 1c of the driving N-channel SGTs_N11, N12, N21, and N22 are connected to a ground wiring Vss. The gate conductor layers 10a and 10d of the selection N-channel SGTs_SN1 and SN2 are connected to a word line wiring metal layer WL. The $N^+$ region 6a of the selection N-channel SGT_SN1 is connected to the source $N^+$ regions 3a and 3b of the N-channel SGTs_N11 and N12 and the source $P^+$ region 6b of the load P-channel SGT_P1. The $N^+$ region 6d of the selection N-channel SGT_SN2 is connected to the source $N^+$ regions 3d and 3c of the driving N-channel SGTs_N21 and N22, and the source $P^+$ region 6c of the load P-channel SGT_P2. Furthermore, the $N^+$ region 8a of the selection N-channel SGT_SN1 is connected to an inversion bit line wiring metal layer BLB. The $N^+$ region 8d of the selection N-channel SGT_SN2 is connected to a bit line wiring metal layer BL. In the present embodiment, eight SGTs that constitute the SRAM cell are formed in the four Si pillars H1, H2, H3, and H4 as described above.

Figure 1C:
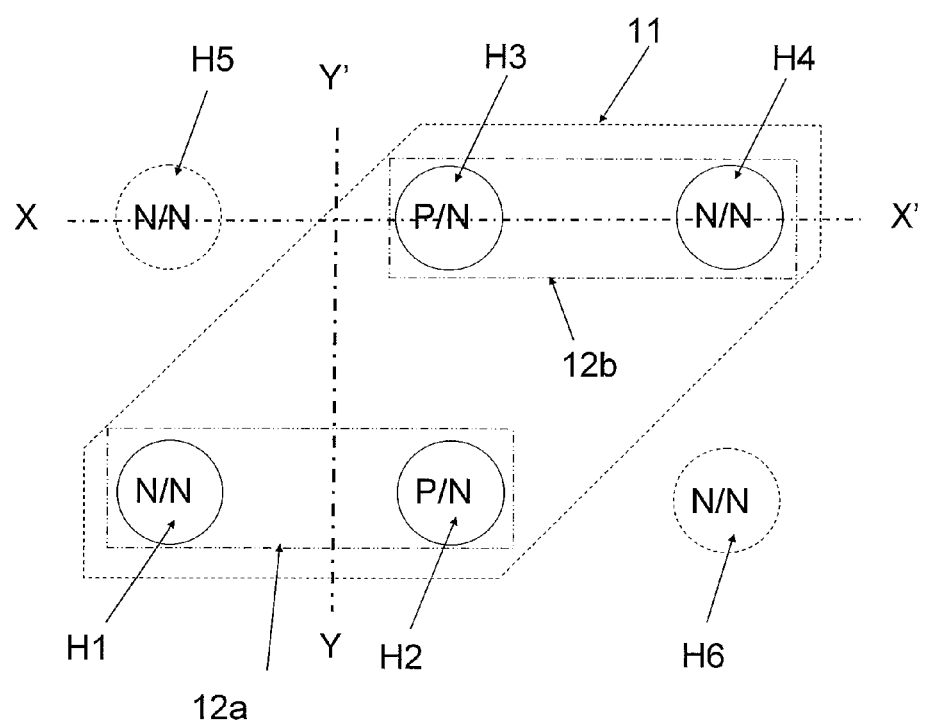
FIG. 1C is a plan view showing an arrangement of the Si pillars of the SRAM cell circuit according to the first embodiment.

FIG. 1C is a plan view of an arrangement of the Si pillars H1, H2, H3, and H4 shown in the structural schematic view of the SRAM cell circuit shown in FIG. 1B. As shown in FIG. 1C, a single SRAM cell is formed in a broken line area 11 including Si pillars H1, H2, H3, and H4. An inverter circuit IV1 and a selection N-channel SGT_SN1 are formed in a two-dot chain line area 12a including the Si pillars H1 and H2. An inverter circuit IV2 and a selection N-channel SGT_SN2 are formed in a two-dot chain line area 12b including the Si pillars H3 and H4. Si pillars H5 and H6 are Si pillars each including a driving N-channel SGT and a selection N-channel SGT of an SRAM cell adjacent in the vertical direction. The Si pillars H1, H2, and H6 are arranged on a straight line in the horizontal direction. Similarly, the Si pillars H5, H3, and H4 are arranged on a straight line in the horizontal direction. Furthermore, the Si pillars H1 and H5 are arranged on a straight line in the vertical direction. The Si pillars H2 and H3 are arranged on a straight line in the vertical direction. The Si pillars H6 and H4 are arranged on a straight line in the vertical direction. In this SRAM device, the SRAM cell in the broken line area 11 is two-dimensionally arranged on a substrate.

To illustrate a first production step of a method for producing an SRAM cell circuit, FIGS. 2A(a), 2A(b) and 2A(c) show a plan view and cross-sectional structural views of an area where the Si pillars H1 to H6 shown in FIG. 1C are arranged. FIG. 2A(a) is a plan view, FIG. 2A(b) is a cross-sectional structural view taken along line X-X' (corresponding to line X-X' in FIG. 1C), and FIG. 2A(c) is a cross-sectional structural view taken along line Y-Y' (corresponding to line Y-Y' in FIG. 1C). In respective drawings used in the description below, the relationships between (a), (b), and (c) are the same as those in FIGS. 2A(a), 2A(b) and 2A(c).

A method for producing the SRAM cell circuit shown in FIGS. 1A, 1B, and 1C will now be described with reference to FIGS. 2A(a) to 2W(c). First, as shown in FIGS. 2A(a), 2A(b) and 2A(c), a SiO₂ layer 14 is formed on an i-layer substrate 13 by, for example, a thermal oxidation method. Arsenic ions ($As^+$) are introduced from above the SiO₂ layer 14 by ion implantation to form an $N^+$ region 15 in a surface layer portion of the i-layer substrate 13.

Subsequently, as shown in FIGS. 2B(a), 2B(b) and 2B(c), a resist layer 20 and the SiO₂ layer 14 are removed, and an i-layer 16 is formed on the $N^+$ region 15 by, for example, a low-temperature epitaxial growth process. A SiO₂ layer 17 is further formed on the i-layer 16 by, for example, a CVD method. Subsequently, resist layers 18a and 18b are formed on the SiO₂ layer 17 so as to cover regions where the Si pillars H5, H1, H4, and H6 are formed. Furthermore, boron ions ($B^+$), which are acceptor impurity ions, are introduced from the upper surface of the i-layer substrate 13 by ion implantation. Thus, a $P^+$ region 19 is formed in a portion of the i-layer 16, the portion not being covered with the resist layers 18a and 18b.

Subsequently, as shown in FIGS. 2C(a), 2C(b) and 2C(c), the resist layers 18a and 18b are removed, and a resist layer 20 is formed on the SiO₂ layer 17 so as to cover a region where the Si pillars H2 and H3 are present. Arsenic ions ($As^+$), which are donor impurity ions, are introduced from the upper surface of the i-layer substrate 13 by ion implantation. Thus, $N^+$ regions 21a and 21b are formed in the i-layer 16.

Subsequently, as shown in FIGS. 2D(a), 2D(b) and 2D(c), the SiO₂ layer 17 is removed, and an i-layer 22 is formed by, for example, a low-temperature Si epitaxial growth process, on the $N^+$ regions 21a and 21b and the $P^+$ region 19, which are exposed by removing the SiO₂ layer 17.

Subsequently, as shown in FIGS. 2E(a), 2E(b) and 2E(c), the i-layer 22, the $N^+$ regions 21a and 21b, the $P^+$ region 19, the $N^+$ region 15, and the i-layer substrate 13 are etched by, for example, a reactive ion etching (RIE) method using SiO₂ layers 23a, 23b, and 23c as an etching mask to form Si pillars H1 to H6. Consequently, in the Si pillar H5, an i-layer 24a, an $N^+$ region 25a, an $N^+$ region 26a, an i-layer 27a, and the SiO₂ layer 23a are formed on and above an i-layer substrate 13a. In the Si pillar H3, an i-layer 24b, an $N^+$ region 25b, a $P^+$ region 26b, an i-layer 27b, and the SiO₂ layer 23b are formed on and above the i-layer substrate 13a. In the Si pillar H4, an i-layer 24c, an $N^+$ region 25c, an $N^+$ region 26c, an i-layer 27c, and the SiO₂ layer 23c are formed on and above the i-layer substrate 13a. Regarding the Si pillars H1, H2, and H6, similar structures are formed.

Figure 2F:
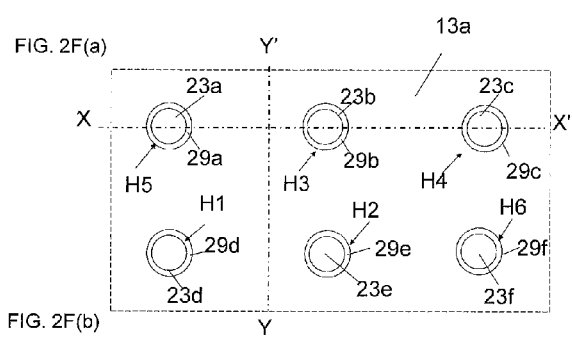
FIGS. 2F(a), 2F(b) and 2F(c) are a plan view and cross-sectional structural views of the SRAM cell illustrating the method for producing a semiconductor device having SGTs according to the first embodiment.
Figure 2F:
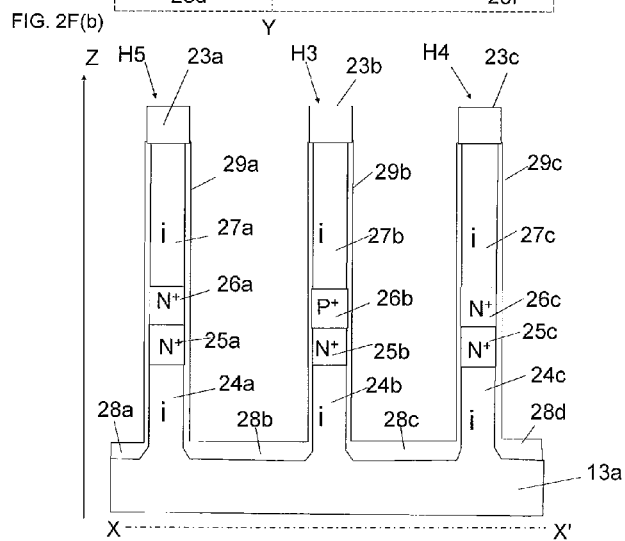
Figure 2F:
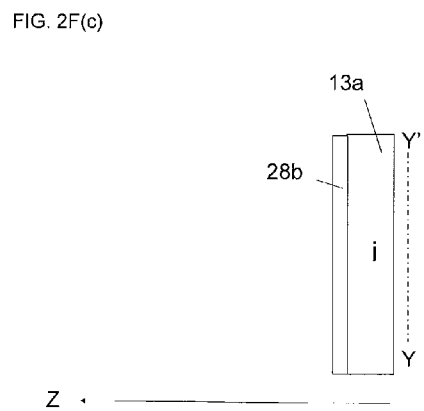

Subsequently, as shown in FIGS. 2F(a), 2F(b) and 2F(c), a SiO₂ layer is deposited on the i-layer substrate 13a and the Si pillars H1 to H6 by a CVD method. The whole SiO₂ layer is then etched by an isotropic plasma etching method, whereby the SiO₂ layer on the side faces of the Si pillars H1 to H6 is removed and SiO₂ layers 28a, 28b, 28c, and 28d are left on the i-layer substrate 13a. This step utilizes a phenomenon that when the SiO₂ layers 28a, 28b, 28c, and 28d are deposited by a CVD method, the SiO₂ layers are deposited on the side faces of the Si pillars H1 to H6 so as to have a small thickness and deposited on the i-layer substrate 13a so as to have a large thickness. Furthermore, SiO₂ layers 29a, 29b, 29c, 29d, 29e, and 29f are formed on outer peripheral portions of the Si pillars H1 to H6 by a thermal oxidation method.

Subsequently, as shown in FIGS. 2G(a), 2G(b) and 2G(c), arsenic ions ($As^+$), which are donor impurity ions, are introduced from the vertical direction into the upper surface of the i-layer substrate 13a by ion implantation. Thus, $N^+$ regions 30a, 30b, 30c, and 30d are formed in a surface layer portion of the i-layer substrate 13a between the Si pillars H1 to H6. These $N^+$ regions 30a, 30b, 30c, and 30d are connected to each other in the surface layer portion of the i-layer substrate 13a located outside the Si pillars H1 to H6.

Subsequently, as shown in FIGS. 2H(a), 2H(b) and 2H(c), after the SiO$_2$ layers 29a, 29b, 29c, 29d, 29e, and 29f on the outer peripheral portions of the Si pillars H1 to H6 are removed, gate SiO$_2$ layers 34a, 34b, and 34c are newly formed on the outer peripheral portions of the Si pillars H1 to H6 by a thermal oxidation method. Subsequently, a titanium nitride (TiN) layer 32 serving as a gate metal layer is formed over the entire surface by, for example, an atomic layer deposition (ALD) method, and a SiO$_2$ layer 35 is formed thereon by a CVD method.

Figure 2I:
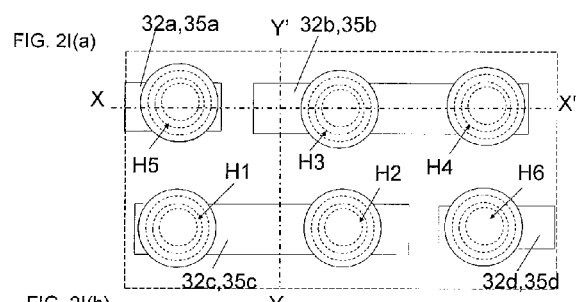
FIGS. 2I(a), 2I(b) and 2I(c) are a plan view and cross-sectional structural views of the SRAM cell illustrating the method for producing a semiconductor device having SGTs according to the first embodiment.
Figure 2I:
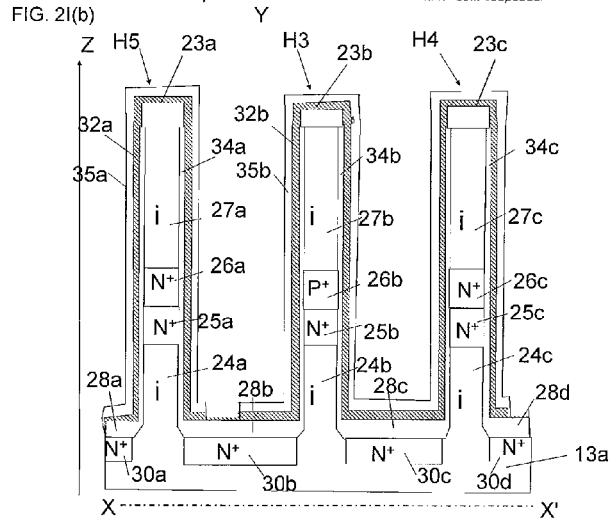
Figure 2I:
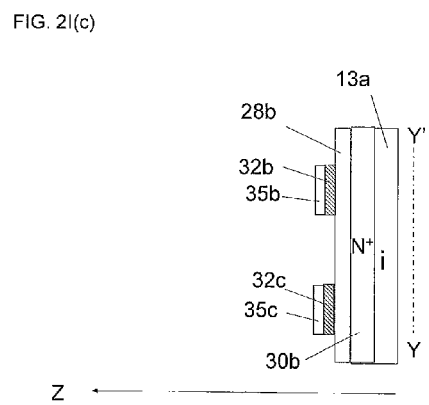

Subsequently, as shown in FIGS. 2I(a), 2I(b) and 2I(c), a TiN layer 32b and a SiO$_2$ layer 35b, each of which covers and extends over the Si pillars H3 and H4, are formed by using a lithography method and an RIE etching method. In addition, a TiN layer 32a and a SiO$_2$ layer 35a are formed at the same time so as to cover the Si pillar H5. Similarly, TiN layers 32c and 32d and SiO$_2$ layers 35c and 35d are formed on the Si pillars H1, H2, and H6 on the plane of (a).

Subsequently, as shown in FIGS. 2J(a), 2J(b) and 2J(c), for example, a silicon nitride (SiN) layer 36 is formed on the i-layer substrate 13a so as to be located on a lower portion of the Si pillars H1 to H6. In this step, the SiN layer 36 is formed so that the surface of the SiN layer 36 is located within a height range in the vertical direction in which the N$^+$ regions 25a, 25b, and 25c of the Si pillars H1 to H6 are formed.

Subsequently, as shown in FIGS. 2K(a), 2K(b) and 2K(c), a resist layer 37 is formed on the SiN layer 36. Heat treatment is then performed, for example, at about 200° C. to planarize the resist layer 37. In this step, the resist layer 37 is formed so that the surface of the resist layer 37 is located within a height range in the vertical direction in which the N$^+$ regions 26a and 26c and the P$^+$ region 26b are formed. Hydrofluoric acid (HF) gas is then supplied to the entire surface. This HF gas is diffused in the resist layer 37 and reacts with water in the resist layer 37 to produce liquid HF. This liquid HF etches the SiO$_2$ layers 35a and 35b that are in contact with the resist layer 37. The resist layer 37 is then removed (regarding the mechanism of the etching, refer to Tadashi Shibata, Susumu Kohyama, and Hisakazu Iizuka: "A New Field Isolation Technology for High Density MOS LSI", Japanese Journal of Applied Physics, Vol. 18, pp. 263-267 (1979)).

Figure 2L:
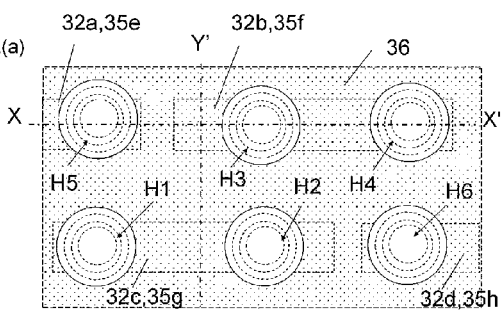
FIGS. 2L(a), 2L(b) and 2L(c) are a plan view and cross-sectional structural views of the SRAM cell illustrating the method for producing a semiconductor device having SGTs according to the first embodiment.
Figure 2L:
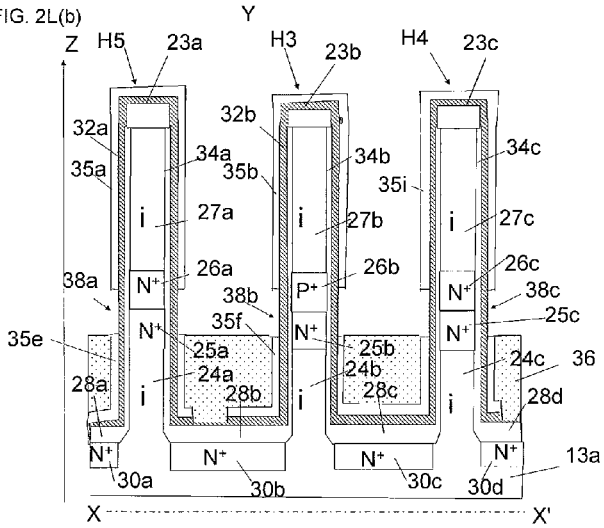
Figure 2L:
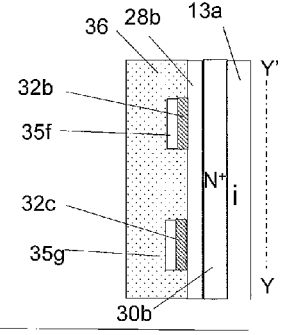

Subsequently, as shown in FIGS. 2L(a), 2L(b) and 2L(c), the SiO$_2$ layers 35a and 35b that are in contact with the resist layer 37 are etched, and exposed regions 38a, 38b, and 38c of the TiN layers 32a and 32b appear to outer peripheral portions of the Si pillars H5, H3, and H4, respectively. At the same time, the TiN layers 32c and 32d located at positions that are in contact with the resist layer 37 are similarly exposed to outer peripheral portions of the Si pillars H1, H2, and H6. Consequently, in the Si pillar H5, a lower portion of the SiO$_2$ layer 35a is separated to form a SiO$_2$ layer 35e. In the Si pillar H3, a lower portion of the SiO$_2$ layer 35b is separated to form a SiO$_2$ layer 35f. In the Si pillar H4, an upper portion of the SiO$_2$ layer 35b is separated to form a SiO$_2$ layer 35i. Similarly, a SiO$_2$ layer 35g is formed in lower portions of the Si pillars H1 and H2, and a SiO$_2$ layer 35h is formed in a lower portion of the Si pillar H6.

Figure 2M:
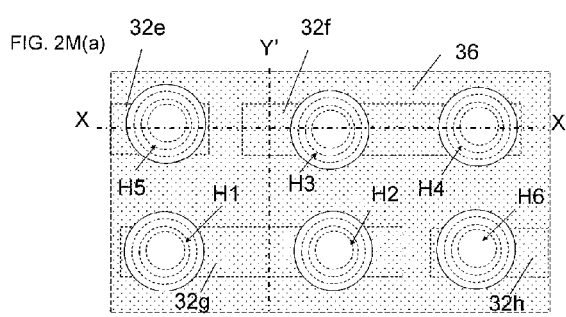
FIGS. 2M(a), 2M(b) and 2M(c) are a plan view and cross-sectional structural views of the SRAM cell illustrating the method for producing a semiconductor device having SGTs according to the first embodiment.
Figure 2M:
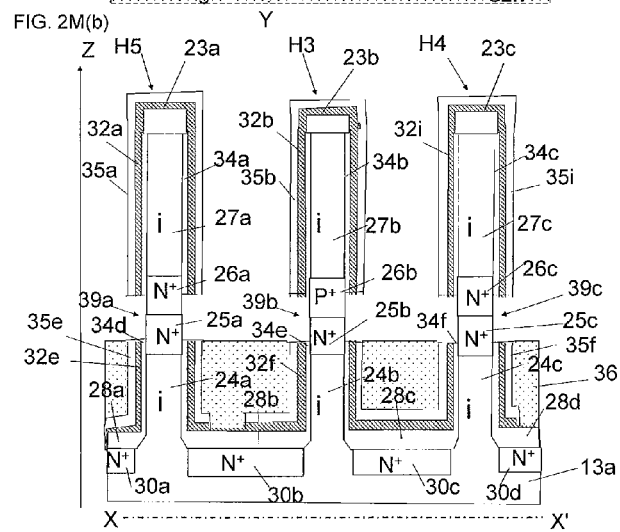
Figure 2M:
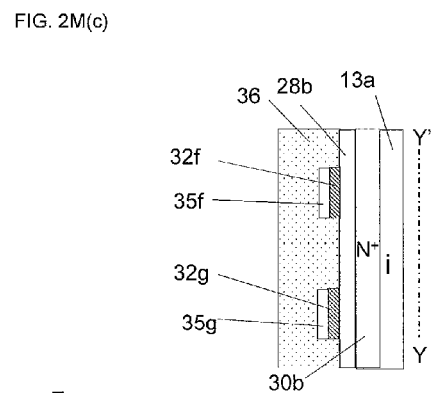
Figure 20A:
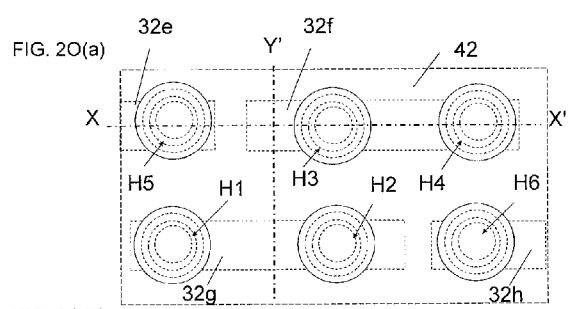
Figure 20B:
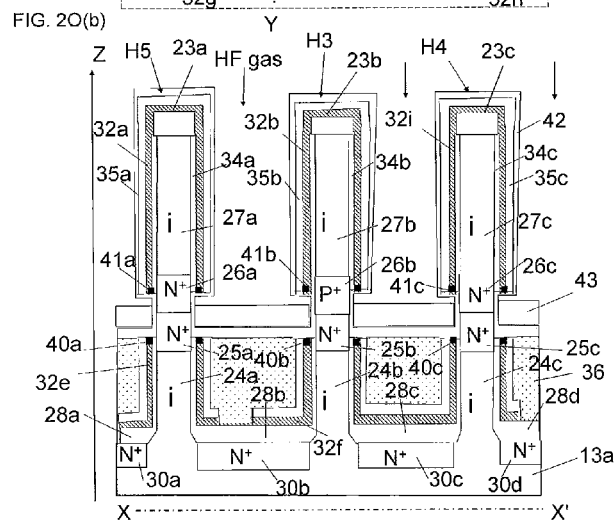
Figure 20C:
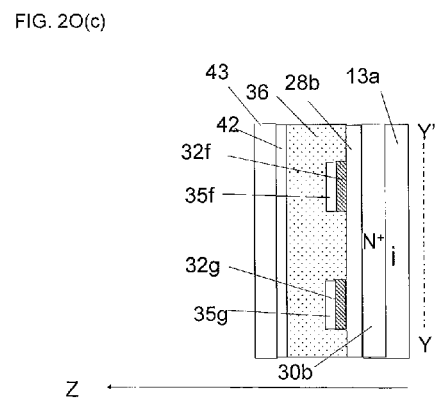

Subsequently, as shown in FIGS. 2M(a), 2M(b) and 2M(c), the TiN layers 32a, 32b, 32c, and 32d are etched using the SiO$_2$ layers 35a, 35b, 35i, 35e, and 35f as an etching mask. By this etching, in the Si pillar H5, a lower portion of the TiN layer 32a is separated to form a TiN layer 32e. In the Si pillar H3, a lower portion of the TiN layer 32b is separated to form a TiN layer 32f. Furthermore, in the Si pillar H4, an upper portion of the TiN layer 32b is separated to form a TiN layer 32i. Similarly, a TiN layer 32g is formed on a lower portion of the Si pillars H1 and H2, and a TiN layer 32h is formed on a lower portion of the Si pillars H6. As shown in (a), a state where the TiN layers 32e, 32f, 32g, and 32h are arranged on the Si pillars H1 to H6 is obtained through the above process, when viewed from the upper surface. Furthermore, as shown in (b), the gate SiO$_2$ layers 34a, 34b, and 34c are etched using the TiN layers 32a, 32b, 32i, 32e, and 32f as an etching mask. In the present embodiment, the SiO$_2$ layers 35a and 35b are formed so as to have a larger thickness than the gate SiO$_2$ layers 34a, 34b, and 34c. Thus, the SiO$_2$ layers 35a, 35b, and 35i are left after the etching of the gate SiO$_2$ layers 34a, 34b, and 34c. The gate SiO$_2$ layers 34a, 34b, and 34c are separated into an upper portion and a lower portion of the Si pillars H5, H3, and H4, respectively. The lower portions of the gate SiO$_2$ layers 34a, 34b, and 34c constitute gate SiO$_2$ layers 34d, 34e, and 34f, respectively.

Figure 2N:
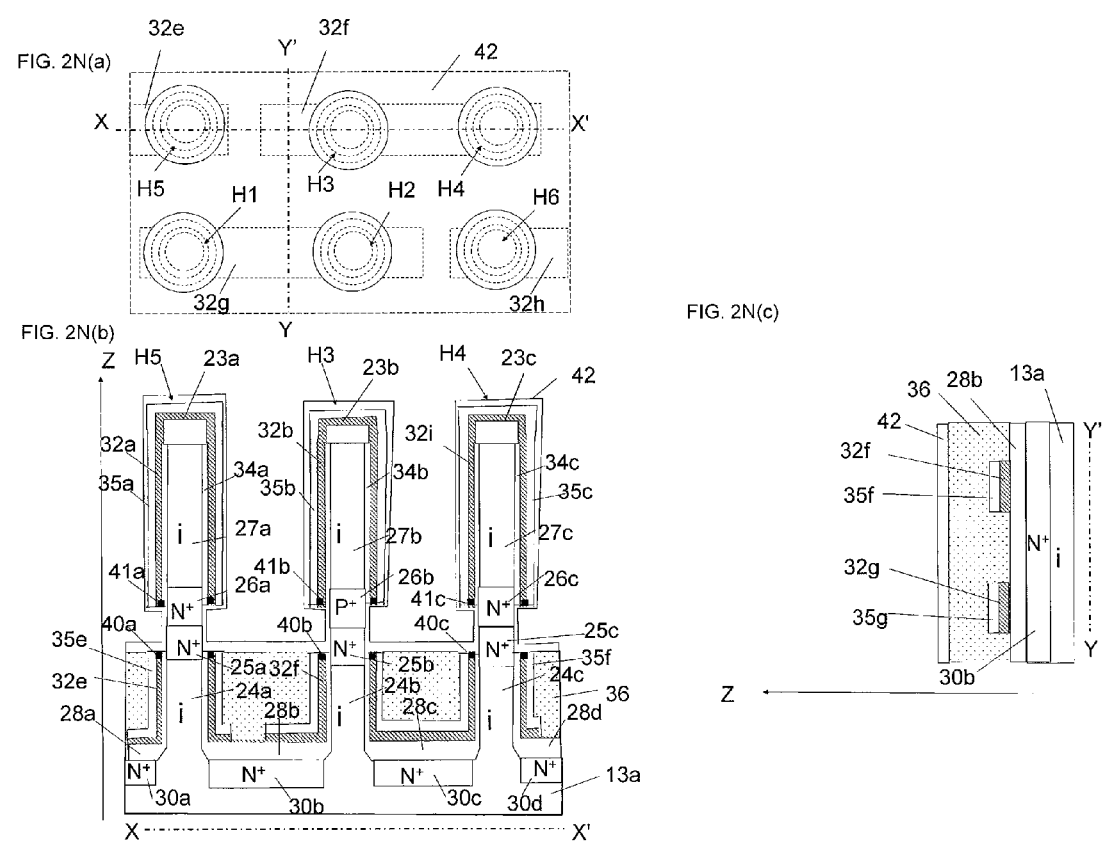

Subsequently, as shown in FIG. 2N(b), exposed portions of the TiN layers 32a, 32b, 32i, 32e, and 32f are oxidized to form titanium oxide (TiO) layers 41a, 41b, 41c, 40a, 40b, and 40c. Furthermore, a SiO$_2$ layer 42 is then formed over the entire surface by a CVD method. In this step, the SiO$_2$ layer 42 is deposited so as to have a small thickness on side faces of the Si pillars H1 to H6 and a large thickness on top portions of the Si pillars H1 to H6 and on the surface of the SiN layer 36.

Subsequently, as shown in FIGS. 2O(a), 2O(b) and 2O(c), a resist layer 43 is formed by using the same method as that used in the formation of the resist layer 37 described above. The resist layer 43 is formed so that the position of the upper surface of the resist layer 43 is located within a height range in the vertical direction in which the N$^+$ regions 26a and 26c and the P$^+$ region 26b of the Si pillars H5, H4, and H3 are formed. Hydrofluoric acid (HF) gas is then supplied from the upper surface of the Si pillars H1 to H6. Thus, as in FIGS. 2K(a), 2K(b) and 2K(c), the HF gas is diffused in the resist layer 43 and reacts with water in the resist layer 43 to produce liquid HF. This liquid HF etches the SiO$_2$ layer 42 that is in contact with the resist layer 43.

Subsequently, as shown in FIGS. 2P(a), 2P(b) and 2P(c), when the resist layer 43 is removed, the SiO$_2$ layer 42 located at positions that are in contact with the resist layer 43 is etched. Thus, exposed regions 44a, 44b, and 44c on side faces of the N$^+$ regions 25a, 25b, 25c, 26a, and 26c and the P$^+$ region 26b of the Si pillars H5, H3, and H4 are obtained. In the present embodiment, a SiO$_2$ layer 42d which is a part of the SiO$_2$ layer 42 and deposited on the SiN layer 36 is in contact with the resist layer 43. However, since the thickness of the SiO$_2$ layer 42d is larger than that of SiO$_2$ layers 42a, 42b, and 42c on the side faces of the Si pillars H1 to H6, the SiO$_2$ layer 42d is left on the SiN layer 36.

Subsequently, as shown in FIGS. 2Q(a), 2Q(b) and 2Q(c), conductor layers 45a, 45b, 45c, and 45d formed by siliciding a poly-Si layer are formed so as to be connected to the N$^+$ regions 25a, 25b, 25c, 26a, and 26c and the P$^+$ region 26b. The conductor layer 45b is formed by connecting the N$^+$ region 25b and the P$^+$ region 26b of the Si pillar H3 and the N$^+$ regions 25c and 26c of the Si pillar H4. The N$^+$ regions 25a and 26a of the Si pillar H5 of an adjacent SRAM cell are connected to the conductor layer 45a. The conductor layer 45c is connected in the Si pillars H1 and H2. The conductor layer 45d is connected in the Si pillar H6 of an adjacent SRAM cell.

Figure 2R:
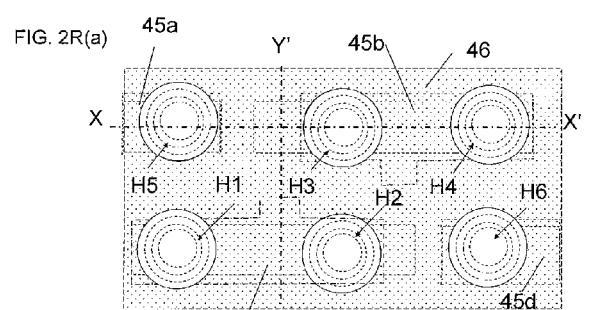
FIGS. 2R(a), 2R(b) and 2R(c) are a plan view and cross-sectional structural views of the SRAM cell illustrating the method for producing a semiconductor device having SGTs according to the first embodiment.
Figure 2R:
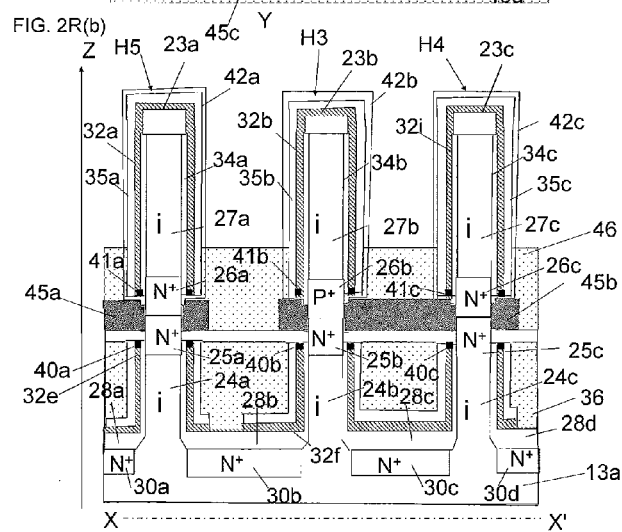
Figure 2R:
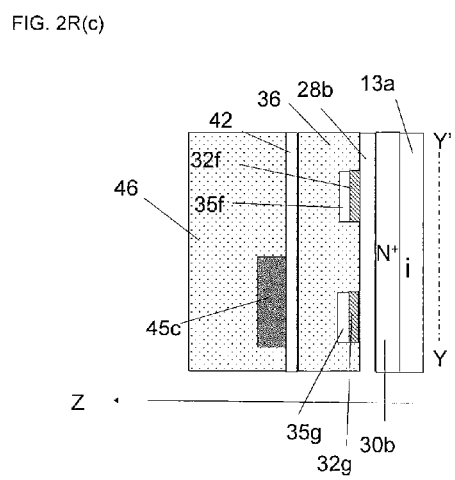

Subsequently, as shown in FIGS. 2R(a), 2R(b) and 2R(c), for example, a SiN layer 46 is formed so that a surface position thereof is located near central portions of the upper i-layers 27a, 27b, and 27c of the Si pillars H1 to H6.

Subsequently, as shown in FIGS. 2S(a), 2S(b) and 2S(c), a resist layer is formed by the same method as that described with reference to FIGS. 2K(a), 2K(b), 2K(c), 2O(a), 2O(b)

and 2O(c). Hydrofluoric acid (HF) gas is then supplied from the upper surface of the resist layer to etch the $SiO_2$ layers 35a, 35b, 35c, 42a, 42b, and 42c on the side faces of the Si pillars H5, H3, and H4. Furthermore, conductor layers 47a, 47b, 47c, and 47d are formed by the method described with reference to FIGS. 2Q(a), 2Q(b) and 2Q(c). The conductor layer 47a is connected to the upper TiN layer 32a of the Si pillar H5. The conductor layer 47b is connected to the upper TiN layer 32b of the Si pillar H3. The conductor layer 47d is connected to the upper TiN layer 32i of the Si pillar H4. Furthermore, as shown in FIGS. 2S(a), 2S(b) and 2S(c), the conductor layer 47a is formed so as to connect the Si pillar H5 to the Si pillar H1, and the conductor layer 47d is formed so as to connect the Si pillar H4 to the Si pillar H6.

Figure 2T:
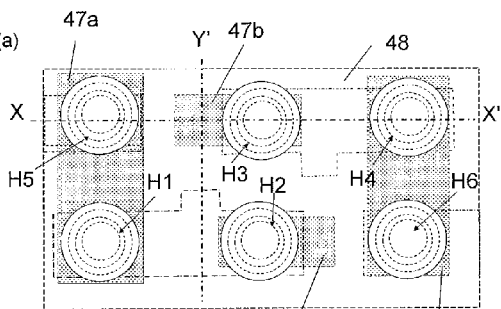
FIGS. 2T(a), 2T(b) and 2T(c) are a plan view and cross-sectional structural views of the SRAM cell illustrating the method for producing a semiconductor device having SGTs according to the first embodiment.
Figure 2T:
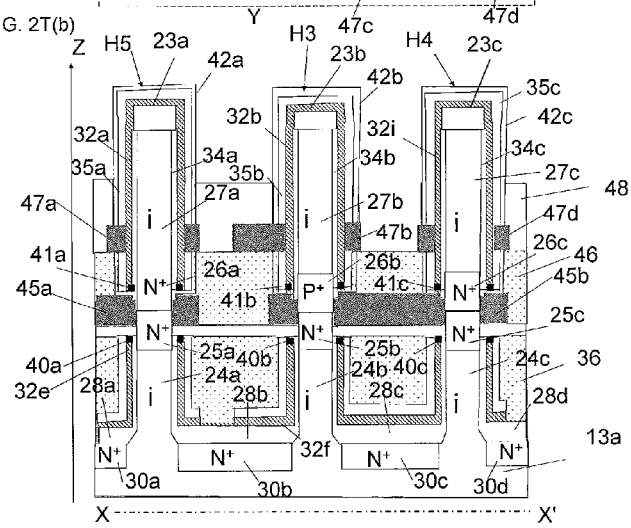
Figure 2T:
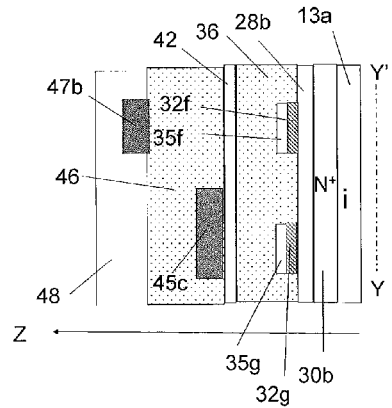

Subsequently, as shown in FIGS. 2T(a), 2T(b) and 2T(c), a resist layer 48 is formed such that a surface position thereof is lower than the top portions of the Si pillars H1 to H6.

Subsequently, as shown in FIGS. 2U(a), 2U(b), and 2U(c), the $SiO_2$ layers 42a, 42b, 42c, 35a, 35b, and 35c, the TiN layers 32a, 32b, and 32i, and the gate $SiO_2$ layers 34a, 34b, and 34c are etched using the resist layer 48 as an etching mask. The resist layer 48 is then removed. Subsequently, $N^+$ regions 49d, 49c, 49a, and 49f are respectively formed in top portions of the Si pillars H1, H4, H5, and H6, and $P^+$ regions 49b and 49e are respectively formed in top portions of the Si pillars H3 and H2 by an ion implantation method using, as an ion implantation stopper layer, the $SiO_2$ layers 42a, 42b, 42c, 35a, 35b, and 35c, the TiN layers 32a, 32b, and 32i, and the gate $SiO_2$ layers 34a, 34b, and 34c.

Subsequently, as shown in FIGS. 2V(a), 2V(b) and 2V(c), a $SiO_2$ layer 50 is formed over the entire surface by a CVD method. A contact hole 51a is formed on the $N^+$ region 49a disposed in the top portion of the Si pillar H5. A contact hole 51b is formed on the lower TiN layer 32f (above which the conductor layer 47b is formed) connected to an outer peripheral portion of the Si pillar H3. Subsequently, a contact hole 51c is formed on the $P^+$ region 49b disposed in the top portion of the Si pillar H3. A contact hole 51d is formed on the conductor layer 45b. A contact hole 51e is formed on the $N^+$ region 49c disposed in the top portion of the Si pillar H4. Subsequently, a contact hole 51f is formed on the $N^+$ region 49d disposed in the top portion of the Si pillar H1. A contact hole 51g is formed on the conductor layer 45c. A contact hole 51h is formed on the $P^+$ region 49e disposed in the top portion of the Si pillar H2. Subsequently, a contact hole 51i is formed on the lower TiN layer 32g (above which the conductor layer 47c is formed). A contact hole 51j is formed on the $N^+$ region 49f disposed in the top portion of the Si pillar H6.

Subsequently, a bit line wiring metal layer BLa that is connected to the $N^+$ region 49a disposed in the top portion of the Si pillar H5 through the contact hole 51a is formed. An inversion bit line wiring metal layer BLBa that is connected to the $N^+$ region 49d disposed in the top portion of the Si pillar H1 through the contact hole 51f is formed. Subsequently, a metal wiring layer 52a that connects the lower TiN layer 32f of the Si pillar H3, the conductor layer 47b, and the conductor layer 45c through the contact holes 51b and 51g is formed. A power supply line metal wiring layer Vdd that connects the $P^+$ region 49b disposed in the top portions of the Si pillar H3 to the $P^+$ region 49e disposed in the top portion of the Si pillar H2 through the contact holes 51c and 51h is formed. A metal wiring layer 52b that connects the lower TiN layer 32g of the Si pillar H2, the conductor layer 47c, and the conductor layer 45b through the contact holes 51d and 51i is formed. Subsequently, a bit line wiring metal layer BLb that is connected to the $N^+$ region 49c disposed in the top portion of the Si pillar H4 through the contact hole 51e is formed. An inversion bit line wiring metal layer BLBb that is connected to the $N^+$ region 49f disposed in the top portion of the Si pillar H6 through the contact hole 51j is formed.

Subsequently, as shown in FIGS. 2W(a), 2W(b) and 2W(c), a $SiO_2$ layer 53 is formed by a CVD method. Contact holes 54a and 54b are formed on the conductor layers 47a and 47d, respectively. A word line wiring metal layer WL that connects the conductor layer 47a to the conductor layer 47d through the contact holes 54a and 54b is formed.

As shown in FIG. 2W(b), when a thickness of each of the $N^+$ region 26a, the $P^+$ region 26b, and the $N^+$ region 26c that are respectively formed under the channel i-layers 27a, 27b, and 27c is represented by Lb, a thickness of each of the $N^+$ region 49a, the $P^+$ region 49b, and the $N^+$ region 49c that are respectively formed on the channel i-layers 27a, 27b, and 27c is represented by Lt, and a diameter of a horizontal cross section of each of the Si pillars H5, H3, and H4 is represented by Dp, each of Lb and Lt is preferably larger than Dp. This is because it is difficult to reduce the size in the horizontal direction of SGTs by using a lithographic technique or other processing techniques, but the processing of SGTs in the vertical direction can be performed more easily than the processing in the horizontal direction. This structure can also apply to the SGTs formed in the Si pillars H1, H2, and H6.

For the purpose of increasing the degree of integration of a circuit, it is assumed that the diameter Dp is decreased by ΔDp so that the size of each of the SGTs formed in upper portions of the Si pillars H5, H3, and H4 is reduced. In this case, in order to maintain the number of donor or acceptor impurity atoms contained in the lower impurity regions 26a, 26b, and 26c, the thickness Lb is increased by ΔLb so as to satisfy the following formula.

$$\pi(Dp/2)^2 Lb = \pi((Dp-\Delta Dp)/2)^2 (Lb+\Delta Lb) \quad (1)$$

This formula can be rewritten as follows.

$$(Lb+\Delta Lb)/Lb = ((Dp-\Delta Dp)/Dp)^{-2} \quad (2)$$

Specifically, in the case where the diameter Dp is decreased, a rate of increase in the thickness Lb, that is, (Lb+ΔLb)/Lb is determined so as to be equal to or larger than the negative second power of a rate of decrease in the diameter Dp, that is, (Dp−ΔDp)/Dp. With the reduction in the diameter Dp, the necessary rate of increase in the thickness Lb significantly increases. However, as described above, the processing of SGTs in the vertical direction can be performed more easily than the processing in the horizontal direction, which is limited by a processing technique such as a lithographic technique. Therefore, even such a significant increase does not cause a problem. The above determination can be applied to the thickness Lt of each of the upper impurity regions 49a, 49b, and 49c. Similarly, the determination can be applied to the upper and lower impurity regions of the SGTs formed in the Si pillars H1, H2, and H6.

As described above, the SRAM cell circuit shown in the circuit diagram of FIG. 1A, the schematic structural view of FIG. 1B, and the arrangement view of Si pillars of FIG. 1C is formed by the production method shown in FIGS. 2A to 2W.

According to the method for producing a semiconductor device according to the first embodiment, as shown in FIGS. 2A(a) to 2D(c), the $N^+$ regions 3a, 3b, 3c, 3d, 6a, 6b, 6c, and 6d that are to be formed into sources or drains of SGTs and that are shown in FIG. 1B are formed in a stacked manner between the i-layer substrate 13 and the i-layer 22 before the Si pillars H1 to H6 are formed. Therefore, it is not necessary that, for example, the regions that are to be formed into source or drain impurity layers of SGTs, the regions being shown in FIGS. 2J(a) to 2M(c), be formed by diffusing a donor or acceptor impurity after etching of the SiO$_2$ layer 35, the TiN layers 32a and 32b, and the gate SiO$_2$ layers 34a, 34b, and 34c.

The N$^+$ regions 25a, 25b, and 25c in lower portions of the Si pillars H1 to H6 shown in FIGS. 2E(a), 2E(b) and 2E(c) are formed in a uniform manner by using the N$^+$ region 15 having the same impurity concentration distribution at the same depth, the N$^+$ region 15 being formed by implanting arsenic ions as shown in FIGS. 2A(a), 2A(b) and 2A(c). Similarly, the upper N$^+$ regions 26a and 26c and the P$^+$ region 26b are respectively formed in a uniform manner by using the N$^+$ regions 21a and 21b and the P$^+$ region 19 that have the same impurity concentration distribution at the same depth, the N$^+$ regions 26a and 26c and the P$^+$ region 26b being formed by implanting arsenic ions and boron ions as shown in FIGS. 2B(a), 2B(b), 2B(c), 2C(a), 2C(b) and 2C(c). Consequently, the N$^+$ regions 25a, 25b, 25c, 26a, and 26c and the P$^+$ region 26b of the Si pillars H1 to H6 are easily formed inside pillar structures of the Si pillars H1 to H6 in the vertical direction with a high accuracy.

Second Embodiment

A method for producing a semiconductor device having SGTs according to a second embodiment will now be described with reference to FIGS. 3A(a) to 3D(c) and FIG. 4(a), 4(b) and 4(c). In FIGS. 2E(a), 2E(b), 2E(c) of the first embodiment, the Si pillars H1 to H6 are formed by etching the i-layer 22, the N$^+$ regions 21a and 21b, the P$^+$ region 19, the N$^+$ region 15, and the i-layer substrate 13 by, for example, a reactive ion etching (RIE) method using the SiO$_2$ layers 23a, 23b, and 23c as an etching mask. As a result of this step, surfaces of the N$^+$ regions 25a, 25b, 25c, 26a, and 26c, which contain a donor impurity in a large amount, and the P$^+$ region 26b, which contains an acceptor impurity in a large amount, are exposed from the side faces of the Si pillars H1 to H6. In the first embodiment, subsequently, as shown in FIGS. 2F(a), 2F(b) and 2F(c), when the SiO$_2$ layers 29a, 29b, and 29c are formed by a thermal oxidation method, the donor and acceptor impurities are release from the N$^+$ regions 25a, 25b, 25c, 26a, and 26c and the P$^+$ region 26b, the surfaces of which are exposed to the outside, to the outside and diffuse again into the i-regions 24a, 24b, 24c, 27a, 27b, and 27c that are formed into channels of SGTs. In this case, characteristics of the SGTs may become insufficient and characteristics of the SGTs may vary. According to a production method described in the present embodiment, these problems can be resolved.

As shown in FIGS. 3A(a), 3A(b) and 3A(c), a SiO$_2$ layer 14 is formed on an i-layer substrate 13 by, for example, a thermal oxidation method. A resist layer 60 is formed on the SiO$_2$ layer 14. Arsenic ions (As$^+$) are introduced from above the i-layer substrate 13 by ion implantation using the resist layer 60 as a mask. Thus, N$^+$ regions 61a, 61b, 61c, 61d, 61e, and 61f are formed in surface layer portions of the i-layer substrate 13.

Subsequently, as shown in FIGS. 3B(a), 3B(b) and 3B(c), the SiO$_2$ layer 14 is removed, and an i-layer 16 is formed on the N$^+$ regions 61a, 61b, 61c, 61d, 61 e, and 61f and the i-layer substrate 13 by, for example, a low-temperature epitaxial growth process. A SiO$_2$ layer 17 is then formed on the i-layer 16 by, for example, a CVD method. Subsequently, N$^+$ regions 63a, 63b, 63c, and 63d are formed in the i-layer 16 so as to be respectively overlapped with the N$^+$ regions 61a, 61c, 61d, and 61f in the vertical direction by arsenic-ion implantation using a resist layer 62 as a mask.

Subsequently, as shown in FIGS. 3C(a), 3C(b) and 3C(c), the resist layer 62 is removed and a new resist layer 64 is formed. Boron-ion implantation is performed using the resist layer 64 as a mask. Thus, P$^+$ regions 65a and 65b are formed in the i-layer 16 so as to be respectively overlapped with the N$^+$ regions 61b and 61e in the vertical direction.

Subsequently, as shown in FIGS. 3D(a), 3D(b) and 3D(c), Si pillars H1 to H6 are formed by the production method shown in FIGS. 2D(a), 2D(b), 2D(c), 2E(a), 2E(b) and 2E(c). In this step, the Si pillars H1 to H6 are formed such that side faces of the N$^+$ regions 61a, 61b, 61c, 61d, 61e, 61f, 63a, 63b, 63c, and 63d and the P$^+$ regions 65a and 65b are located inside the Si pillars H1 to H6. Subsequently, the production is performed by the method shown in FIGS. 2F(a) to 2W(c). The donor and acceptor impurities are thermally diffused by heat processing that is performed in the course of the production until the step shown in FIGS. 2W(a), 2W(b) and 2W(c) is performed. Consequently, the N$^+$ regions 61a, 61b, 61c, 61d, 61e, 61f, 63a, 63b, 63c, and 63d and the P$^+$ regions 65a and 65b are connected to the conductor layers 45a, 45b, 45c, and 45d (refer to FIGS. 2Q(a), 2Q(b) and 2Q(c)).

According to the production method of the present embodiment, in a step of oxidizing surfaces of the Si pillars H1 to H6 and the surface of the i-layer substrate 13a from the state shown in FIGS. 3D(a), 3D(b) and 3D(c), the N$^+$ regions 61a, 61b, 61c, 61d, 61e, 61f, 63a, 63b, 63c, and 63d and the P$^+$ regions 65a and 65b are not exposed from the side faces of the Si pillars H1 to H6. Accordingly, it is possible to prevent the phenomenon that the donor and acceptor impurities are released from the N$^+$ regions 61a, 61b, 61c, 61d, 61e, 61f, 63a, 63b, 63c, and 63d and the P$^+$ regions 65a and 65b to the outside, and diffused again to the i-regions 24a, 24b, 24c, 27a, 27b, and 27c that are formed into channels of SGTs. As a result, the problems such as a decrease in characteristics of the SGTs and the generation of variations in characteristics of the SGTs are resolved.

Figure 4A:
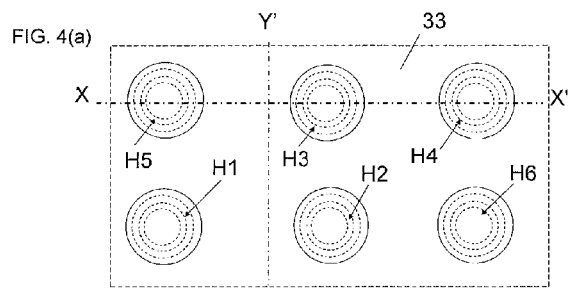
FIGS. 4(a), 4(b) and 4(c) are a plan view and cross-sectional structural views of the SRAM cell according to the second embodiment.
Figure 4B:
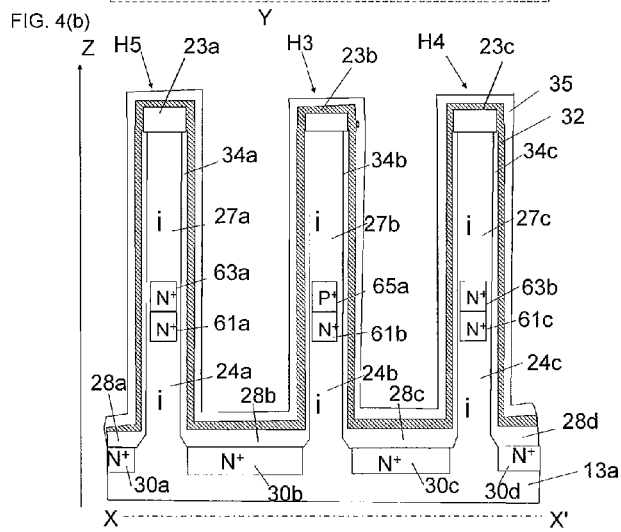
Figure 4C:
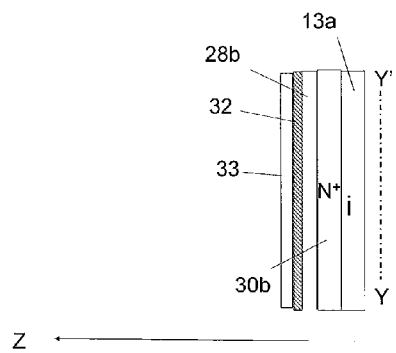

Furthermore, as shown in FIGS. 4(a), 4(b) and 4(c), the semiconductor device is formed so that the N$^+$ regions 61a, 61b, 61c, 61d, 61e, 61f, 63a, 63b, 63c, and 63d and the P$^+$ regions 65a and 65b are located inside the Si pillars H1 to H6 in steps before the structure shown in FIGS. 2H(a), 2H(b) and 2H(c) of the first embodiment is obtained, that is, after the gate SiO$_2$ layers 34a, 34b, and 34c, the TiN layer 32, and the SiO$_2$ layer 35 are formed on outer peripheral portions of the Si pillars H1 to H6. In this case, at least before the gate SiO$_2$ layers 34a, 34b, and 34c are formed, even though the surfaces of the Si pillars H1 to H6 are exposed, the N$^+$ regions 61a, 61b, 61c, 61d, 61e, 61f, 63a, 63b, 63c, and 63d and the P$^+$ regions 65a and 65b are not exposed from the side faces of the Si pillars H1 to H6. Thus, it is possible to prevent the donor and acceptor impurities from releasing to the outside.

Third Embodiment

A method for producing a semiconductor device according to a third embodiment will now be described with reference to FIGS. 5(a), 5(b) and 5(c).

As shown in FIGS. 5(a), 5(b) and 5(c), an N$^+$ region 67 is formed in a surface layer portion of an i-layer substrate 13 by arsenic-ion implantation. An i-layer 68 is formed on the N$^+$ region 67 by, for example, low-temperature Si epitaxial growth. A SiO$_2$ layer 69 is formed on the i-layer 68. Subsequently, N$^+$ regions 70a and 70c and a P$^+$ region 70b are formed in a surface layer portion of the i-layer 68 by ion implantation of arsenic and boron using the method shown in FIGS. 2B(a), 2B(b), 2B(c), 2C(a), 2C(b) and 2C(c). As a result, an i-layer 71 in which arsenic ions or boron ions are not implanted is formed in a lower portion of the i-layer 68. A difference from the cross-sectional structure in the first embodiment (refer to FIGS. 2C(a), 2C(b) and 2C(c)) is that, at the time when the resist layer 20 is removed, the i-layer 71 is present in FIGS. 5(a), 5(b) and 5(c) whereas a layer corresponding to the i-layer 71 is not present in FIGS. 2C(a), 2C(b) and 2C(c).

It is desired that each of the $N^+$ regions 15, 21a, and 21b and the $P^+$ region 19 shown in FIGS. 2C(a), 2C(b) and 2C(c) functions as a source or a drain of an SGT having a low resistance. For this purpose, ion implantation is performed such that the $N^+$ regions and the $P^+$ region respectively have high arsenic and boron atom concentrations close to the solid-solution limits to Si. In the subsequent heat processing, arsenic and boron are rapidly mixed in a high concentration state at the boundaries between the $P^+$ region 19 and the $N^+$ region 15, between the $P^+$ region 19 and the $N^+$ regions 21a which contacts the $N^+$ region 15, and between the $P^+$ region 19 and the $N^+$ regions 21b which contacts the $N^+$ region 15. In this case, crystal defects are easily generated at this boundary portion. When crystal defects are generated in this manner, the crystal defects extend to the i-layers 24a, 24b, 24c, 27a, 27b, and 27c that are formed into channels of SGTs, which may result in the degradation of characteristics of the SGTs. In contrast, according to the production method of the present embodiment, the i-layer 71 is present between the $N^+$ region 67 and the upper $N^+$ regions 70a and 70c and $P^+$ region 70b. Therefore, in heat processing thereafter, interdiffusion between arsenic and boron occurs in low concentrations at an initial stage, and thus the generation of crystal defects described above is suppressed.

Fourth Embodiment

A method for producing a semiconductor device having SGTs according to a fourth embodiment will now be described with reference to FIGS. 6A(a), 6A(b), 6A(c), 6B(a), 6B(b) and 6B(c).

As shown in FIGS. 6A(a), 6A(b) and 6A(c), an $N^+$ region 67a is formed in a region near a surface layer of an i-layer substrate 13 by arsenic-ion implantation, and an i-layer 71a is formed in a surface layer portion of the i-layer substrate 13. The i-layer 71a is formed by adjusting an accelerating voltage such that the arsenic impurity distribution in the depth direction of the i-layer substrate 13 by the arsenic-ion implantation is present in the $N^+$ region 67a. An i-layer 68a is formed on the i-layer 71a by, for example, low-temperature Si epitaxial growth. A $SiO_2$ layer 69a is formed on the i-layer 68a. Subsequently, $N^+$ regions 70a and 70c and a $P^+$ region 70b that are similar to those shown in FIGS. 2B(a), 2B(b), 2B(c), 2C(a), 2C(b) and 2C(c) are formed in the i-layer 68a by ion implantation of arsenic and boron.

The cross-sectional structure of the semiconductor device shown in FIGS. 6A(a), 6A(b) and 6A(c) is the same as that shown in FIGS. 5(a), 5(b) and 5(c). However, the i-layer 71 shown in FIGS. 5(a), 5(b) and 5(c) is formed directly on the $N^+$ region 67 by a low-temperature Si epitaxial growth process, and thus crystal defects are easily generated in the i-layer 71. In contrast, in the production method shown in FIGS. 6A(a), 6A(b) and 6a(c), the i-layer 68a is formed on the i-layer 71a, which does not contain an arsenic impurity in a high concentration, by a low-temperature Si epitaxial growth process. Therefore, the generation of crystal defects in the i-layer 68a is suppressed.

Alternatively, as shown in FIGS. 6B(a), 6B(b) and 6B(c), in an i-layer 68c formed on an i-layer 71a by a Si epitaxial growth process, $N^+$ regions 70a and 70c and a $P^+$ region 70b are formed in a lower portion of the i-layer 68c by ion implantation as in FIGS. 6A(a), 6A(b) and 6A(c) such that an i-layer 72 remains in a surface layer portion of the i-layer 68c. A $SiO_2$ layer 69a is removed, and an i-layer 22 is then formed by a low-temperature epitaxial process as shown in FIGS. 2D(a), 2D(b) and 2D(c). Since the i-layer 22 is formed on the i-layer 72, which does not contain a donor or acceptor impurity in a high concentration, by a low-temperature Si epitaxial process, the generation of crystal defects in the i-layer 22 is suppressed near the boundary with the i-layer 72.

Fifth Embodiment

A method for producing a semiconductor device having SGTs according to a fifth embodiment will now be described with reference to FIGS. 7A(a), 7A(b), 7A(c), 7B(a), 7B(b) and 7B(c).

As shown in FIGS. 7A(a), 7A(b) and 7A(c), an $N^+$ region 73 and an i-layer 13c are continuously formed on an i-layer substrate 13b by, for example, a low-temperature Si epitaxial process. Subsequently, an $N^+$ region 15 is formed in a surface layer of the i-layer 13c. Subsequently, as shown in FIGS. 2D(a), 2D(b) and 2D(c), $N^+$ regions 21a and 21b and a $P^+$ region 19 are formed on the $N^+$ region 15, and an i-layer 22 is formed thereon. Thereafter, steps the same as those shown in FIGS. 2E(a) to 2W(c) are performed without performing the step of forming the $N^+$ regions 30a, 30b, 30c, and 30d shown in FIGS. 2G(a), 2G(b) and 2G(c).

As a result, as shown in FIGS. 7B(a), 7B(b) and 7B(c), an $N^+$ region 73a is formed on the i-layer substrate 13b so as to extend over lower portions of Si pillars H1 to H6. In the production method shown in FIGS. 2G(a), 2G(b) and 2G(c), the $N^+$ regions 30a, 30b, 30c, and 30d are formed by implanting accelerated arsenic ions from above the i-layer substrate 13a. In this case, arsenic ions reflected from a surface of the i-layer substrate 13a may be implanted in the i-regions 24a, 24b, 24c, 27a, 27b, and 27c that are formed into channels of SGTs of the Si pillars H1 to H6. Consequently, characteristics of the SGTs formed in the Si pillars H1 to H6 are degraded. In contrast, since the $N^+$ region 73 is formed before the formation of the Si pillars H1 to H6 in the production method of the present embodiment, such a degradation of characteristics can be prevented.

Sixth Embodiment

A method for producing a semiconductor device having SGTs according to a sixth embodiment will now be described with reference to FIGS. 8A(a), 8A(b), 8A(c), 8B(a), 8B(b) and 8B(c).

In a method for producing a semiconductor device having SGTs in the related art in which a single SGT is formed in a single Si pillar, a plurality of Si pillars having the same height are formed on a substrate, and a donor or acceptor impurity layer serving as a source or a drain is formed at each of an upper position and a lower position of the respective Si pillars so as to sandwich a channel region. Therefore, in such a semiconductor device having SGTs in the related art in which a single SGT is formed in a single Si pillar, channel lengths of an N-channel SGT and a P-channel SGT that are formed on a substrate are equal to each other unless others steps are added. For this reason, the channel lengths of an N-channel SGT and a P-channel SGT cannot be changed in the circuit design. In contrast, in the present embodiment, since SGTs are formed at an upper position and a lower position of a single Si pillar, the channel lengths of the SGTs disposed at the upper position and the lower position of the single Si pillar can be easily changed on the basis of the design requirement.

As shown in FIGS. 8A(a), 8A(b) and 8A(c), N$^+$ regions 25a, 25b, and 25c disposed in central portions of Si pillars H1 to H6 are formed at the same time at the same height position, and an N$^+$ region 26a, a P$^+$ region 26b, and an N$^+$ region 26c that are respectively disposed on the N$^+$ regions 25a, 25b, and 25c are also formed at the same height position. The heights of the Si pillars H1 to H6 are each represented by L1. However, by appropriately setting lengths L2, L3, L4, and L5, the channel lengths of SGTs formed at an upper position and a lower position of the Si pillars H1 to H6 can be changed where L2 represents a length in the vertical direction from a surface of an i-layer substrate 13a to the boundary between the N$^+$ regions 25a, 25b, and 25c, and the N$^+$ regions 26a and 26c and the P$^+$ region 26b, L3 represents a length in the vertical direction of the N$^+$ regions 25a, 25b, and 25c, L4 represents a length in the vertical direction of the N$^+$ regions 26a and 26c and the P$^+$ region 26b, and L5 represents a length in the vertical direction of portions where the N$^+$ regions 49a and 49c and the P$^+$ region 49b that are to be formed in top portions of the Si pillars H1 to H6 shown in FIGS. 2U(a), 2U(b) and 2U(c) are to be formed.

As shown in FIGS. 8B(a), 8B(b) and 8B(c), channel lengths Ld and Lu can be controlled to predetermined lengths based on the design requirement by the production method described above where the channel length Ld is determined as a length in the vertical direction of i-regions 24a, 24b, and 24c that are located between an N$^+$ region 73a disposed in a lower portion of the Si pillars H1 to H6 and the N$^+$ regions 25a, 25b, and 25c, and the channel length Lu is determined as a length in the vertical direction of i-layers 27a, 27b, and 27c that are respectively located between the N$^+$ region 49a, the P$^+$ region 49b, and the N$^+$ region 49c disposed in upper portions of the Si pillars H1 to H6 and the N4 region 26a, the P$^+$ region 26b, and the N$^+$ region 26c. Unlike an existing planar MOS transistor, in the production method of the present embodiment, an increase in the circuit area due to an increase in a channel width is not generated, and a desired drive capacity of a CMOS transistor can be set on the basis of the design requirement by changing the channel lengths Ld and Lu of SGTs formed at an upper position and a lower position of the Si pillars H1 to H6.

Figure 15A:
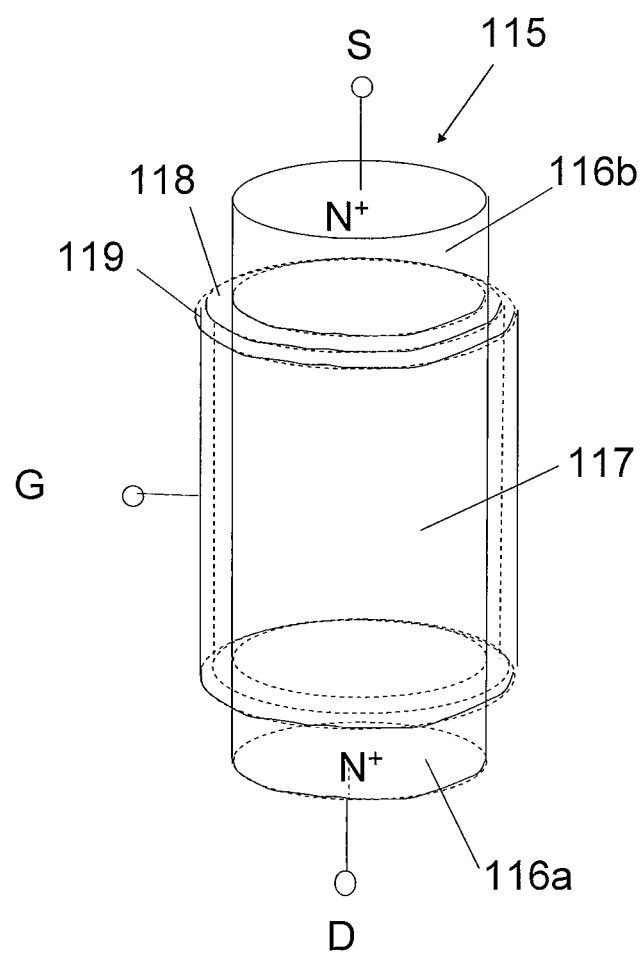
FIG. 15A is a schematic cross-sectional view showing an SGT in the related art.
Figure 15B:
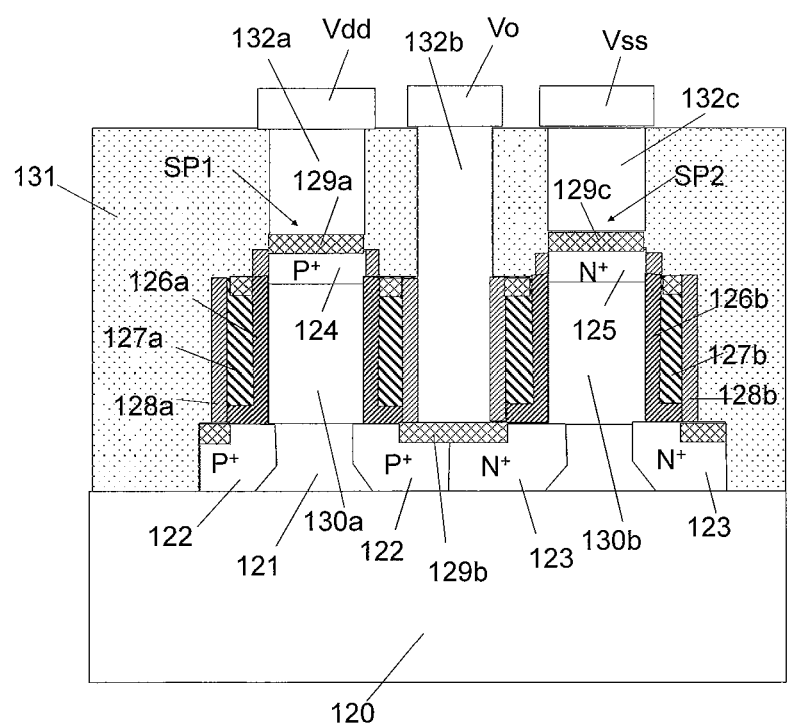
FIG. 15B is a cross-sectional structural view of a CMOS inverter circuit having SGTs in the related art.

In the production method in the related art shown in FIG. 15B, in which a single SGT is formed in a single Si pillar, since the channel lengths of all N-channel and P-channel SGTs become the same, the channel length of an N-channel SGT and the channel length of a P-channel SGT cannot be changed on the basis of the design requirement. In contrast, in the present embodiment, the channel length Ld and the channel length Lu can be easily set to predetermined lengths on the basis of the design requirement.

Seventh Embodiment

A method for producing a semiconductor device having SGTs according to a seventh embodiment will now be described with reference to FIGS. 9A to 9C(c).

Figure 9A:
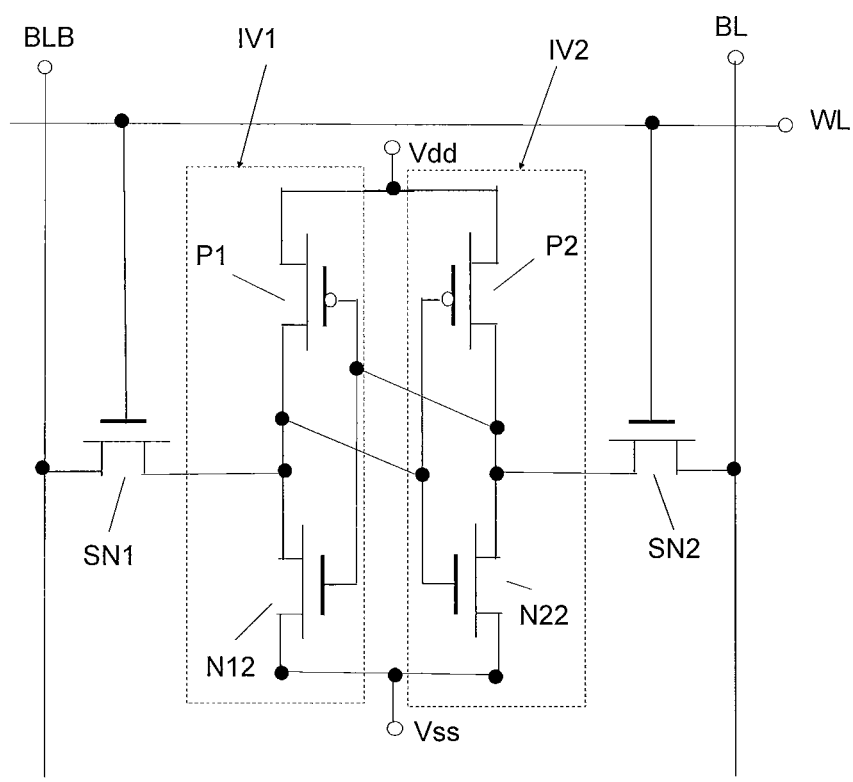
FIG. 9A is a diagram of an SRAM cell circuit according to a seventh embodiment of the present invention.

An SRAM cell circuit diagram shown in FIG. 9A shows an SRAM cell in which the driving N-channel SGTs_N11 and N21 are not present in the SRAM cell circuit diagram shown in FIG. 1A.

In the present embodiment, as shown in FIGS. 9B(a), 9B(b) and 9B(c), an N$^+$ region 75 is formed in an i-layer substrate 13a so as to be located in a bottom portion of a Si pillar H3, and an N$^+$ region is not formed in bottom portions of the Si pillars H5 and H4. Similarly, an N$^+$ region is formed in the i-layer substrate 13a so as to be located in a bottom portion of a Si pillar H2, and an N$^+$ region is not formed in bottom portions of the Si pillars H1 and H6. The TiN layer 32f, which is a gate conductor layer extending over a bottom portion of the Si pillars H3 and H4 in FIGS. 2W(a), 2W(b) and 2W(c), is separated to form an electrically floating TiN layer 32j in a lower portion of the Si pillar H4. Similarly, a separated TiN layer 32k is formed on the Si pillar H5. For the Si pillars H1, H2, and H6, the separation of the TiN layer is similarly performed. Consequently, a current does not flow in SGTs disposed in the lower portions of the Si pillars H5, H4, H1, and H6, and these SGTs are in an electrically floating state. Thus, the SRAM cell circuit shown in FIGS. 9B(a), 9B(b) and 9B(c) is realized.

Alternatively, as shown in FIGS. 9C(a), 9C(b) and 9C(c), i-layers 77a, 77b, and 77c are formed on a SiO$_2$ substrate 76 instead of the i-layer substrate 13a used in FIGS. 9B(a), 9B(b) and 9B(c). Si pillars H5, H3, and H4 are respectively formed on the i-layers 77a, 77b, and 77c. An N$^+$ region is not formed in bottom portions of the Si pillars H5 and H4. The TiN layer 32f, which is a gate conductor layer extending over a bottom portion of the Si pillars H3 and H4, is separated to form an electrically floating TiN layer 32j in a lower portion of the Si pillar H4. The Si pillars H1, H2, and H6 are formed as in the Si pillars H5, H3, and H4. This method can also realize the SRAM cell circuit shown in FIGS. 9B(a), 9B(b) and 9B(c).

Alternatively, in FIGS. 9B(a), 9B(b) and 9B(c), even in the case where an N$^+$ region is formed in bottom portions of the Si pillars H5, H4, H1, and H6, the SGTs may be formed as an enhancement-type SGTs, and the TiN layer 32k of the SGTs in the lower portions of the Si pillars H5 and H1 and the TiN layer 32j of the SGTs in the lower portions of the Si pillars H4 and H6 may be allowed to electrically float or the TiN layers 32k and 32j may be connected to a ground metal wiring. The Si pillars H1, H2, and H6 are formed as in the Si pillars H5, H3, and H4. With this structure, the same advantage as that in the structure described above can be obtained.

As shown in FIG. 9B(b), although an N$^+$ region is not formed in the lower portions of the Si pillars H5 and H4, the N$^+$ region 75 that is disposed in the bottom portion of the Si pillar H3 and is connected through the i-layer substrate 13a functions as an impurity region of a source or a drain. In this case, a current flowing to the i-regions 24a and 24c which are channels is suppressed by the i-layer substrate 13a having a high resistance. In the case where the SiO$_2$ substrate 76 is included as shown in FIG. 9C(b), such a current is not generated and thus it is possible to more efficiently realize a state in which the SGTs in lower portions of the Si pillars H5 and H4 are not present on the circuit. In FIGS. 9C(a), 9C(b) and 9C(c), even in the case where an N$^+$ region is formed in bottom portions of the Si pillars H5 and H4, the same advantage as that in the structure described above can be obtained by allowing the N$^+$ region to electrically float.

As described above, according to the present embodiment, a semiconductor device can be formed in accordance with the design requirement of the semiconductor device so that SGTs formed in Si pillars are not present on a circuit.

Eighth Embodiment

A method for producing a semiconductor device having SGTs according to an eighth embodiment will now be described with reference to FIGS. 10A and 10B.

Figure 10A:
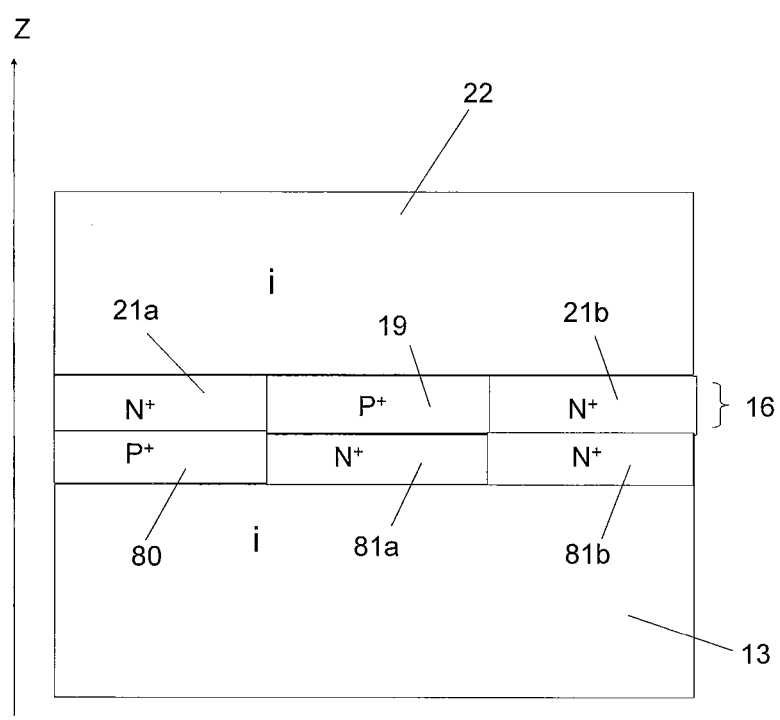
FIG. 10A is a cross-sectional structural view illustrating a method for producing a semiconductor device having SGTs according to an eighth embodiment of the present invention.

FIG. 10A is a cross-sectional structural view of a semiconductor device after a step corresponding to the step shown in FIGS. 2D(a), 2D(b) and 2D(c) of the first embodiment is performed in the present embodiment. In FIGS. 2D(a), 2D(b) and 2D(c), the single N$^+$ region 15 is formed in a surface layer portion of the i-layer substrate 13. In contrast, in the present embodiment, a P⁺ region 80 and N⁺ regions 81a and 81b are formed as a layer the same as the N⁺ region 15. The P⁺ region 80 and the N⁺ regions 81a and 81b are formed by ion implantation of boron (B) and arsenic (As) as in the steps shown in FIGS. 2B(a), 2B(b), 2B(c), 2C(a), 2C(b) and 2C(c). Subsequently, as in the step shown in FIGS. 2D(a), 2D(b) and 2D(c), an N⁺ region 21a is formed on the P⁺ region 80, a P⁺ region 19 is formed on the N⁺ region 81a, and an N⁺ region 21b is formed on the N⁺ region 81b, the N⁺ region 21a, the P⁺ region 19, and the N⁺ region 21b being disposed in an i-layer 16. An i-layer 22 is then formed on the N⁺ region 21a, the P⁺ region 19, and the N⁺ region 21b by, for example, a low-temperature epitaxial growth process.

Figure 10B:
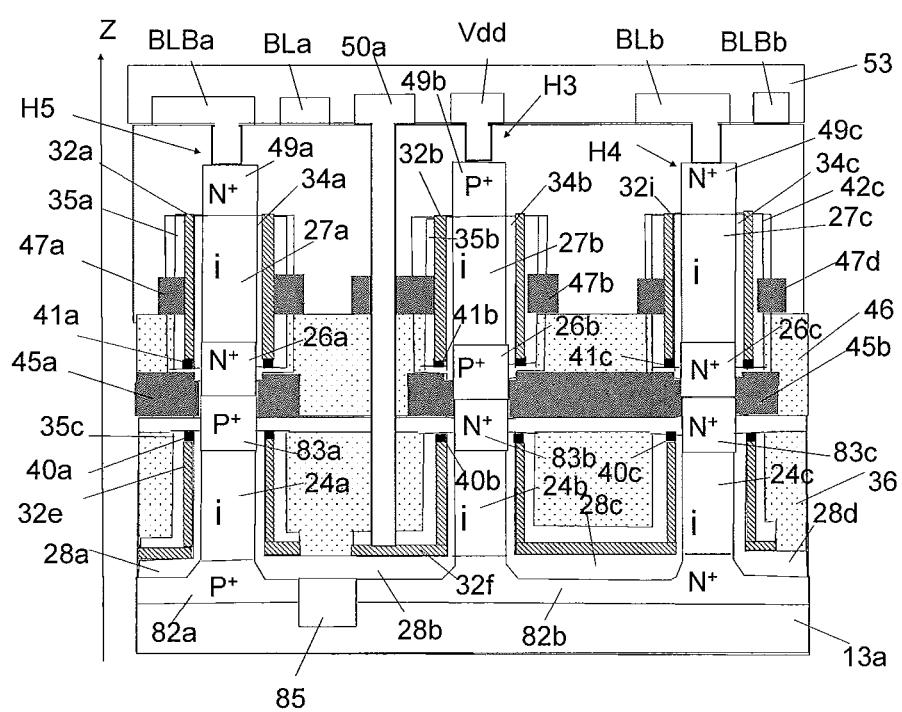
FIG. 10B is a cross-sectional structural view illustrating the method for producing a semiconductor device having SGTs according to the eighth embodiment.

FIG. 10B is a cross-sectional view after the steps corresponding to the steps shown in FIGS. 2E(a) to 2W(c) of the first embodiment are performed in the present embodiment. In FIGS. 2G(a), 2G(b) and 2G(c), the N⁺ regions 30a, 30b, 30c, and 30d are formed in an upper surface of the i-layer substrate 13a by implanting arsenic (As) ions. In contrast, in the present embodiment, a P⁺ region 82a is formed in an upper surface of an i-layer substrate 13a so as to be located in a lower portion of the Si pillar H5, and an N⁺ region 82b is formed in an upper portion of the i-layer substrate 13a so as to be located in lower portions of the Si pillars H3 and H4. Furthermore, an insulating layer 85 for isolation is formed in an upper portion of the i-layer substrate 13a, the upper portion being disposed between the P⁺ region 82a and the N⁺ region 82b. Consequently, a P-channel SGT that includes the P⁺ region 82a and a P⁺ region 83a serving as a source and a drain is formed in a lower portion of the Si pillar H5. An N-channel SGT that includes the N⁺ region 82b and an N⁺ region 83b serving as a source and a drain is formed in a lower portion of the Si pillar H3. An N-channel SGT that includes the N⁺ region 82b and an N⁺ region 83c serving as a source and a drain is formed in a lower portion of the Si pillar H4.

As described above, according to the method for producing a semiconductor device according to the present embodiment, an upper SGT and a lower SGT of a single Si pillar can be formed as any of an N-channel SGT and a P-channel SGT in accordance with the design requirement regardless of the presence or absence of an SRAM cell circuit.

Ninth Embodiment

A method for producing a semiconductor device having SGTs according to a ninth embodiment will now be described with reference to the drawings.

Figure 11:
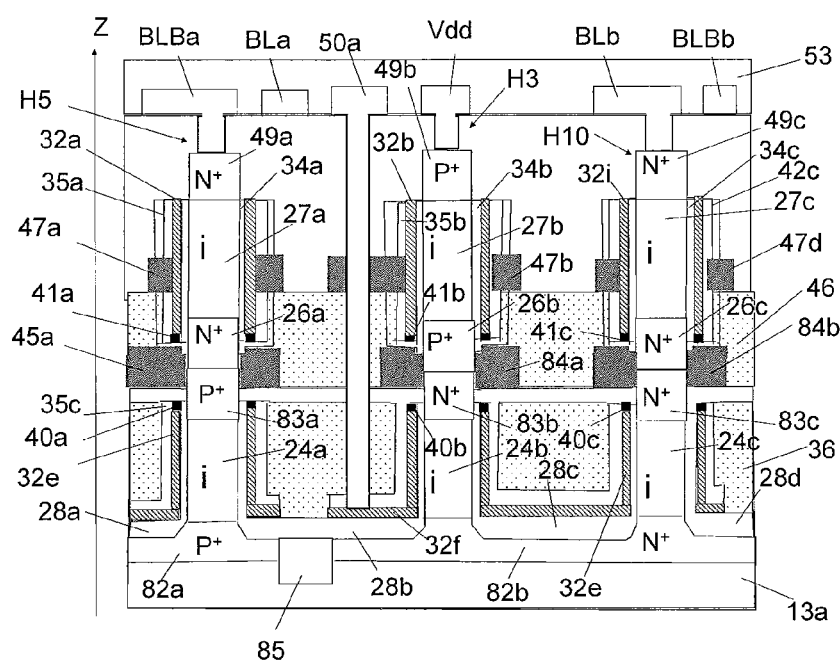
FIG. 11 is a cross-sectional structural view illustrating a method for producing a semiconductor device having SGTs according to a ninth embodiment of the present invention.

In FIG. 10B of the eighth embodiment, the conductor layer 45b is formed so as to extend over the Si pillar H3 and the Si pillar H4. In contrast, in the present embodiment, as shown in FIG. 11, a conductor layer 84a connected to an N⁺ region 83b and a P⁺ region 26b of a Si pillar H3 and a conductor layer 84b connected to N⁺ regions 83c and 26c of a Si pillar H10 (corresponding to the Si pillar H4 in FIG. 10B) are separately formed. The conductor layer 84b connects a TiN layer 32e and a TiN layer 32i, which are gate conductor layers of SGTs respectively formed in a lower position and an upper position of the Si pillar H10, and is connected to the N⁺ regions 83c and 26c that are located in the middle of the Si pillar H10. By allowing the conductor layer 84b to electrically float, two SGTs disposed at an upper position and a lower position of a Si pillar can be treated as a sing1e SGT.

Tenth Embodiment

A method for producing a semiconductor device having SGTs according to a tenth embodiment will now be described with reference to FIG. 12.

In the first embodiment, regarding impurity regions included in the SGTs, the thickness of an impurity region formed under a certain channel layer is equal to the thickness of an impurity region formed on the channel layer, and the diameters of these impurity regions are also the same. However, when the sizes of the SGTs are reduced while maintaining this structure, a sufficient PN-junction potential difference may not be obtained. As shown in FIG. 2W(b), the thickness of each of the N⁺ region 26a, the P⁺ region 26b, and the N⁺ region 26c that are respectively formed under the i-regions 27a, 27b, and 27c serving as channel layers is represented by Lb, the thickness of each of the N⁺ region 49a, the P⁺ region 49b, and the N⁺ region 49c that are respectively formed on the i-regions 27a, 27b, and 27c is represented by Lt, and the diameter of a horizontal cross section of each of the Si pillars H5, H3, and H4 is represented by Dp. In this case, for example, when the diameter Dp is reduced to 10 nm or less, even in the case where the thicknesses Lb and Lt are each 20 nm and a donor or acceptor impurity volume density is $1 \times 10^{20}/cm^3$, which is close to the solid-solution limit to Si, the number of donor or acceptor impurity atoms contained in each of the impurity regions is 10 or less. Accordingly, in this case, it is difficult to obtain a PN-junction potential difference obtained on the basis of the known band theory with respect to the i-regions which are channel layers of corresponding SGTs. Therefore, in the first embodiment, in the case where the diameter of a Si pillar is reduced in order to reduce the size of an SGT, it is necessary to increase the thickness of the upper and lower impurity regions, and furthermore, the height of the Si pillar.

Figure 12:
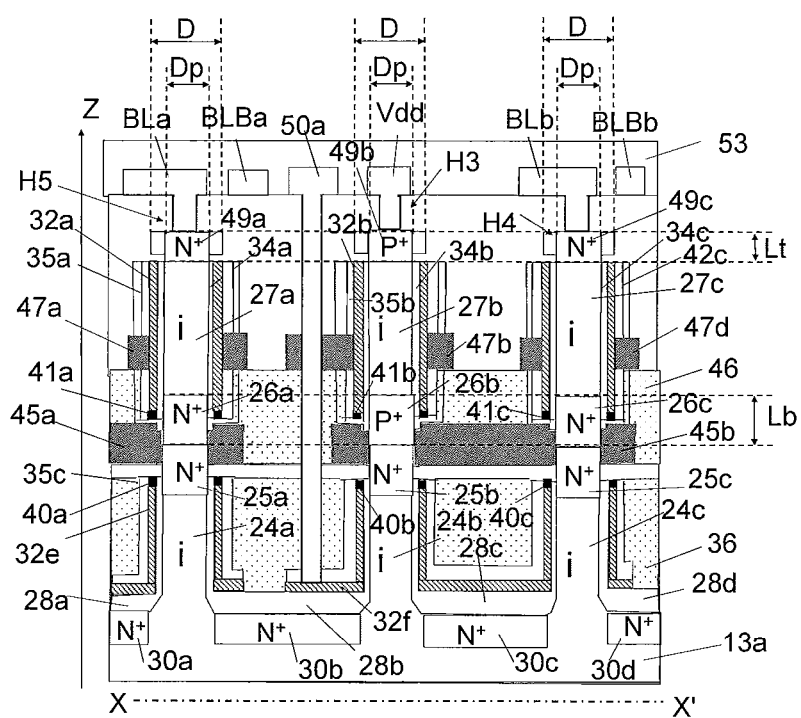
FIG. 12 is a cross-sectional structural view illustrating a method for producing a semiconductor device having SGTs according to a tenth embodiment of the present invention.
Figure 13:
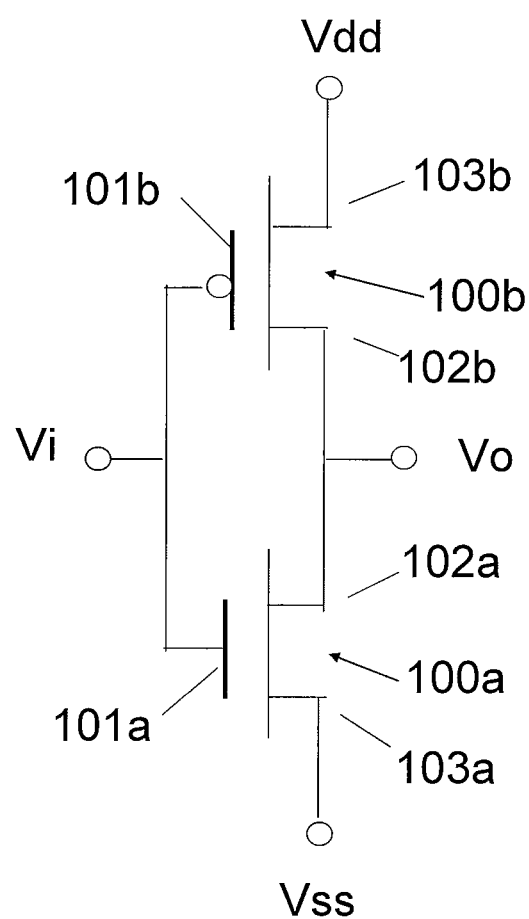
FIG. 13 is a CMOS inverter circuit diagram in the related art.
Figure 14:
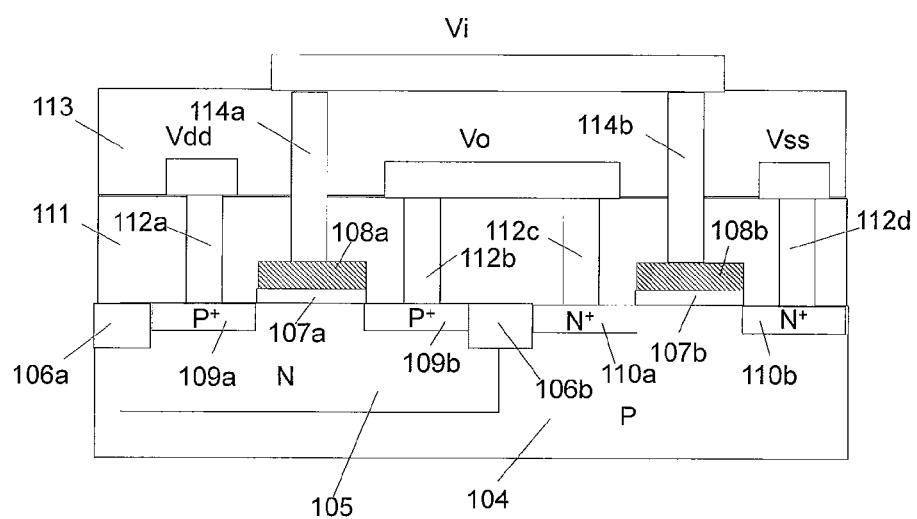
FIG. 14 is a cross-sectional view of a planar CMOS inverter circuit in the related art.

In contrast, in the tenth embodiment, as shown in FIG. 12, a thickness Lt of each of an N⁺ region 49a, a P⁺ region 49b, and an N⁺ region 49c that are respectively formed on i-regions 27a, 27b, and 27c serving as channel layers is smaller than a thickness Lb of each of an N⁺ region 26a, a P⁺ region 26b, and an N⁺ region 26c that are respectively formed under the i-regions 27a, 27b, and 27c. In addition, a diameter D of each of the N⁺ region 49a, the P⁺ region 49b, and the N⁺ region 49c is larger than a diameter Dp of each of silicon pillars H5, H3, and H4. The diameter D can be increased by, for example, after the etching step shown in FIGS. 2U(a), 2U(b), and 2U(c), forming an epitaxial Si film containing a donor or acceptor impurity on outer peripheral portions of the N⁺ region 49a, the P⁺ region 49b, and the N⁺ region 49c. With this structure, the concentrations of a donor impurity and an acceptor impurity in the impurity regions provided on and under a channel layer can be balanced. Thus, even in the case where, for the purpose of reducing the size of SGTs, the diameter of each of the Si pillars is reduced and the thickness of the lower impurity region is increased accordingly, the thickness of the upper impurity region can be suppressed and thus the height of the Si pillar need not be increased. The structures of SGTs formed in upper portions of the Si pillars H5, H3, and H4 have been described above. However, the structures of the impurity regions can be applied to SGTs formed in the Si pillars H1, H2, and H6.

As described above, according to this embodiment, even when the size of each of the SGTs is reduced, the height of each of the Si pillars can be maintained.

The technical idea according to the first to tenth embodiments of the present invention can be applied to a method for producing another circuit in which an impurity region is formed in the middle of a Si pillar regardless of the presence or absence of an SRAM cell circuit.

In FIGS. 2C(a), 2C(b) and 2C(c), the N⁺ regions 21a and 21b and the P⁺ region 19 are formed over the entirety of the i-layer 16. However, the formation areas of the N⁺ regions 21a and 21b and the P⁺ region 19 are not particularly limited, regardless of whether or not arsenic or boron ions introduced by ion implantation reach the N⁺ region 15 formed in a surface layer portion of the i-layer substrate 13, as long as the function of a source or a drain of SGTs formed at intermediate positions of the Si pillars H1 to H6 is not impaired at the final stage of the production of the SGT circuit shown in FIGS. 2W(a), 2W(b) and 2W(c). This also applies to other embodiments according to the present invention.

In FIGS. 2C(a), 2C(b) and 2C(c), the N⁺ regions 21a and 21b and the P⁺ region 19 are formed by ion implantation. Alternatively, for example, the N⁺ regions 21a and 21b and the P⁺ region 19 may be formed by forming a hole at a particular position of the SiO₂ layer 17, adsorbing boron or arsenic atoms onto the i-layer 16, and then performing heat treatment. In this method, the N⁺ regions 21a and 21b and the P⁺ region 19 that contain boron or arsenic impurity atoms in high concentrations can be stably formed. Alternatively, the N⁺ regions 21a and 21b and the P⁺ region 19 may be formed by using a multilayer laminated film obtained by using this adsorption of boron or arsenic atoms and the formation of a Si layer by, for example, an ALD method. In this method, the N⁺ regions 21a and 21b and the P⁺ region 19 that contain impurity atoms in high concentrations can be more stably formed. This method also applies to the case where the N⁺ region 15 is formed and other embodiments according to the present invention.

In the above embodiments, the number of donor or acceptor impurity atoms contained in impurity regions included in SGTs can be determined by design values of a source resistance, a drain resistance, a leak current, and the like.

In the first embodiment, a description has been made of a case where, as shown in FIG. 2W(b), in the SGTs formed in upper portions of the Si pillars H5, H3, and H4, the thicknesses of the N⁺ region 49a, the P⁺ region 49b, and the N⁺ region 49c that are respectively formed on the i-regions 27a, 27b, and 27c serving as channel layers are the same value of Lt, and the thicknesses of the N⁺ region 26a, the P⁺ region 26b, and the N⁺ region 26c that are respectively formed under the i-regions 27a, 27b, and 27c are the same value of Lb. Alternatively, these thicknesses may be varied on the basis of the difference in a thermal diffusion coefficient of the donor or acceptor impurity used in the impurity regions. This structure can be applied to the SGTs formed in lower portions of the Si pillars H5, H3, and H4 and SGTs formed in the Si pillars H1, H2, and H6. This structure can also be applied to other embodiments according to the present invention.

The i-layer 71 in FIGS. 5(a), 5(b) and 5(c), the i-layer 71a in FIGS. 6A(a), 6A(b) and 6A(c), and the i-layer 72 in FIGS. 6B(a), 6B(b) and 6B(c) are intrinsic semiconductor layers that do not contain a donor or acceptor impurity. However, the i-layers 71, 71a, and 72 may be layers that contain a donor or acceptor impurity as long as advantages provided by the present invention are obtained. This also applies to other embodiments according to the present invention The N⁺ region 15 in FIGS. 2A(a), 2A(b) and 2A(c) may be formed on the i-layer substrate 13 by epitaxial growth of Si containing a donor impurity.

In FIGS. 2C(a), 2C(b), 2C(c), 2D(a), 2D(b) and 2D(c), the i-layers 16 and 22 are formed by, for example, a low-temperature epitaxial growth process. Alternatively, the i-layers 16 and 22 may be formed by another method such as an atomic layer deposition (ALD) method. This also applies to other embodiments according to the present invention.

In FIGS. 2A(a), 2A(b) and 2A(c), the N⁺ region 15 is formed by ion implantation. In the case where a single N⁺ region 15 is formed over an entire surface, the N⁺ region 15 may be formed by depositing a Si layer of the same conductivity type using epitaxial growth, ALD, or the like. Similarly, in the step shown in FIGS. 2C(a), 2C(b) and 2C(c), in the case where the N⁺ regions 21a and 21b, and the P⁺ region 19 have the same conductivity type, these regions may each be formed by depositing a Si layer of the same conductivity type using epitaxial growth, an ALD method, or the like.

In FIGS. 2G(a), 2G(b) and 2G(c), the N⁺ regions 30a, 30b, 30c, and 30d are formed in a surface layer portion of the i-layer substrate 13a between the Si pillars H1 to H6 by implanting arsenic ions from an upper surface of the i-layer substrate 13a. Alternatively, for example, after the step shown in FIGS. 2K(a), 2K(b) and 2K(c) is finished, the N⁺ regions 30a, 30b, 30c, and 30d may be formed in a surface layer portion of the i-layer substrate 13a. In this case, the N⁺ regions 30a, 30b, 30c, and 30d, each of which is formed into a source or a drain of an SGT, can be formed at bottom portions of the Si pillars.

An impurity atom such as Ge may be incorporated in the N⁺ regions 15, 21a and 21b, and the P⁺ region 19 to control internal stress of the N⁺ regions 15, 21a and 21b, and the P⁺ region 19. As a result, the mobility of SGTs that are formed in the Si pillars H1 to H6 is improved.

In FIGS. 2H(a), 2H(b), and 2H(c), a description has been made of a case where TiN is used as an example of the gate conductor layer. Alternatively, the gate conductor layer may be another metal layer. Alternatively, the gate conductor layer may be constituted by a multilayer structure including the metal layer and a poly-Si layer, for example. This also applies to other embodiments according to the present invention.

In the above embodiments, a silicon-on-insulator (SOI) substrate may be used instead of each of the i-layer substrates 13, 13a, and 13b.

In FIGS. 9B(a), 9B(b), 9B(c), 9C(a), 9C(b) and 9C(c), a description has been made of a case where SGTs that are not present on a circuit are provided in lower portions of the Si pillars H5, H4, H1, and H6. Alternatively, in another circuit, gate conductor layers of upper SGTs may be allowed to electrically float and source or drain impurity regions in top portions of Si pillars may be allowed to electrically float. Also in such a case, a semiconductor device can be produced in accordance with the design requirement so that the SGTs are not present on a circuit.

In the case where the thickness of each of the N⁺ region 26a, the P⁺ region 26b, and the N⁺ region 26c is represented by Lb, the thickness of each of the N⁺ region 49a, the P⁺ region 49b, and the N⁺ region 49c is represented by Lt, and the diameter of a horizontal cross section of each of the Si pillars H5, H3, and H4 is represented by Dp, the semiconductor device may be formed so that, among four relationships described below, two, three, or four relationships are satisfied at the same time. Specifically, the first relationship is the relationship in which each of the thicknesses of Lb and Lt is made larger than the diameter Dp, which has been described in the first embodiment with reference to FIG. 2W(b). The second relationship is the relationship in which the thickness Lb is made larger than the thickness Lt. The third relationship is the relationship in which, when the diameter Dp is decreased, the rate of increase in the thickness Lb is determined so as to be equal to or larger than the negative second power of the rate of decrease in the diameter Dp. The fourth relationship is the relationship in which the diameter D of a horizontal cross section of each of the N⁺ region 49a, the P⁺ region 49b, and the N⁺ region 49c is made larger than the diameter Dp, which has been described in the tenth embodiment with reference to FIG. 12. This can also apply to other embodiments according to the present invention.

The second embodiment that has been described with reference to FIGS. 3A to 3D and FIG. 4 can be similarly applied to other embodiments according to the present invention.

In the above embodiments, two SGTs are formed in a single Si pillar. In the case where more than two SGTs are formed in a single Si pillar, it is sufficient that a similar production method is added. Thus, the technical idea of the present invention can be applied. In such a case, SGTs are further formed in the top portions of the Si pillars H1 to H6.

The technical idea of the present invention is also applicable to a case where an impurity region of a lower layer and an impurity region of an upper layer in a Si pillar are impurity regions having the same conductivity.

In FIGS. 2A(a) to 2W(c), the i-layer substrate 13 and other layers are formed of Si layers. Also in the case where layers composed of other semiconductor materials are included, the present invention can be applied. This also applies to other embodiments of the present invention.

It is to be understood that various embodiments and modifications of the present invention can be made without departing from the broad spirit and the scope of the present invention. The embodiments described above are illustrative Examples of the present invention and do not limit the scope of the present invention. Any combination of the Examples and modifications can be made. Furthermore, even when part of the configuration of the above embodiments is removed as required, the embodiments are within the technical idea of the present invention.

According to the method for producing a semiconductor device according to the present invention, a semiconductor device having SGTs and having a high degree of integration can be realized.

What is claimed is:

1. A method for producing a semiconductor device having surrounding gate MOS transistors (SGTs), the method comprising:
    a first impurity-region-forming step of forming one or both of a first impurity region containing a donor impurity and a second impurity region containing an acceptor impurity in a single layer in a surface layer portion of a semiconductor substrate;
    a first semiconductor-layer-forming step of forming a first semiconductor layer above the semiconductor substrate;
    a second impurity-region-forming step of forming one or both of a third impurity region containing a donor impurity and a fourth impurity region containing an acceptor impurity in a single layer in a surface layer portion of the first semiconductor layer;
    a second semiconductor-layer-forming step of forming a second semiconductor layer above the first semiconductor layer;
    an island-shaped semiconductor-forming step of etching the second semiconductor layer, the first semiconductor layer, and the semiconductor substrate from an upper surface of the second semiconductor layer to form a plurality of first island-shaped semiconductors each of which includes the semiconductor substrate, the first semiconductor layer, and the second semiconductor layer and in which the first impurity region and the second impurity region are overlapped with one or other of the third impurity region and the fourth impurity region in a perpendicular direction with respect to a surface of the semiconductor substrate;
    a third impurity-region-forming step of forming a fifth impurity region containing a donor impurity in a bottom portion of a first island-shaped semiconductor having the first impurity region and forming a sixth impurity region containing an acceptor impurity in a bottom portion of a first island-shaped semiconductor having the second impurity region;
    a gate insulating layer-forming step of forming a gate insulating layer so as to surround the first island-shaped semiconductors;
    a gate conductor layer-forming step of forming a gate conductor layer so as to surround the gate insulating layer; and
    a fourth impurity-region-forming step of forming a seventh impurity region containing a donor impurity in a top portion of the first island-shaped semiconductor having the third impurity region and forming an eighth impurity region containing an acceptor impurity in a top portion of the first island-shaped semiconductor having the fourth impurity region, the top portions being located above the gate insulating layer and the gate conductor layer,
    wherein one or both of a first SGT and a second SGT are formed on the lower portion side of the first island-shaped semiconductors, the first SGT including the first impurity region and the fifth impurity region, one of which functions as a source and the other of which functions as a drain, the semiconductor substrate of the first island-shaped semiconductor which functions as a channel, and the gate conductor layer which functions as a gate, the second SGT including the second impurity region and the sixth impurity region, one of which functions as a source and the other of which functions as a drain, the semiconductor substrate of the first island-shaped semiconductor which functions as a channel, and the gate conductor layer which functions as a gate, and
    one or both of a third SGT and a fourth SGT are formed on the upper portion side of the first island-shaped semiconductors, the third SGT including the third impurity region and the seventh impurity region, one of which functions as a source and the other of which functions as a drain, the second semiconductor layer of the first island-shaped semiconductor which functions as a channel, and the gate conductor layer which functions as a gate, the fourth SGT including the fourth impurity region and the eighth impurity region, one of which functions as a source and the other of which functions as a drain, the second semiconductor layer of the first island-shaped semiconductor which functions as a channel, and the gate conductor layer which functions as a gate.

2. The method for producing a semiconductor device according to claim 1, wherein the semiconductor device is formed so that a length of each of the third impurity region, the fourth impurity region, the seventh impurity region, and the eighth impurity region in the vertical direction is larger than a diameter of a horizontal cross section of each of the first island-shaped semiconductors.

3. The method for producing a semiconductor device according to claim 1, wherein the semiconductor device is formed so that a length of the third impurity region in the vertical direction is larger than a length of the seventh impurity region in the vertical direction, and a length of the fourth impurity region in the vertical direction is larger than a length of the eighth impurity region in the vertical direction.

4. The method for producing a semiconductor device according to claim 1, wherein:
    in a step of forming the third SGT and the fourth SGT where a diameter of a horizontal cross section of each of the first island-shaped semiconductors, the diameter being determined from a circuit design value, is decreased, the semiconductor device is formed so that a rate of increase in a length of each of the third impurity region and the fourth impurity region in the vertical direction is equal to or larger than a value of the negative second power of a rate of decrease in the diameter of the horizontal cross section of each of the first island-shaped semiconductors.

5. The method for producing a semiconductor device according to claim 1, wherein the semiconductor device is formed so that at least one of a diameter of a horizontal cross section of the seventh impurity region and a diameter of a horizontal cross section of the eighth impurity region is larger than a diameter of the horizontal cross section of each of the first island-shaped semiconductors.

6. The method for producing a semiconductor device according to claim 1, wherein, immediately after the island-shaped semiconductor-forming step, the first impurity region, the second impurity region, the third impurity region, the fourth impurity region, the fifth impurity region, the sixth impurity region, the seventh impurity region, and the eighth impurity region are not exposed from side faces of the first island-shaped semiconductors.

7. The method for producing a semiconductor device according to claim 1, wherein, immediately before the gate insulating layer-forming step, the first impurity region, the second impurity region, the third impurity region, the fourth impurity region, the fifth impurity region, the sixth impurity region, the seventh impurity region, and the eighth impurity region are not exposed from side faces of the first island-shaped semiconductors.

8. The method for producing a semiconductor device according to claim 1, wherein, in the second impurity-region-forming step, the third impurity region and the fourth impurity region are not in contact with the first impurity region and the second impurity region.

9. The method for producing a semiconductor device according to claim 1, wherein the first impurity region and the second impurity region are formed in the semiconductor substrate so as to be located more inside than a surface of the semiconductor substrate, and the first semiconductor layer is subsequently formed.

10. The method for producing a semiconductor device according to claim 1, wherein the third impurity region and the fourth impurity region are formed in the first semiconductor layer so as to be located more inside than a surface of the first semiconductor layer, and the second semiconductor layer is subsequently formed.

11. The method for producing a semiconductor device according to claim 1, comprising the steps of:

forming a ninth impurity region containing a donor or acceptor impurity inside the semiconductor substrate with respect to a depth direction of the semiconductor substrate;

forming a tenth impurity region of the same conductivity type as the ninth impurity region in a surface layer portion of the semiconductor substrate;

subsequently forming the first semiconductor layer; and allowing the ninth impurity region to be located in a bottom portion of the first island-shaped semiconductors.

12. The method for producing a semiconductor device according to claim 1, wherein the semiconductor device is formed so that a first channel length of the first SGT and the second SGT and a second channel length of the third SGT and the fourth SGT are different from each other, the first SGT including, as the channel, the semiconductor substrate between the source and the drain constituted by the first impurity region and the fifth impurity region, the second SGT including, as the channel, the semiconductor substrate between the source and the drain constituted by the second impurity region and the sixth impurity region, the third SGT including, as the channel, the second semiconductor layer between the source and the drain constituted by the third impurity region and the seventh impurity region, the fourth SGT including, as the channel, the second semiconductor layer between the source and the drain constituted by the fourth impurity region and the eighth impurity region.

13. The method for producing a semiconductor device according to claim 1, wherein the first SGT or the second SGT is formed in the first island-shaped semiconductor or a second island-shaped semiconductor that is formed separately from the first island-shaped semiconductor, and the gate conductor layer of any of the first SGT and the second SGT is allowed to electrically float or formed so as to have a ground potential so that any of the first SGT and the second SGT is formed so as not to be present on a circuit.

14. The method for producing a semiconductor device according to claim 13, wherein the second island-shaped semiconductor includes the first SGT or the second SGT including the electrically floating gate conductor layer, and an impurity region functioning as a source or a drain is not formed in a bottom portion or a top portion of the second island-shaped semiconductor.

15. The method for producing a semiconductor device according to claim 1, wherein:

one or both of the first island-shaped semiconductor including the first SGT and the third SGT that include the first impurity region, the third impurity region, the fifth impurity region, and the seventh impurity region, and the first island-shaped semiconductor including the second SGT and the fourth SGT that include the second impurity region, the fourth impurity region, the sixth impurity region, and the eighth impurity region are formed, and the gate conductor layer of the first SGT and the gate conductor layer of the third SGT are formed so as to be connected to each other.

* * * * *